United States Patent [19]

Scepanovic et al.

[11] Patent Number: 6,067,409
[45] Date of Patent: May 23, 2000

[54] ADVANCED MODULAR CELL PLACEMENT SYSTEM

[75] Inventors: Ranko Scepanovic, San Jose; Ivan Pavisic, Cupertino; James S. Koford, San Jose, all of Calif.; Alexander E. Andreev, Moskovskaga Oblast, Russian Federation; Edwin Jones, Los Altos Hills, Calif.

[73] Assignee: LSI Logic Corporation

[21] Appl. No.: 08/798,598

[22] Filed: Feb. 11, 1997

Related U.S. Application Data

[63] Continuation-in-part of application No. 08/672,535, Jun. 28, 1996.
[51] Int. Cl.$^7$ .................................................... G06F 17/50
[52] U.S. Cl. ........................................................ 395/500.09
[58] Field of Search ..................................... 364/490, 491

[56] References Cited

U.S. PATENT DOCUMENTS

| | | | |
|---|---|---|---|
| 3,603,771 | 9/1971 | Isett | 235/151 |
| 3,617,714 | 11/1971 | Kernighan | 364/488 |
| 4,306,286 | 12/1981 | Cocke et al. | 364/200 |
| 4,342,090 | 7/1982 | Caccoma et al. | 364/491 |
| 4,484,292 | 11/1984 | Hong et al. | 364/491 |
| 4,495,559 | 1/1985 | Gelatt, Jr. et al. | 364/148 |
| 4,554,625 | 11/1985 | Otten | 364/148 |
| 4,577,276 | 3/1986 | Dunlop et al. | 395/500.11 |
| 4,593,363 | 6/1986 | Burnstein et al. | 364/491 |
| 4,612,618 | 9/1986 | Pryor et al. | 364/490 |
| 4,615,011 | 9/1986 | Linsker | 364/491 |
| 4,624,339 | 11/1986 | Wagner et al. | 364/900 |
| 4,630,219 | 12/1986 | Digiacomo et al. | 364/488 |
| 4,656,580 | 4/1987 | Hitchcock, Sr. et al. | 364/200 |
| 4,675,829 | 6/1987 | Clemenson | 364/513 |
| 4,686,629 | 8/1987 | Noto et al. | 364/491 |
| 4,688,072 | 8/1987 | Heath et al. | 357/45 |
| 4,697,242 | 9/1987 | Holland et al. | 364/513 |
| 4,754,408 | 6/1988 | Carpenter et al. | 364/491 |
| 4,763,288 | 8/1988 | Deering et al. | 364/578 |
| 4,815,003 | 3/1989 | Putatunda et al. | 364/491 |
| 4,829,446 | 5/1989 | Draney | 364/488 |

(List continued on next page.)

OTHER PUBLICATIONS

Rose, et al., "Parallel Standard Cell Placement Algorithms with Quality Equivalent to Simulated Annealing," 1988 IEEE, IEEE Transactions on Computer Aided Design, vol. 7, No. 3, Mar. 1988, pp. 387–396.

Sanchis, Laura, "Multiple–Way Network Partitioning," 1989 IEEE, IEEE Transactions on Computers, vol. 38, No. 1, Jan. 1989, pp. 62–81.

King, et al., "ESP: Placement by Simulated Evolution," 1989 IEEE, IEEE Transactions on Computer–Aided Design, vol. 8, No. 3, Mar. 1989, pp. 245–256.

Adachi, et al., "A Parallel Implementation of Nonlinear Steady State Analysis Based on Time–Domain Newton–Raphson Algorithm," 1989 IEEE, IEEE International Symposium on Circuits and Systems, vol. 2, pp. 889–892.

(List continued on next page.)

*Primary Examiner*—Kevin J. Teska
*Assistant Examiner*—Thuan Do
*Attorney, Agent, or Firm*—Mitchell, Silberberg & Knupp LLP

[57] ABSTRACT

A system for determining an affinity associated with relocating a cell located on a surface of a semiconductor chip to a different location on the surface is disclosed herein. Each cell may be part of a cell net containing multiple cells. The system initially defines a bounding box containing all cells in the net which contains the cell. The system then establishes a penalty vector based on the bounding box and borders of a region containing the cell, computes a normalized sum of penalties for all nets having the cell as a member, and calculates the affinity based on the normalized sum of penalties. Also included in the disclosed system are methods and apparatus for capacity and utilization planning of the use of the floor, or the surface area, and the methods and apparatus for parallelizing the process of affinity based placements using multiple processors. Finally, method and apparatus for connecting the cells based on a Steiner Tree method is disclosed.

23 Claims, 36 Drawing Sheets

U.S. PATENT DOCUMENTS

| | | | |
|---|---|---|---|
| 4,831,725 | 5/1989 | Dunham et al. | 29/847 |
| 4,850,027 | 7/1989 | Kimmel | 382/49 |
| 4,872,125 | 10/1989 | Catlin | 364/578 |
| 4,908,772 | 3/1990 | Chi | 364/491 |
| 4,910,680 | 3/1990 | Hiwatashi | 364/491 |
| 4,918,614 | 4/1990 | Modarres et al. | 364/490 |
| 4,961,152 | 10/1990 | Davis | 364/513 |
| 4,965,739 | 10/1990 | Ng | 364/491 |
| 5,051,895 | 9/1991 | Rogers | 364/200 |
| 5,051,938 | 9/1991 | Hyduke | 364/578 |
| 5,062,054 | 10/1991 | Kawakami et al. | 364/491 |
| 5,119,313 | 6/1992 | Shaw et al. | 364/491 |
| 5,124,927 | 6/1992 | Hopewell et al. | 364/468 |
| 5,136,686 | 8/1992 | Koza | 395/13 |
| 5,140,402 | 8/1992 | Murakata | 357/45 |
| 5,140,526 | 8/1992 | McDermith | 364/488 |
| 5,140,530 | 8/1992 | Guha et al. | 395/13 |
| 5,144,563 | 9/1992 | Date et al. | 395/500.1 |
| 5,157,778 | 10/1992 | Bischoff et al. | 395/800 |
| 5,159,682 | 10/1992 | Toyonaga et al. | 395/500 |
| 5,187,668 | 2/1993 | Okude et al. | 364/468 |
| 5,191,542 | 3/1993 | Murofishi | 364/491 |
| 5,200,908 | 4/1993 | Date et al. | 364/491 |
| 5,202,840 | 4/1993 | Wong | 395/500.08 |
| 5,208,759 | 5/1993 | Wong | 364/468 |
| 5,218,551 | 6/1993 | Agrawal et al. | 364/491 |
| 5,222,029 | 6/1993 | Hooper et al. | 364/489 |
| 5,222,031 | 6/1993 | Kaida | 364/491 |
| 5,224,056 | 6/1993 | Chene et al. | 364/490 |
| 5,224,057 | 6/1993 | Igarashi et al. | 364/490 |
| 5,225,991 | 7/1993 | Dougherty | 364/491 |
| 5,231,590 | 7/1993 | Kumar et al. | 364/491 |
| 5,239,465 | 8/1993 | Hattori et al. | 364/419.19 |
| 5,245,550 | 9/1993 | Miki et al. | 364/490 |
| 5,249,259 | 9/1993 | Harvey | 395/13 |
| 5,251,147 | 10/1993 | Finnerty | 364/490 |
| 5,255,345 | 10/1993 | Shaefer | 395/13 |
| 5,267,176 | 11/1993 | Antreich et al. | 364/491 |
| 5,267,177 | 11/1993 | Sato et al. | 364/491 |
| 5,303,161 | 4/1994 | Burns et al. | 364/490 |
| 5,309,371 | 5/1994 | Shikata et al. | 364/491 |
| 5,341,308 | 8/1994 | Mendel | 364/489 |
| 5,349,536 | 9/1994 | Ashtaputre et al. | 364/491 |
| 5,363,313 | 11/1994 | Lee | 364/491 |
| 5,392,222 | 2/1995 | Noble | 364/490 |
| 5,398,195 | 3/1995 | Kim | 364/491 |
| 5,404,313 | 4/1995 | Shiohara et al. | 364/491 |
| 5,404,561 | 4/1995 | Castelaz | 395/800 |
| 5,465,218 | 11/1995 | Handa | 364/489 |
| 5,491,641 | 2/1996 | Scepanovic et al. | 364/491 |
| 5,495,419 | 2/1996 | Rostoker et al. | 364/468 |
| 5,521,837 | 5/1996 | Frankle et al. | 364/491 |
| 5,557,533 | 9/1996 | Koford et al. | 364/491 |
| 5,568,322 | 10/1996 | Azami et al. | 359/689 |
| 5,568,636 | 10/1996 | Koford | 395/500 |
| 5,578,840 | 11/1996 | Scepanovic et al. | 257/207 |
| 5,587,923 | 12/1996 | Wang | 364/490 |
| 5,590,063 | 12/1996 | Golio et al. | 395/500.02 |
| 5,615,128 | 3/1997 | Scepanovic et al. | 364/491 |
| 5,636,125 | 6/1997 | Rostoker et al. | 364/468.28 |
| 5,638,292 | 6/1997 | Ueda | 395/500.09 |
| 5,638,293 | 6/1997 | Scepanovic et al. | 364/491 |
| 5,640,327 | 6/1997 | Ting | 395/500.08 |
| 5,661,663 | 8/1997 | Scepanovic et al. | 364/490 |
| 5,682,321 | 10/1997 | Ding et al. | 364/490 |
| 5,682,322 | 10/1997 | Boyle et al. | 364/491 |
| 5,694,602 | 12/1997 | Smith | 709/105 |
| 5,699,265 | 12/1997 | Scepanovic et al. | 364/491 |
| 5,712,793 | 1/1998 | Scepanovic et al. | 364/490 |
| 5,742,510 | 4/1998 | Rostoker et al. | 364/468 |
| 5,745,363 | 4/1998 | Rostoker et al. | 364/468.28 |
| 5,757,657 | 5/1998 | Hathaway et al. | 395/500.11 |
| 5,798,936 | 8/1998 | Cheng | 364/489 |
| 5,858,143 | 8/1999 | Fournier | 364/491 |

OTHER PUBLICATIONS

Schulz, U., "Hierarchical Physical Design System," 1989 IEEE, IEEE Comput. Soc. Press, pp. 5/20–5/24.

Banerjee, et al., "Parallel Simulated Annealing Algorithms for Cell Placement on Hypercube Multi1processors," 1990 IEEE, IEEE Transactions on Parallel and Distributed Systems, vol. 1, No. 1, Jan. 1990, pp. 91–106.

Qian, et al., "Load Balancing on Generalized Hypercube and Mesh Multiprocessors with LAL," 1991 IEEE, 11th International Conference on Distributed Computing Systems, May 20–24, 1991, pp. 402–409.

Mayrhofer, et al., "Congestion–Driven Placement Using a New Multi–Partitioning Heuristic," 1990 IEEE, 1990 International Conference on Computer–Aided Design, pp. 332–335.

Bapat, et al., "Sharp–Looking Geometric Partitioning," 1991 IEEE, 1991 European Design Automation Conference, pp. 172–176.

Wu, et al., "Glue–Logic Partitioning for Floorplans with A Rectilinear Datapath," 1991 IEEE, Proceedings of the European Conference on Design Automation, pp. 162–166.

Chen, et al., "A Fast Parallel Algorithm for Slicing Floorplans," 1993 IEEE, 1993 IEEE International Symposium on Circuits and Systems, vol. 3, May 3–6, 1993, pp. 1774–1777.

Ganley, et al., "Thumbnail Rectilinear Steiner Trees," 1995 IEEE, VLSI 1995 5th Great Lakes Symposium, pp. 46–49.

Scherber, et al., "Palace: A Parallel and Hierarchical Layout Analyzer and Circuit Extractor," 1996 IEEE, Proceedings on European Design and Test Conference, Mar. 11–14, 1996, pp. 357–361.

Tragoudas, S., "Min–Cut Partitioning on Underlying Tree and Graph Structures," 1996 IEEE, IEEE Transactions on Computers, vol. 45, No. 4, Apr. 1996, pp. 470–474.

Chandy, et al., "A Parallel Circuit–Partitioned Algorithm for Timing Driven Cell Placement," 1997 IEEE, Proceedings on International Conference on Computer Design, Jan. 1, 1997, pp. 621–627.

John A. Chandy and Prithviraj Banerjee, "A Parallel Circuit–Partitioned Algorithm for Timing Driven Cell Placement," International Conference on Computer Design, 1997.

Laura A. Sanchis, "Multiple–Way Network Partitioning," IEEE Transactions on Computers, vol. 38, No. 1, Jan. 1989.

Minshine Shih and Ernest S. Kuh, "Circuit Partitioning Under Capacity and I/O Constraints," IEEE Custom Integrated Circuits Conference, 1994.

Laura A. Sanchis, "Multiple–Way Network Partitioning with Different Cost Functions," IEEE Transactions on Computers, vol. 42, Iss. 12, pp. 1500–1504, Dec. 1993.

Xiaoshu Qian and Qing Yang, "Load Balancing on Generalized Hypercube and Mesh Multiprocessors with LAL," IEEE Conference on Distributed Computing Systems, May 1991.

Prithviraj Banerjee et al., "Parallel Simulated Annealing Algorithms for Cell Placement on Hypercube Multiprocessors," IEEE Transactions on Parallel and Distributed Systems, vol. 1, No. 1, Jan. 1990.

S. Mayrhofer and U. Lauther, "Congestion–Driven Placement Using a New Multi–Partitioning Heuristic," IEEE Computer–Aided Design Conference, 1990.

S. Bapat and J. P. Cohoon, "Sharp–Looking Geometric Partitioning," IEEE European Design Automation Conference, 1991.

Allen C. U. Wu and Daniel D. Gajski, "Glue–Logic Partitioning for Floorplans with a Rectilinear Datapath," IEEE, 1991.

Cheng–Hsi Chen and Ioannis G. Tollis, "A Fast Parallel Algorithm for Slicing Floorplans," IEEE, 1993.

Joseph L. Ganley and James P. Cohoon, "Thumbnail Rectilinear Steiner Trees," VLSI, 5th Great Lakes Symposium, 1995.

F. Scherber et al., "Palace: A Parallel and Hierarchical Layout Analyzer and Circuit Extractor," IEEE, 1996.

Spyros Tragoudas, "Min–Cut Partitioning on Underlying Tree and Graph Structures," IEEE Transactions on Computers, vol. 45, No. 4, Apr. 1996.

Takehiko Adachi et al., "A Parallel Implementation of Nonlinear Steady State Analysis Based on Time–Domain Newton–Raphson Algorithm," IEEE, 1989.

Uwe Schultz, "Hierarchical Physical Design System," IEEE, 1989.

Ralph M. King and Prithviraj Banerjee, "ESP: Placement by Simulated Evolution," IEEE Transactions on Computer–Aided Design, vol. 3, No. 3, Mar. 1989.

N. Sherwani, "Algorithms for VLSI Physical Design Automation," Kluwer Academic Publishers, 1993, pp. 70–123.

C. Sechen and A. Sangiovanni–Vincentelli, "Timber Wolf 3.2: A New Standard Cell Placement and Global Routing Package," IEEE 23rd Design Automation Conf., Paper 26.1, 1986.

K. Shahookar and P. Mazumder, "A Genetic Approach to Standard Cell Placement Using Metagenetic Parameter Optimization," IEEE Transactions on Computer–Aided Design, vol. 9, No. 5, May 1990, pp. 500–511.

S. Mohan and P. Mazumder, "Wolverines: Standard Cell Placement on a Network of Workstations," IEEE Transactions on Computer–Aided Design of Integrated Circuits and Systems, vol. 12, No. 9, Sep. 1993.

D. Lenoski, "The Stanford Dash Multiprocessor," Computer, Mar. 1992.

J. Koza, "Genetic Programming," MIT Press, Cambridge, MA, 1993, pp. 94–101 and 173.

A. Nowatzyk and M. Parkin, "The S3.mp Interconnect System & TIC Chip," Proceedings of the IEEE Computer Society HOT Interconnect Symposium, Stanford Univ., 1993.

J. Kleinhans et al., "Gordian: VLSI Placement by Quadratic Programming and Slicing Optimization," IEEE Transactions of Computer–Aided Design, vol. 10, No. 3, Mar. 1991.

W. Sun and C. Sechren, "A Loosely Coupled Parallel Algorithm for Standard Cell Placement," ACM, 1994, pp. 137–144.

C. Sechen and K. Lee, "An Improved Simulated Annealing Algorithm for Row–Based Placement," IEEE Int'l Conference on Computer–Aided Design, Nov. 1987, pp. 478–481.

C. M. Fiduccia and R. M. Mattheyses, "A Linear–Time Heuristic for Improving Network Partitions," IEEE 1982, 19th Design Automation Conference, Paper 13.1, pp. 175–181.

H. Onodera and K. Tamaru, "A Block Placement Procedure Using a Force Model," Electronics and Communications in Japan, Part 3, vol. 72, No. 11, 1989, pp. 87–96.

K. Ueda, "CHAMP: Chip Floor Plan For Hierarchical VLSI Layout Design," IEEE Transactions on Computer–Aided Design, vol. CAD–4, No. 1, Jan. 1985.

N. Quinn, Jr. and M. Breuer, "A Forced Directed Component Placement Procedure for Printed Circuit Boards," IEEE Transactions on Circuits and Systems, vol. CAS–26, No. 6, Jun. 1979.

L. Y. Wang et al., Simultaneous Pin Assignment and Global Wiring for Custom VLSI Design, IEEE, Jun. 11, 1991.

Jingseng (Jason) Cong, "Pin Assignment with Global Routing for General Cell Designs," IEEE Transactions on Computer–Aided Design, vol. 10, No. 11, Nov. 1991, pp. 1404–1412.

Upton et al., "Integrated Placement for Mixed Macro Cell and Standard Cell Designs," IEEE, Proceedings of the 27th ACM/IEEE Design Automation Conference, Jun. 24, 1990, pp. 32–35.

Shahooker et al., "VLSI Cell Placement Techniques," ACM Computing Surveys, vol. 23, No. 2, Jun. 1991, pp. 144–219.

Massoud Pedram et al., "Floorplanning with Pin Assignment," IEEE, 1990, pp. 98–101.

Xianjin Yao et al., "A New Approach to the Pin Assignment Problem," 25th ACM/IEEE Design Automation Conference, Paper 37.3, 1988, pp. 566–572.

Andrea Casotto and Alberto Sangiovanni–Vincentelli, "Placement of Standard Cells Using Simulated Annealing on the Connection Machine," IEEE, 1987, pp. 350–353.

Jonathan S. Rose et al., "Parallel Standard Cell Placement Algorithms with Quality Equivalent to Simulated Annealing," IEEE Transactions on Computer–Aided Design, vol. 7, No. 3, Mar. 1988, pp. 387–397.

Mark Jones and Prithviraj Banerjee, "Performance of a Parallel Algorithm for Standard Cell Placement on the Intel Hypercube," 24th ACM/IEEE Design Automation Conference, Paper 42.3, 1987, pp. 807–813.

Andrea Casotto et al., "A Parallel Simulated Annealing Algorithm for the Placement of Macro–Cells," IEEE, vol. CAD–6, No. 5, Sep. 1987, pp. 838–847.

Sungho Kin et al., "Properplace: A Portable Parallel Algorithm for Standard Cell Placement," IEEE, 1994, pp. 932–934.

Chuck Kring and A. Richard Newton, A Cell–Replicating Approach to Mincut–Based Circuit Partitioning, IEEE, 1991, p. 2–5.

Wern–Jeih Sun and Carl Sechen, "A Loosely Coupled Parallel Algorithm for Standard Cell Placement," 1994, pp. 137–481.

W. Dia and E. Kuh, "Simultaneous Floor Planning and Global Routing for hierarchical Building–Block Layout," IEEE, vol. CAD–6, No. 5, 1987, pp. 828–837.

M. Y. Yu et al., "A New Clustering Approach and Its Application to BBL Placement," IEEE, 1990, pp. 665–669.

J.P. Cohoon, "Genetic Placement," W. D. Paris, IEEE, 1986, pp. 422–425.

FIG. 17
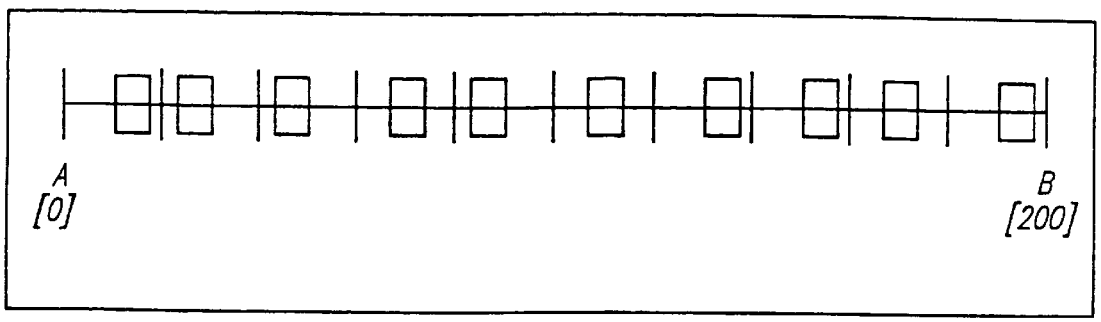
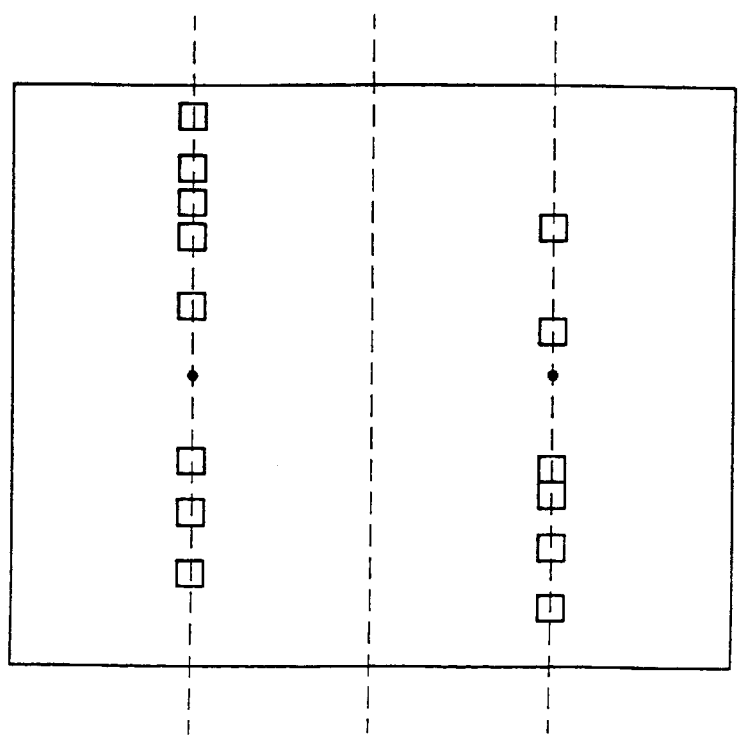
FIG. 20

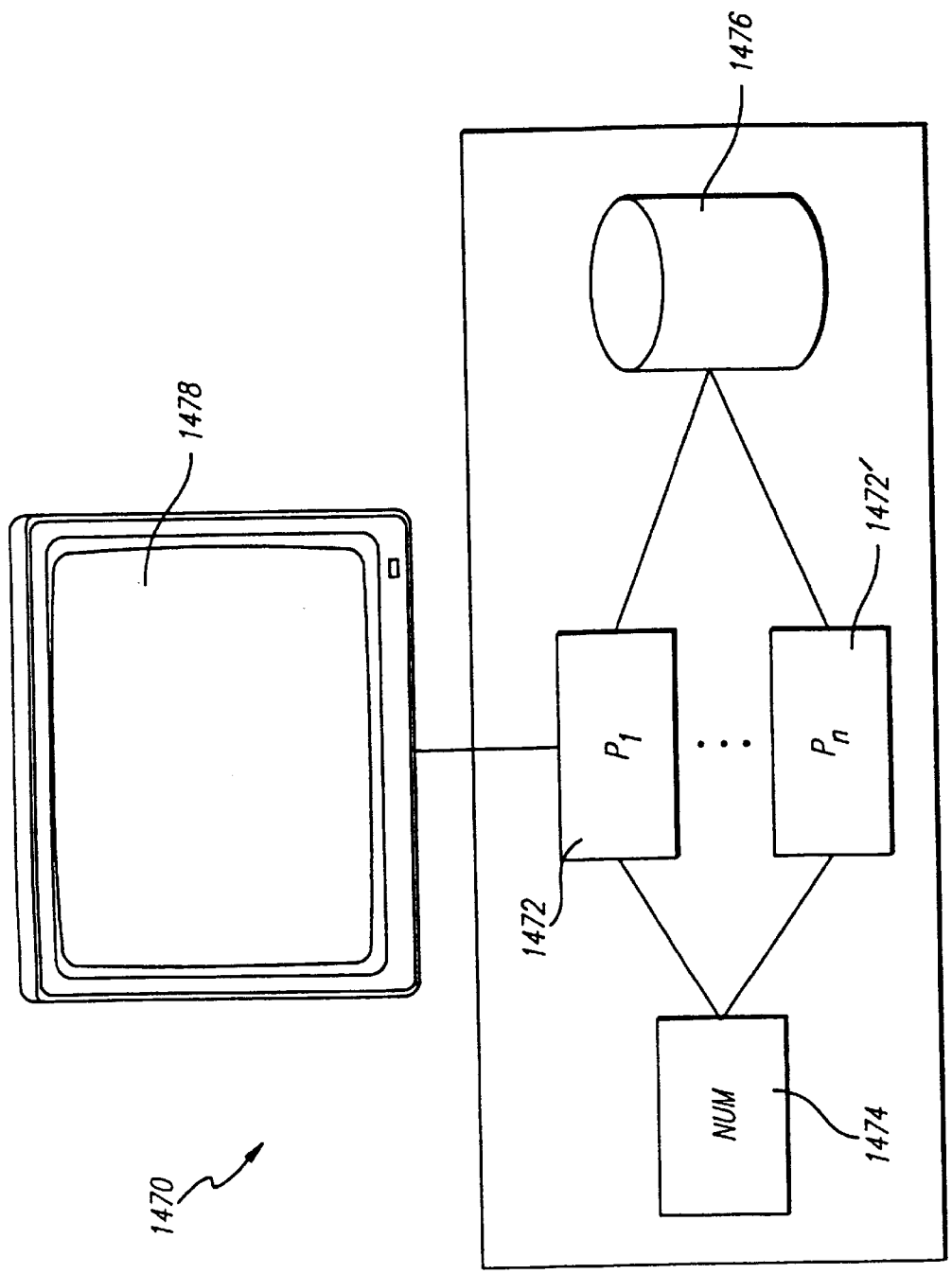

ADVANCED MODULAR CELL PLACEMENT SYSTEM

CROSS REFERENCE TO RELATED APPLICATION

Cross-reference to Related Application

This is a continuation-in-part of co-pending application Ser. No. 08/672,535, filed Jun. 28, 1996.

BACKGROUND OF THE INVENTION

1. Field of the Invention

The present invention generally relates to the art of microelectronic integrated circuit layout, and more specifically to the art of placement and routing of cells on integrated circuit chips.

2. Description of Related Art a. Introduction

Microelectronic integrated circuits consist of a large number of electronic components which are fabricated by layering several different materials on a silicon base or wafer. The design of an integrated circuit transforms a circuit description into a geometric description which is known as a layout. A layout consists of a set of planar geometric shapes in the various layers of the silicon chip.

The process of converting the specifications of an electrical circuit into a layout is called the physical design. Physical design requires arranging elements, wires, and predefined cells on a fixed area, and the process can be tedious, time consuming, and prone to many errors due to tight tolerance requirements and the minuteness of the individual components.

Currently, the minimum geometric feature size of a component is on the order of 0.5 microns. Feature size may be reduced to 0.1 micron within several years. This small feature size allows fabrication of as many as 10 million transistors or approximately 1 million gates of logic on a 25 millimeter by 25 millimeter chip. This feature size decrease/transistor increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The object of physical chip design is to determine an optimal arrangement of devices in a plane and to find an efficient interconnection or routing scheme between the devices to obtain the desired functionality. Since space on the chip surface is at a premium, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including genetic algorithms such as simulated evolution, force directed placement or simulated annealing, described hereinbelow, and comparing the resulting placements using a cost criteria.

Depending on the input, placement algorithms are classified into two major groups, constructive placement and iterative improvement methods. The input to the constructive placement algorithms consists of a set of blocks along with the netlist. The algorithm provides locations for the blocks. Iterative improvement algorithms start with an initial placement. These algorithms modify the initial placement in search of a better placement. The algorithms are applied in a recursive or an iterative manner until no further improvement is possible, or the solution is considered to be satisfactory based on a predetermined criteria.

Iterative algorithms can be divided into three general classifications: simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Interactive algorithms function by generating large numbers of possible placements and comparing them in accordance with some criteria which is generally referred to as fitness. The fitness of a placement can be measured in a number of different ways, for example, overall chip size. A small size is associated with a high fitness and vice versa. Another measure of fitness is the total wire length of the integrated circuit. A high total wire length indicates low fitness and vice versa.

The relative desirability of various placement configurations can alternatively be expressed in terms of cost, which can be considered as the inverse of fitness, with high cost corresponding to low fitness and vice versa.

b. Simulated Annealing

Basic simulated annealing per se is well known in the art and has been successfully used in many phases of VLSI physical design such as circuit partitioning. Simulated annealing is used in placement as an iterative improvement algorithm. Given a placement configuration, a change to that configuration is made by moving a component or interchanging locations of two components. Such interchange can be alternatively expressed as transposition or swapping.

In the case of a simple pairwise interchange algorithm, it is possible that a configuration achieved has a cost higher than that of the optimum, but no single interchange can cause further cost reduction. In such a situation, the algorithm is trapped at a local optimum and cannot proceed further. This happens quite often when the algorithm is used in practical applications. Simulated annealing helps to avoid getting achieving and maintaining a local optima by occasionally accepting moves that result in a cost increase.

In simulated annealing, all moves that result in a decrease in cost are accepted. Moves that result in an increase in cost are accepted with a probability that decreases over time as the iterations proceed. The analogy to the actual annealing process is heightened with the use of a parameter called temperature T. This parameter controls the probability of accepting moves that result in increased cost.

More of such moves are accepted at higher values of temperature than at lower values. The algorithm starts with a very high value of temperature that gradually decreases so that moves that increase cost have a progressively lower probability of being accepted. Finally, the temperature reduces to a very low value which requires that only moves that reduce costs are to be accepted. In this way, the algorithm converges to an optimal or near optimal configuration.

In each stage, the placement is shuffled randomly to get a new placement. This random shuffling could be achieved by transposing a cell to a random location, a transposition of two cells, or any other move that can change the wire length or other cost criteria. After the shuffle, the change in cost is evaluated. If there is a decrease in cost, the configuration is accepted. Otherwise, the new configuration is accepted with a probability that depends on the temperature.

The temperature is then lowered using some function which, for example, could be exponential in nature. The process is stopped when the temperature is dropped to a certain level. A number of variations and improvements on the basic simulated annealing algorithm have been developed. An example is described in an article entitled "Timberwolf 3.2 A New Standard Cell Placement and Global Routing Package" by Carl Sechen, et al., IEEE 23rd Designed Automation Conference paper 26.1, pages 432 to 439.

c. Simulated Evolution

Simulated evolution, which is also known as the genetic algorithm, is analogous to the natural process of mutation of species as they evolve to better adapt to their environment. The algorithm starts with an initial set of placement configurations which is called the population. The initial placement can be generated randomly. The individuals in the population represent a feasible placement to the optimization problem and are actually represented by a string of symbols.

The symbols used in the solution string are called genes. A solution string made up of genes is called a chromosome. A schema is a set of genes that make up a partial solution. The simulated evolution or genetic algorithm is iterated, and each iteration is called a generation. During each iteration, the individual placements of the population are evaluated on the basis of fitness or cost. Two individual placements among the population are selected as parents, with probabilities based on their fitness. A better fitness for an individual placement increases the probability that the placement will be chosen.

The genetic operators are called crossover, mutation and inversion, which are analogous to their counterparts in the evolution process, are applied to the parents to combine genes from each parent to generate a new individual called the offspring or child. The offspring are evaluated, and a new generation is formed by including some of the parents and the offspring on the basis of their fitness in a manner such that the size of the population remains the same. As the tendency is to select high fitness individuals to generate offspring, and the weak individuals are deleted, the next generation tends to have individuals that have good fitness.

The fitness of the entire population improves with successive generations. Consequently, overall placement quality improves over iterations. At the same time, some low fitness individual cell placements are reproduced from previous generations to maintain diversity even though the probability of doing so is quite low. In this way, it is assured that the algorithm does not lock into a local optimum.

The first main operator of the genetic algorithm is crossover, which generates offspring by combining schemata of two individuals at a time. Combining schemata entails choosing a random cut point and generating the offspring by combining the left segment of one parent with the right segment of the other. However, after doing so, some cells may be duplicated while other cells are deleted. This problem will be described in detail below.

The amount of crossover is controlled by the crossover rate, which is defined as the ratio of the number of offspring produced by crossing in each generation to the population size. Crossover attempts to create offspring with fitness higher than either parent by combining the best genes from each.

Mutation creates incremental random changes. The most commonly used mutation is pairwise interchange or transposition. This is the process by which new genes that did not exist in the original generation, or have been lost, can be generated.

The mutation rate is defined as the ratio of the number of offspring produced by mutation in each generation to the population size. It must be carefully chosen because while it can introduce more useful genes, most mutations are harmful and reduce fitness. The primary application of mutation is to pull the algorithm out of local optima.

Inversion is an operator that changes the representation of a placement without actually changing the placement itself so that an offspring is more likely to inherit certain schema from one parent.

After the offspring are generated, individual placements for the next generation are chosen based on some criteria. Numerous selection criteria are available, such as total chip size and wire length as described above. In competitive selection, all the parents and offspring compete with each other, and the fittest placements are selected so that the population remains constant. In random selection, the placements for the next generation are randomly selected so that the population remains constant.

The latter criteria is often advantageous considering the fact that by selecting the fittest individuals, the population converges to individuals that share the same genes and the search may not converge to an optimum. However, if the individuals are chosen randomly there is no way to gain improvement from an older generation to a new generation. By combining both methods, stochastic selection chooses probabilities based on the fitness of each individual.

d. Force Directed Placement

Force directed placement exploits the similarity between the placement problem and the classical mechanics problem of a system of bodies attached to springs. In this method, the blocks connected to each other by nets are supposed to exert attractive forces on each other. The magnitude of this force is directly proportional to the distance between the blocks. Additional proportionality is achieved by connecting more "springs" between blocks that "talk" to each other more (volume, frequency, etc.) and fewer "springs" where less extensive communication occurs between each block.

According to Hooke's Law, the force exerted due to the stretching of the springs is proportional to the distance between the bodies connected to the spring. If the bodies are allowed to move freely, they would move in the direction of the force until the system achieved equilibrium. The same idea is used for placing the cells. The final configuration of the placement of cells is the one in which the system achieves a solution that is closest to actual equilibrium.

e. Parallel Processing Technique 1

Because of the large number of possible placements, computerized implementation of the placement algorithms discussed above can take many days. In addition, the placement algorithm may need to be repeated with different parameters or different initial arrangements to improve the results.

To reduce the time required to place optimally the cells, multiple processors have been used to speed up the process. In such implementations, multiple processors operate simultaneously to place optimally the cells on the integrated chip. However, such prior efforts to reduce the placement time by parallel processing of the placement methods have been impeded by three obstacles.

First, multiple processors may conflict with each other. This occurs where an area on the chip, which is being processed by one processor, is affected by movements of one or more cells into the area by another processor. When this occurs, one of the two conflicting processors must wait for the other to finish or postpone its own move for later. The area-conflict problem not only lessens the advantage of multiprocessing, but also increases the processing overhead encountered. This is because, before moving a cell, each of the processors must check for area-conflicts with all other processors. As the number of processors increases, the area-conflicts increase rapidly to negate the advantage of multiprocessing, such that the time required to place the cells is increased.

Second, the optimization process can become trapped in a local optimum. To eliminate the area-conflict problem, some systems have assigned particular core areas to each of the processors with the restriction that each of the processors only operate within its assigned area. After processing cells of the assigned areas, the processors are then assigned to different areas, and so on. Although this method eliminates area-conflicts, it limits the movements of the cells to the area assigned to the processor. The limitation on the movement of the cells increases the likelihood of the placement becoming stuck at a local optimum. In the case of a pairwise interchange algorithm, it is possible that a configuration achieved is at a local optimum such that any further exchange within the limited area will not result in a further reduction in cost. In such a situation, the algorithm is trapped at the local optimum and does not proceed further. This happens frequently when the algorithm is used in practical applications, and the extent of the local optimum problem increases as additional processors are added because the increase in the number of processors operating simultaneously reduces the area assigned to each of the processors. Decreases in the area assigned to each of the processors lead to corresponding decreases of the distances the cells of the areas may be moved to improve the optimization.

Third, if multiple processors are used simultaneously to place the cells of an integrated chip, it is possible for the processors to deadlock. This occurs where each of the processors has halted its operation while waiting for another processor to complete its operations. In this situation, all processing is stopped and the system halts. An example of deadlock is where processor $P_1$ is waiting for processor $P_2$ to complete its operation, $P_2$ is waiting for processor $P_3$ to complete its operation, and $P_3$ is waiting for $P_1$ to complete its operation. In that case, neither $P_1$, $P_2$, nor $P_3$ will proceed.

In short, because of the ever-increasing number of cells on an integrated chips (currently at millions of cells on a chip), and the resulting increase in the number of possible placements of the cells on the chip, a computer is used to find an optimal layout of the cells on the chip. Even with the aid of computers, existing methods can take several days to place a large number of cells, and these methods may need to be repeated with different parameters or different initial arrangements. To decrease the time required to place the chip, multiple processors have been used to perform the placement of the cells. However, the use of multiple processors has led to area-conflicts, local optimum problems, and potential deadlock situations, negating the advantages of using the multiple processors.

f. Parallel Processing Technique 2

Alternative to the Parallel Processing Technique 1 discussed above, another technique to implement parallel processing of cell placement algorithms is described below.

The problems associated with the prior art parallelization techniques of assigning regions to multiple processors is illustrated using FIG. 43. The figure illustrates a grossly simplified integrated circuit chip (IC) with four nets 1107, 1109, 1111, and 1113 and four regions 1108a, 1108b, 1108c, and 1108d, each of which has been assigned to a processor.

The first problem is the crossover net problem. If the regions are divided such that crossover nets are created, then the effectiveness of the parallel processing technique is reduced. This is because none of the processors which share the crossover nets can accurately calculate the position of the (which is always the basis for the decision about the cell move) because the other processor may move its cell during the calculation. Naturally, as the number of processors increases, the number of crossover nets increases, aggravating the problem. A large number of crossover nets can be fatal for the convergence of cell placement algorithms. For example, in FIG. 43, nets 1109, 1111 and 1113 are the crossover nets. Some cells of net 1109 are processed by the processor assigned to region 8a while others are processed by the processor assigned to region 1108c. Likewise, the cells of nets 1111 and 1113 are placed by processors assigned to regions 1108a and 1108b, and 1108b and 1108d, respectively.

Second, cell movements from one region (or processor) to another creates communications overhead which may negate the advantages of multiple processor cell placement technique. Each time a cell is moved from one region to another, the processor moving the cell from its assigned region must communicate with the processor receiving the cell to its assigned region. The communication requirement complicates the implementation of cell placement algorithms and slows down both of the communicating processors. As the number of processors, the number of cells, or the number of required cell moves increase, the communication overhead increases. In particular, the performance of the parallel processing technique is especially poor if the spring density levelization method is used as the cell placement algorithm because the algorithm tends to make global cell moves.

Third, to minimize crossover nets and communications overheads, the prior art parallelization techniques typically require a "good" preplacement of the cells on the chip. That is, in order to operate effectively, the prior art methods require the nets to be within a single region and the cells of the nets to be "close" to each other. The best way to achieve this is to increase the region size and decrease the number of processors running in parallel. However, the increase in the region size and the decrease in the number of parallel processors defeat the purpose of parallelizing the cell placement algorithm. Moreover, even with such preplacement of cells, there are generally still many crossover nets.

In order to avoid the problems associated with crossover nets, regions have to be made larger. Use of large regions has the disadvantage in that it limits the number of processors that can be used. In fact, if the entire integrated chip is defined as one region, and only one processor is assigned to place the cells of the chip, then there would be no crossover net problems or communications overhead; but, there also is no parallel processing, and the cell placement becomes a sequential process. Finally, the prior art technique of assigning regions of the IC to each of the multiple processors lead to the problem of unbalanced work load. Because each of the regions may contain varying number of nets, cells, or cells requiring further movements, it is difficult to assign regions to the processors so as to assign equal amount of work to each of the processors. Consequently, some processors finish the placement of the cells of its assigned regions more quickly than other processors, reducing the effectiveness of parallelization of the placement algorithm.

In short, assigning multiple processors have been used implement cell placement algorithms by assigning regions of the IC to each of the processors. However, this technique has lead to crossover net conflicts, interprocessor communication problems, cell preplacement requirements, and uneven distribution of work problems, negating the advantages of using the multiple processors.

g. Floor Plan Optimization

The cost or the desirability of various placement configuration can be measured using other methods such as capacity distribution and utilization ratio. Capacity distribution and utilization ratios measure the placement of the cells for each of the functional blocks for the integrated circuit. An integrated circuit is designed with various functional blocks, or functions, which, operating together, achieves the desired operation. Each of the functions of the circuit is implemented by a plurality of cells and is assigned a portion of the core space upon which the cells are placed. For example, an integrated circuit design may require the use of a central processor unit (CPU) function, memory function, and some type of input/output (I/O) function.

In this Subsection, Subsection 1c–b, Section 3B and in the corresponding claims of this document, the terms and phrases "core," "core space," "core area," "floor," "floor space," and "integrated circuit," will be used interchangeably to refer to the area of the integrated circuit upon which cells are placed to implement various functions of the integrated circuit.

The capacity is the maximum amount of cells which can be placed on the core space or any portion of the core space and is usually measured in cell height units. Provided that entire core space has sufficient capacity, it is often desirable to place the cells on the core space with a certain capacity distribution. For instance, it may be desirable that the cells of the integrated circuit be distributed evenly throughout the chip to avoid high concentration of the cells in a small location with a low concentration of the cells for the rest of the core space. On the other hand, it may be desirable to implement certain functions of the chip on a small portion of the core space with a high concentration of the cells. In sum, a predetermined capacity distribution of the core space or for any function assigned to a portion of the core space may be one of the requirements of the cell placement.

A closely related concept is the utilization of the space. The utilization is the ratio of the amount of the actual core space use within a predefined portion of the core space to the capacity of the core space for the predefined portion of the core space. For example, if a portion of the core space assigned to a function has a capacity of 100,000 cell height units, and the cells to implement the function uses 50,000 cell height units, then the utilization of the portion of the core space is 50 percent.

The capacity distribution or the utilization ratio for each of the functions of the integrated circuit or for the entire core space may be predetermined as an engineering parameter based on such factors as heat dissipation, power management, manufacturing constraints, etc.

The current methods of optimally placing the cells on the integrated circuit involve (1) assigning functions to be implemented to portions of the integrated circuit; (2) placing the cells of each of the functions onto the assigned portion of the integrated circuit using a placement algorithm; (3) calculating the capacity distribution of the integrated circuit and the utilization rate of each portion of the integrated circuit used to implement its function; and (4) iterating the first three steps to obtain a better placement in terms of capacity distribution or utilization.

The disadvantages of the current process involve time and accuracy. Because the placement process requires manual iteration between floor planing tools (to calculate and evaluate capacity and utilization) and placement tools (to newly place the cells onto the core), the optimal placement process takes a long time. Also, is difficult to manually optimize many different parameters simultaneously because, at each iteration, the operator has to simultaneously consider many parameters—overall capacity, capacity distribution, overall utilization, utilization of each functions, utilization distribution, overlap size among functions, aspect ratio of functions, etc. Even with highly experience professionals, the simultaneous consideration of all of the parameters for an optimal cell placement is an extremely difficult process. Further, the complexity of the cell placement process is continually increasing as the number of functions and the number of cells on integrated chips increase, rendering manual analysis techniques to become nearly impossible to perform.

In short, because of the ever-increasing complexity of integrated circuit chips and the number of cells required to implement the functions of the complex designs, the manual placement optimization methods are fast becoming obsolete. The manual floor planning and cell placement optimization process requires an inordinate amount of time because the process requires manual iteration between running floor plan tools and placement tools. In additional, it is extremely difficult, at best, for human beings to simultaneously optimize several parameters (function utilization, overlap size among functions, aspect ratios of functions, etc.).

h. Net Routing

Each microelectronic circuit device or cell includes a plurality of pins or terminals, each of which is connected to pins of other cells by a respective electrical interconnection wire network, or net. A purpose of the optimization process used in the physical design stage is to determine a cell placement such that all of the required interconnections can be made, but total wirelength and interconnection congestion are minimized. The process of determining the interconnections of already placed cells of an integrated circuit is called routing.

Assuming that a number N of cells are to be optimally arranged and routed on an integrated circuit chip, the number of different ways that the cells can be arranged on the chip, or the number of permutations, is equal to N! (N factorial). In addition, each of the cells may require multiple connection points (or pins), each of which, in turn, may require connections to multiple pins of multiple cells. The possible routing permutations are even larger than the possible cell placements by many orders of magnitude.

Because of the large number of possible placements and routing permutations, even computerized implementation of the placement algorithms discussed above can take many days. In addition, the placement and routing algorithms may need to be repeated with different parameters or different initial arrangements to improve the results.

To reduce the time required to optimally route the nets, multiple processors have been used to speed up the process. In such implementations, multiple processors are assigned to different areas of the chip to simultaneously route the nets in its assigned areas. However, it has been difficult to evenly distribute the amount of routing required from each of the multiple processors. In fact, due to the nonlinear algorithm complexity, the obvious, always assumed parallelization which is to split the nets among the processors does not work because routing of one highest fanout net can take much longer than routing of all other nets of the integrated circuit. Such unbalanced parallelization of the routing function has been the norm in the art, leading to ineffective use of parallel processing power.

In short, because of the ever-increasing number of cells on an integrated chips (currently at millions of cells on a chip), and the resulting increase in the number of possible routing of the cells and the nets on the chips, multiple processors are used to simultaneously route the nets of an integrated chip. However, even with the aid of computers, existing methods can take several days, and the addition of processors may not decrease the required time because of the difficulties of balancing the amount of work between the processors.

i. Other Considerations

The problem of cell placement is compounded by external requirements specific to each individual integrated circuit chip. In conventional chip design, the positions of certain "unmovable" cells (external interconnect terminals or pads, large "megacells" etc.) are fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller sub-circuits until each sub-circuit is small enough to be designed efficiently. Because the quality of the design may suffer due to the partitioning, the partitioning of a circuit requires care and precision.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved.

Numerous alternate methodologies for cell placement and assignment are known in the art. These include quadratic optimization as disclosed in an article entitled "GORDIAN: VLSI Placement by Quadratic Programming and Slicing Optimization", by J. Kleinhans et al, IEEE Trans. on CAD, 1991, pp. 356–365, and simulated annealing as described in an article entitled "A Loosely Coupled Parallel Algorithm for Standard Cell Placement", by W. Sun and C. Sechan, Proceedings of IEEE/ACM IC-CAD Conference, 1994, pp. 137–144.

These prior art methods cannot simultaneously solve the partitioning problem and the problem of placing partitions on the chip, and thus the applicability of such methods to physical design automation systems for integrated circuit chip design is limited.

More specifically, prior art methods do not provide any metric for specifying distances between cells based on netlist connections. An initial placement must be performed to establish physical locations for cells and thereby distances therebetween.

Also, prior art methods fix cells in clusters at the beginning of optimization, and do not provide any means for allowing cells to move between clusters as optimization proceeds. This can create areas of high routing congestion, which cannot be readily eliminated because cell movements between clusters which could relieve the congestion are not allowed.

In summary, the problem inherent in these prior cell placement methods is that repeated iterations generally do not tend to converge to a satisfactory relatively uniform overall cell placement for large numbers of cells. The aforementioned methods can take several days to place a large number of cells, and repeating these methods with different parameters or different initial arrangements may not necessarily provide improvements to cell placement. Typical methods for using these designs involve using a chosen method until a particular parameter, for example wire length, achieves a certain criteria or the method fails to achieve this criteria for a predetermined number of runs. The results are inherently non-optimal for other placement fitness measurements, having optimized the method based only on a single parameter. Further, results of these placement techniques frequently cannot be wired properly, or alternately, the design does not meet timing requirements. For example, with respect to simulated annealing, setting the temperature to different values may, under certain circumstances, improve placement, but efficient and uniform placement of the cells is not guaranteed.

SUMMARY OF THE INVENTION

According to the present invention, there is provided a method and an apparatus for locating a plurality of elements on a surface. The method comprises the of the steps of assigning the elements to portions of the surface; preplacing the elements onto the surface; repositioning the elements depending on relative affinities of the elements to each other; and connecting the elements on the surface. Specifically, the present invention applies the above method for placing cells on an integrated circuit chip.

According to another embodiment of the present invention, a computer-implemented method and apparatus for locating a plurality of elements on a surface is disclosed. The method comprises the steps of forming a neighborhood defined as a set of the elements; ordering elements within each neighborhood according to their relative distance from said target element; preplacing the elements within a two-dimensional abstraction of said surface; iteratively subdividing the surface into a plurality of regions; assigning the elements to the regions; calculating affinities of the elements using a plurality of processors; moving the elements based on affinities for relocating said elements; levelizing element density over the surface based on the affinities between various elements; relocating any overlapping elements; and performing a final cell adjustment for element positions.

According to another aspect of the present invention, there is provided a method and apparatus for maximizing effectiveness of parallel processing to achieve an optimal cell placement layout of a core area of an integrated chip. The core area is defined as the area on the integrated chip upon which the cells are to be placed. The method is realized by dividing the core area into a plurality of regions, assigning a set of non-adjacent regions to each of the multiple processors, and allowing each of the multiple processors to process the cells of the regions to which it has been assigned.

Because each of the multiple processors is operating upon a non-adjacent region at any one time, most of the cell movements of one processor are "far enough" from the cell movements of the other processes so as to minimize conflict between processors. Consequently, no limits need be placed upon the areas within which a processor operates or cell movements are made. Because the cell moves allowed by the invention disclosed herein are not limited, acceptance of undesirable local optimal solutions is avoided.

According to another aspect of the present invention, there is provided a method and apparatus for placing cells on an integrated circuit chip by assigning cells, rather than regions of the chip, to a plurality of processors and having each of the processors place its assigned cells on the chip. The cells are assigned to the chips so as to balance the workload among the processors.

To reduce crossover nets and inter-processor communications overhead, the affinities of the individual cells to each of the multiple processors are calculated, and the affinity values are used to reassign the cells to other processors. However, the affinity values are also weighed against the processor work load to maintain a balanced work load among the processors. In addition, because the processors are assigned to cells instead of regions, the cell placement algorithms become inherently less dependent upon the initial placement of the cells on the integrated circuit.

The parallelization techniques of the present invention can be modified for different placement algorithms because the method describes a way to implement any placement algorithm using multiple processors operating simultaneously.

To overcome the difficulties of the current floor planning techniques, the floor planning method and apparatus disclosed in this specification provides for a method to optimize a given floorplan automatically while meeting required capacity distribution and utilization. The disclosed new floor planning technique achieves almost uniform utilization of the chip by optimally using the overlap and border regions of the functions while satisfying the given floorplan constraints.

According to another aspect of the present invention, there is provided a method and apparatus for allocating floor space of an integrated circuits chips to functions of the chip comprising the steps of partitioning the IC into a grid comprising a plurality of regions; defining pieces, where each piece comprises at least one of the regions, and each piece having a capacity; and allocating said capacity of each of said pieces to a plurality of functions.

In addition, after the allocation of the capacity of the pieces to the functions, the sufficiency of the allocated capacities are analyzed for each of the functions. Then, the capacities of the pieces are reallocated to shift excess capacities from the functions with excess capacities to the functions with a shortage of space.

According to another aspect of the present invention, there is provided a method and apparatus for grouping the pins of a cell placement layout of an integrated circuit to achieve a balanced performance for parallel processing of the cell routing. First, the pins of the net are partitioned into neighborhoods and the best partitions are selected. Then, the pins are reassigned into better partitions and a minimal spanning method is used to create a graph structure of the partitions of the pins to create a minimally partitioned nets. The minimal spanning tree (MST) of the pins, thus defining the nets, can be used to assign groups of the pins to the multiple CPU's. The multiple CPU's simultaneously, or in parallel, connect the pins, thus routing the net.

The method of the present invention can be applied to the entire set of pins of an integrated circuit, but is best applied to each of the nets of the integrated circuit.

An apparatus for locating a plurality of elements on a surface includes one or more processors and memory connected to the processors. The memory stores the instructions for performing above described tasks. The apparatus may include other components such as a monitor and a harddrive to store information regarding the elements and the surface, and to display the results of the operations as well as system status information.

The present invention also includes a computer storage medium that stores a plurality of executable instructions for instructing a computer for organizing integrated circuit pins for routing purposes, including instructions to partition the pins into a plurality of sets; to construct a spanning tree having vertices and edges; and to assign the sets in accordance with said edges of said spanning tree.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 17 is an illustration of one cell located in each of the ten subintervals;

FIG. 20 is an illustration of the two regions that are divided using two dividing lines;

FIG. 55 illustrates an apparatus according to a preferred embodiment of the present invention.

DETAILED DESCRIPTION OF THE PREFERRED EMBODIMENT(S)

An overall block diagram of the preferred implementation of the current invention is presented in FIG. 1. As will become apparent from the following detailed description, other embodiments can be implemented with highly effective results while still within the scope of the invention.

Section 1: System Overview

Figure 1A:
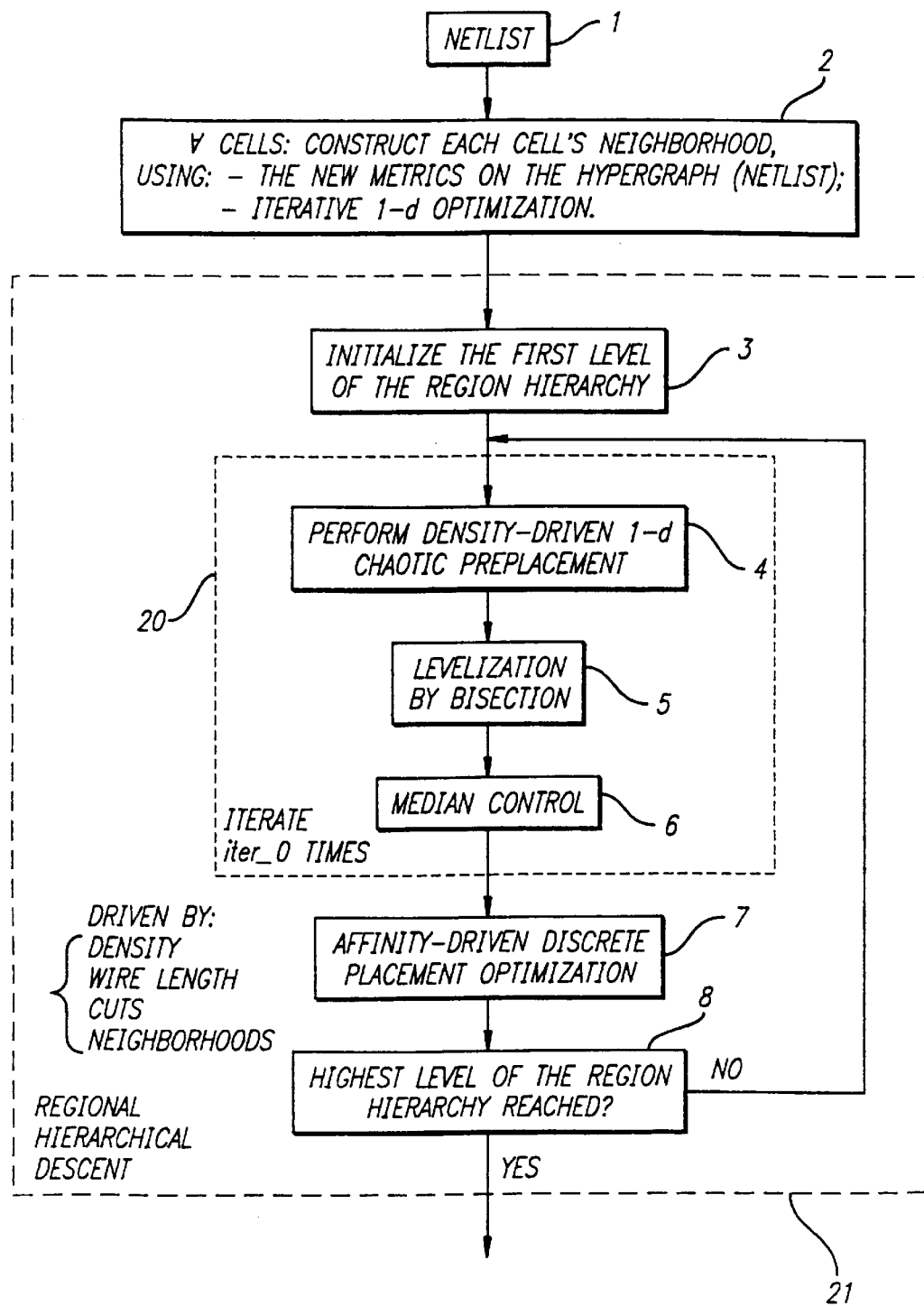
FIG. 1A is a flow chart illustrating the main steps of the process according to the present invention.
Figure 1B:
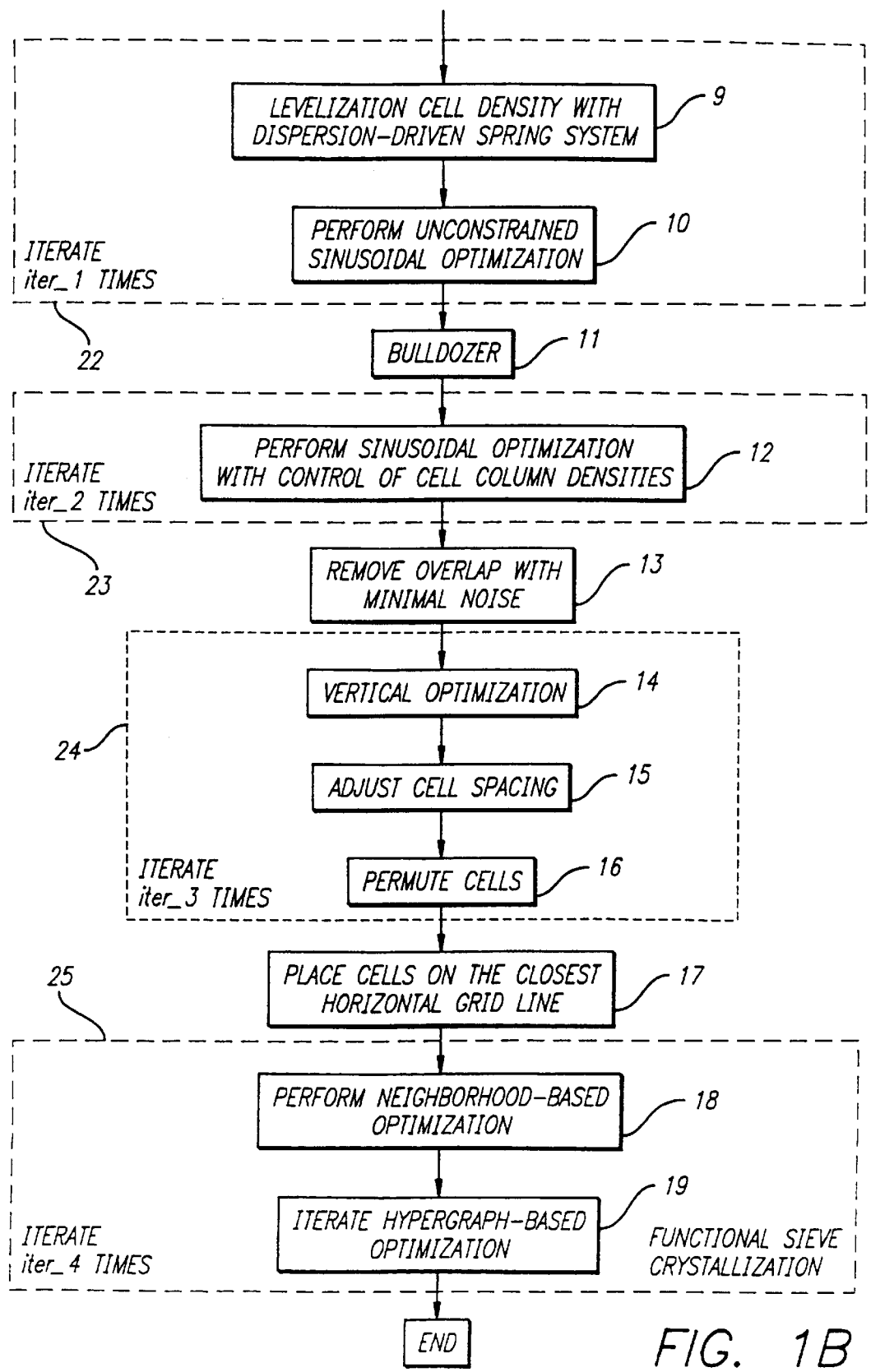
FIG. 1B is a flow chart illustrating the main steps of the process according to the present invention.

FIGS. 1A and 1B comprise a flow chart that illustrates the main steps of the process according to the present invention. A brief description of the various steps of the process is presented with reference to FIGS. 1A and 1B. To facilitate describing and understanding the invention, this disclosure is divided into sections. This first section is a general overview of the process according to the present invention. Subsequent sections describe and explain the algorithms and process steps shown in FIGS. 1A and 1B with reference to other figures of the drawings as appropriate.

The specific algorithms described herein, as well as the basic steps which they represent (even if they are replaced by different algorithms), are designed for implementation in a general purpose computer. Furthermore, each of the algorithms described herein, as well as the basic step it represents, can be encoded on computer storage media such as CD Roms, floppy disks and computer harddrives, whether alone or in combination with one or more of the algorithms and steps described herein.

Given only the netlist, before the cells have been placed on the chip, there is no way using prior art techniques to compute the conventional geometric distance between two cells (the "Euclidean distance") because no geometric coordinates exist for any cell. A new mathematical form of distance is defined in the algorithms according to the present invention in which the distance between cells can be calculated from the way in which connections in the netlist interconnect its cells. This distance measure plays a critical role in the analysis of the netlist for placement by the algorithms.

The cell placement system according to the present invention performs placement as either a uniprocessor or multi- or parallel-processor procedure. Unlike previous systems in which a constructive heuristic provided an initial placement followed by a statistical improvement technique, the process according to the present invention constructs and optimizes placements in a series of highly integrated steps.

Subsection 1-1: Data Preparation

The use of placement techniques must, of course, be preceded by the step 1 of preparation of the netlist. For a large chip, preparation of the netlist is a major design effort that includes system specification, synthesis, debugging, preliminary timing, and final netlist construction. The specifics of these complex design steps are not the subject of the present disclosure. The description of the present invention begins by assuming that the system to be implemented on the chip has been designed and that the resulting correct netlist is available. The techniques for preparing a netlist are well known in the art.

Subsection 1-2: Neighborhood Construction

As shown at the start of the flowchart of FIG. 1A, the process according to the present invention constructs a neighborhood 2 for each cell in the netlist. A neighborhood can be loosely defined as a fuzzy clusters of pins where the pins are the connection points of the cells. Neighborhood construction is discussed in more detail in §2 below. The neighborhoods are preferably constructed according to the neighborhood construction process described below.

Subsection 1-3: Optimization of Cell Neighborhood System

After the neighborhood of a cell is constructed, coordinates are assigned to each cell, and the neighborhood system is optimized using the center cell. The optimization technique is described in detail in §3 below.

Subsection 1-3A: Parallel Cell Placement with Minimal Conflicts

Figure 42:
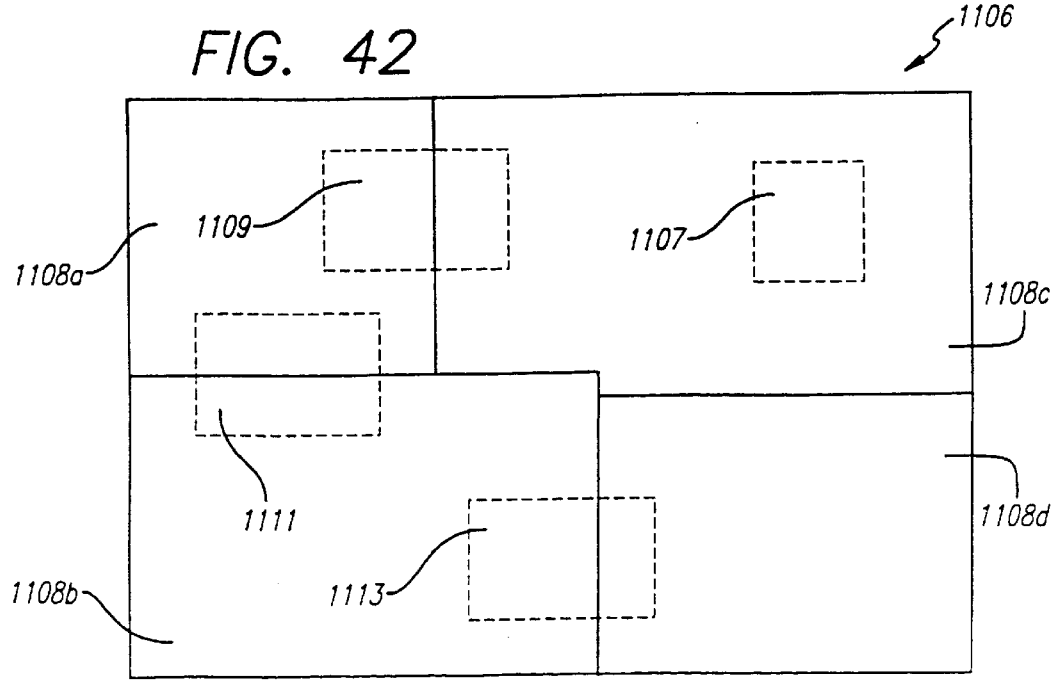
FIG. 42 illustrates an integrated circuit chip.

Placement of the cells on an integrated circuit chip can be performed in parallel, using multiple processors, by assigning cells to the multiple processors. Section 3A below, along with FIGS. 42 and 43, discusses the implementation technique of the parallel processing of the cell placement methods by assigning cells to the multiple processors.

Subsection 1-3B: Floor Plan Optimization

Prior to the very first preplacement of the cells on the IC surface, the functions of the IC (which the cells implement) must be assigned to the various portions of the IC surface. For instance, the CPU function (the cells implementing the CPU function) of the IC may be assigned to the central portion of the surface while the memory function (the cells implementing the memory function) may be assigned to the upper portions. Section 3B below describes the method and apparatus to optimally assign the portions of the IC surface to the functions to achieve an optimal floor plan.

Subsection 1-4: Iterative One Dimensional Preplacement Optimization

The cell coordinates are then iteratively optimized under the iterative one-dimensional (ID) preplacement optimization procedure described in §4. The purpose of this iterative ID preplacement optimization procedure is to get a fast, good cell preplacement. In the iterative one-dimensional preplacement optimization procedure of §4, the cells are pre-placed on a two-dimensional abstraction of the chip surface. The iterative one-dimensional preplacement optimization procedure begins with the step 3 of initializing the coordinates of all cells at the center of the surface, and then performing the iterations described in §4 in the x- and y-directions.

Subsection 1-5: Fast Procedure for Finding a Levelizing Cut Point

A density-driven one dimensional preplacement is performed 4 to assign cells to regions in accordance with the capacities of each region of the chip. A preferred process for assigning cells to regions in accordance with region capacity is described in §5.

The surface abstraction is divided into subregions by bisection in a selected direction. A preferred levelization by bisection process 5 is described in §5.

Subsection 1-6: Median Control and Increase in Resolution

A median control procedure 6 is then used to modify coordinates to the cells. A preferred median control process is described in §6.

The ID preplacement optimization procedure of §4, the cut-point procedure of §5 and the median control procedure of §6 are then iterated for a specified number of times, and the average value of the cost function (e.g. wire length) for the iterations is computed. The ID preplacement optimization procedure of §4, the cut-point procedure of §5 and the median control procedure of §6 are then again iterated for the specified number of times as a block 20 and the average cost function is recomputed. If the average cost function is decreased by less than a specified amount, usually $10^{-3}$, this step (block 20) is exited. Otherwise this step (block 20) is again iterated with the average cost function again computed and compared to the previous average cost function value. At the end of this step the cells have been assigned to subregions in such a way that the capacities of the subregions are not exceeded.

Subsection 1-7: Universal Affinity Driven Discrete Placement Optimization

An affinity-driven placement optimization 7 is performed to improve cell placement and to minimize the cost function. A preferred affinity-driven placement optimization process is described in §7.

Subsection 1-8: Density Driven Capacity Penalty System

Anther method to calculate the cost of a cell placement layout is the relative density of the partitions of the surface. A density driven system to calculate cell affinity is discussed in by §8.

Subsection 1-9: Wire Length Driven Affinity System

An alternative embodiment of the present invention is to calculate cell affinities and placement costs according to the relative wire lengths of different designs. The wire length driven affinity system is discussed in §9.

Subsection 1-10: Minimizing Maximal Cut Driven Affinity System

Another parameter used to produce an affinity for improving cell placement is minimizing the maximal number of nets that intersect the unit segment of the grid system imposed of the surface abstraction of the chip. The net intersect minimization affinity system is discussed in §10.

Subsection 1-11: Neighborhood System Driven Optimization

Each moveable cell v is located within a neighborhood Neigh(v) constructed in accordance with the optimization of cell neighborhood system procedure outlined above. That procedure yields an ordering of cells according to the cells' distance from the center of the neighborhood, after optimization. The neighborhood driven affinity system is described in §11.

Subsection 1-12: Functional Sieve Optimization Technique

The combination of affinities introduces an element of randomization. A deterministic system for combining affinities which converges at a relatively rapid rate is desired to optimally utilize affinities. Such a system which iteratively optimizes cell placement using a combination of affinities is the functional sieve approach. The functional sieve technique is described in §12.

When the affinity-driven optimization is complete, the level of the subdivision of the chip surface is checked 8. If the level of subdivision is not at the specified highest level (i.e., the level of hierarchy with the smallest desired regions), block 21 is repeated the chip is further subdivided in the y-dimension; the preplacement iteration of §§ 4 to 6 is reentered with that level of subdivision for the y-coordinate. The preferred highest level is where the region is one column wide. After processing for the y-coordinate is complete, the x-coordinate is processed, etc., as x and y alternate.

The typical number of iterations of block 21 is $2\log_2 N$ where N equals the number of columns in the chip. If, for example, the chip has 8 columns, the number of iterations is $2\log_2 8$, or 6.

After a certain level of hierarchy is achieved, it may be desirable to stop the process at this point and not continue with further cell placement. This is especially true if one wants to obtain a fast estimate of cell placement.

Subsection 1-13: Course Overflow Remover (Bulldozer)

Continuing with FIG. 1B, after global levelization has been performed, there may still be some density peaks in the core area of the chip. A preferred procedure for density peaks removal is described in §13. The procedure for density peaks removal 11 is sometimes referred to herein as the "bulldozer." The bulldozer is applied to remove the density peaks.

Subsection 1-14: Overlap Remover with Minimal Noise

The overlap removal procedure 13 of §14 is applied again without controlling the maximum distance between adjacent cells. The step removes any overlap that exists among cell outlines. This step is used to produce a physically feasible layout. Applying the overlap removal procedure at this part of the process removes cell overlap with minimal increase in average wire length.

Subsections 1-15, Sinusoidal Optimization, and 1-16. Dispersion Driven Levelizing System When the highest level of hierarchy is reached 8, the process enters a cell density levelization procedure as shown at the beginning of FIG. 1B. It should be noted that various combinations of the algorithmic steps described herein can be used. Algorithmic steps can be deleted as desired and as appropriate for the particular circumstances presented. Once the cell placement is determined by the methods in accordance with the present invention, the cells can then be placed on a silicon wafer in order to construct the desired integrated circuit.

The cell density levelization preferably begins with a dispersion-driven step 9 as described in §16. As this step is entered, the cells have been placed in positions on the surface that optimize given cost functions. However, the cell layout may not be feasible because cells may overlap, and the cells may have not been assigned to proper cell columns. Furthermore, the cell density may be very uneven, with resulting serious consequences for routing the wires on the chip. The sinusoidal optimization step 10 of §15, the dispersion-driven levelizing system 9 of §16 are performed globally to levelize the density of cells using global levelization procedures. Steps 9 and 10 are iterated as a block 22. Typically, about 5 iterations has proven effective.

The sinusoidal optimization procedure 12 of §15 is applied to the chip surface subdivided into cell columns. The densities of cells in the columns are controlled to prohibit overflow and ensure that the cells are evenly assigned to the columns required by the structure of the final design. The sinusoidal optimization procedure is iterated as a block 23, generally, for a specified number of times, such as 5 times.

Subsection 1-16A: Efficient MultiProcesing of Cell Placement Algorithms

The above-discussed placement optimization techniques can be implemented using multiple processors to simultaneously place the cells on the integrated chip (IC) surface. In particular, the IC surface can be conceptually divided into a plurality of regions and the multiple processors assigned to several, non-adjacent regions to process the cells of the assigned regions simultaneously. Section 16A, along with FIGS. 39 to 41, discusses the multiple processor implementation of the placement methods.

Subsection 1-17: Cell Placement Crystallization.

After applying the overlap removal procedure to remove the overlap, most of the cells are close to their final positions. The crystallization step places the cells in correct, final positions. Proper vertical cell spacing are computed so that horizontal wires can be routed over and between cells in the vertical columns. Vertical and local-horizontal "swaps" may be performed if doing so improves the cost functions. Cells must be assigned proper geometric coordinates so that their positions correspond to legal grid positions specified by the underlying chip architecture. All of these steps 14, 15, 16, 17, 18 and 19 are performed by the crystallization procedures described in §17. These procedure "freeze" the cells into their final positions. Steps 14, 15 and 16 are iterated as a block 24, generally a specified number of times, such as 10 times. Steps 18 and 19 are also iterated as a block 25 a specified number of times. At this point, the placement process is completed, and a data structure is prepared that can be read by the routing system for chip routing and design completion.

Subsection 1-18: In General

Figure 2:
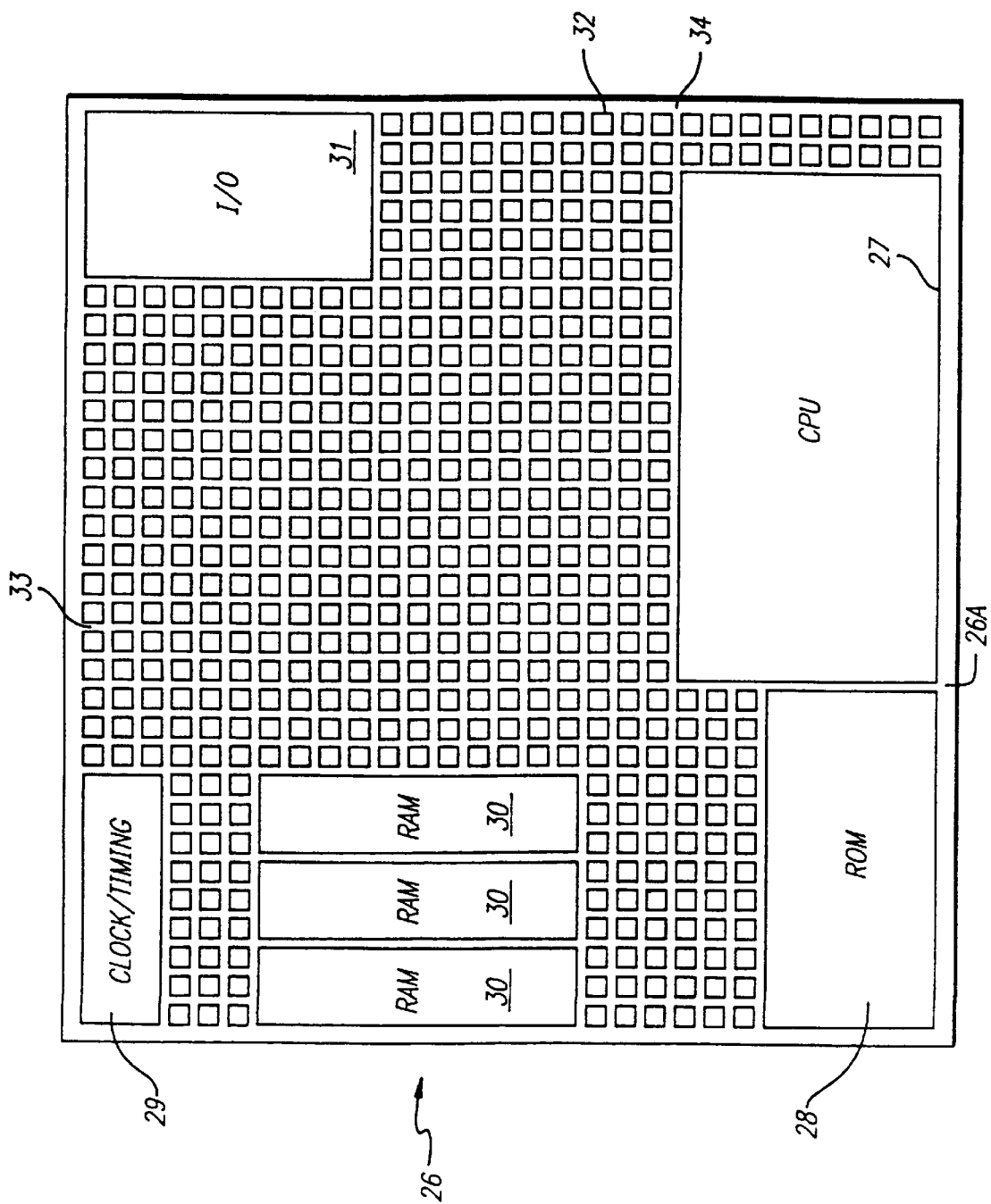
FIG. 2 is an illustration of an exemplary integrated circuit chip.

An exemplary integrated circuit chip is illustrated in FIG. 2 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

For a particular electrical circuit having predefined input and output terminals and interconnected in a predetermined way, the problem for the chip designer is in constructing a layout indicating the positions of the modules such that the area on the chip surface occupied by wires and the overall layout area are minimized.

The system shown in FIGS. 1A and 1B receives inputs for a user-specified integrated circuit design which includes a netlist. A connection between two or more interconnected elements of the circuit is known as a wiring net, or net. A netlist is a list of cells and nets.

Section 2: Neighborhood Construction

A hyperedge is a series of pins which are interconnected, i.e., wired together with an electrically common connection. For example, a hyperedge having pins A, B, and C means that pins A, B, and C are all connected together with a common metal wire. The "length" l(q) of a wiring net or hyperedge is equal to the number of pins (vertices) that are interconnected by the net minus one. This can be represented mathematically as $l(q)=|q|-1$, where q is the net and $|q|$ is the number of pins that are interconnected by the net q.

A particular cell, especially a large cell, can have two or more pins that are interconnected by one net q, and for this reason $|q|$ is the number of pins rather than the number of cells interconnected by a net q. However, for simplicity of description and illustration, the following examples will assume that each cell has only one pin connected to each net.

Figure 3:
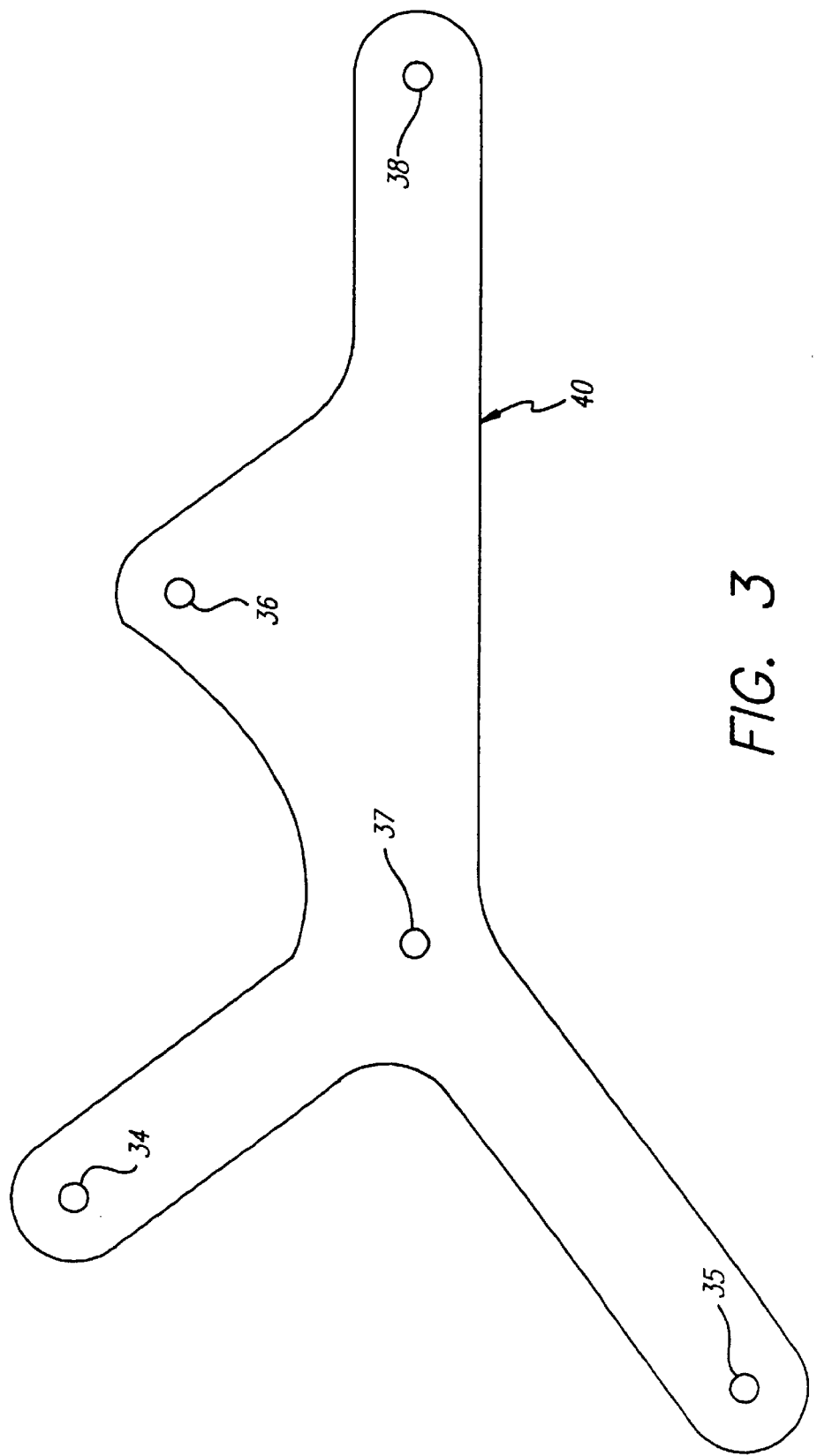
FIG. 3 is an illustration of a cell that has one pin connected to each net.

An example is illustrated in FIG. 3. A net q 40 is shown as interconnecting 5 cells 34, 35, 36, 37 and 38, that are collectively designated as w. The length of the net q is (5−1)=4. The cells w are illustrated as being spaced from each other and enclosed in an oblong shape which represents the net q. This is for illustrative purposes only, as it will be understood that the net q does not have any specific shape, and merely specifies that individual pins (not shown) of the cells w are to be interconnected. This arrangement is referred to as a hyperedge.

A distance $\rho(v_1,v_2)$ between two given vertices $v_1$ and $v_2$ is defined as the length of the shortest path between the vertices, where the length of a path is the sum of the lengths of the nets (hyperedges) that constitute the path.

Figure 4:
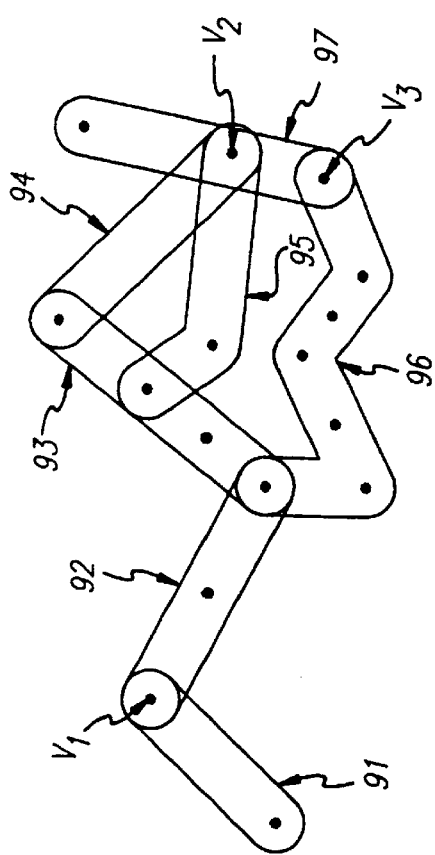
FIG. 4 illustrates seven nets, each of which interconnect a plurality of cells.

FIG. 4 illustrates seven nets $q_1$ to $q_7$, each of which interconnect a plurality of cells w. The distance between two given cells or vertices $v_1$ and $v_2$ is the length of the shortest path through the nets $q_1$ to $q_7$ that interconnects the cells.

The cell $v_1$ is common to the nets $q_1$ and $q_2$. However, there is no path from the cell $v_1$ to the cell $v_2$ through the net $q_1$.

There is a path from the cell vi to the cell $v_2$ through the nets $q_2$, $q_3$ and $q_4$, and another path through the nets $q_2$, $q_3$ and $q_5$. The lengths of the nets $q_2$, $q_3$, $q_4$ and $q_5$ are (3−1)=2, (4−1)=3, (2−1)=1, and (3−1)=2 respectively. The length of the path through the nets $q_2$, $q_3$ and $q_4$ is (2+3+1)=6, and the length of the path through the nets $q_2$, $q_3$ and $q_5$ is (2+3+2)=7. The path through the nets $q_2$, $q_3$ and $q_4$ has the shorter length, more specifically 6. If there is no other path (not shown) that is shorter, the distance between the cells $v_1$ and $v_2$ is defined as the length of this path.

FIG. 4 also illustrates how to measure a distance $\rho(v,q)$ between a cell v and a net q. This distance can be expressed mathematically as $\rho(v,q)=\min_{w \in q}\rho(v,w)$, and is the shortest path between the vertex v and any pin w in the net q.

Measurement of the distance between the cell $v_1$ and the net $q_7$ will be taken by way of example. There is a path from the cell v, to a cell $V_3$ in the net $q_7$. The length of this path is the sum of the lengths of the nets $q_2$ and $q_6$, which has a value of (2+6)=8. However, the path from the cell $v_1$ to the vertex $v_2$ through the nets $q_2$, $q_3$ and $q_4$ is the shorter path between the cell $v_1$ and any cell w in the net $q_7$, having a value of 6 as described above. If there is no other path (not shown) that is shorter, the distance between the vertex $v_1$ and the net $q_7$ is therefore defined to be 6.

In accordance with the present metric, a "range" $range_v(q)$ of a net q from a center cell v of a cluster or neighborhood (to be described in detail below) can be expressed mathematically as $range_v(q)=\rho(v,q)+l(q)$. In other words, the range is the distance from the center cell v to the net q plus the length of the net. The range of the net $q_7$ from the cell $v_1$, for example, is equal to the distance $\rho(v,q)$ from the cell $v_1$ to the net $q_7$, plus the length of the net $q_7$, or (6+2)=8.

One further definition is necessary for understanding the present invention. A "border" is a list of all nets that have ranges equal to the index of the border. For example, a border having an index of 7 ($border_7$) is a list of all nets having ranges of 7. This can be expressed mathematically as $border_v(j)$=all nets q such that $\rho(v,q) \leq r$ and $range_v(q)=j$, where j is the index of the border and r is a predetermined maximum distance from the center cell v (to be described in detail below) to the net q.

The borders can be considered as a series of concentric shells or quantum levels, with each border having an incrementally higher index and including nets having an incrementally higher range than the border with the next lower index.

Figure 5:
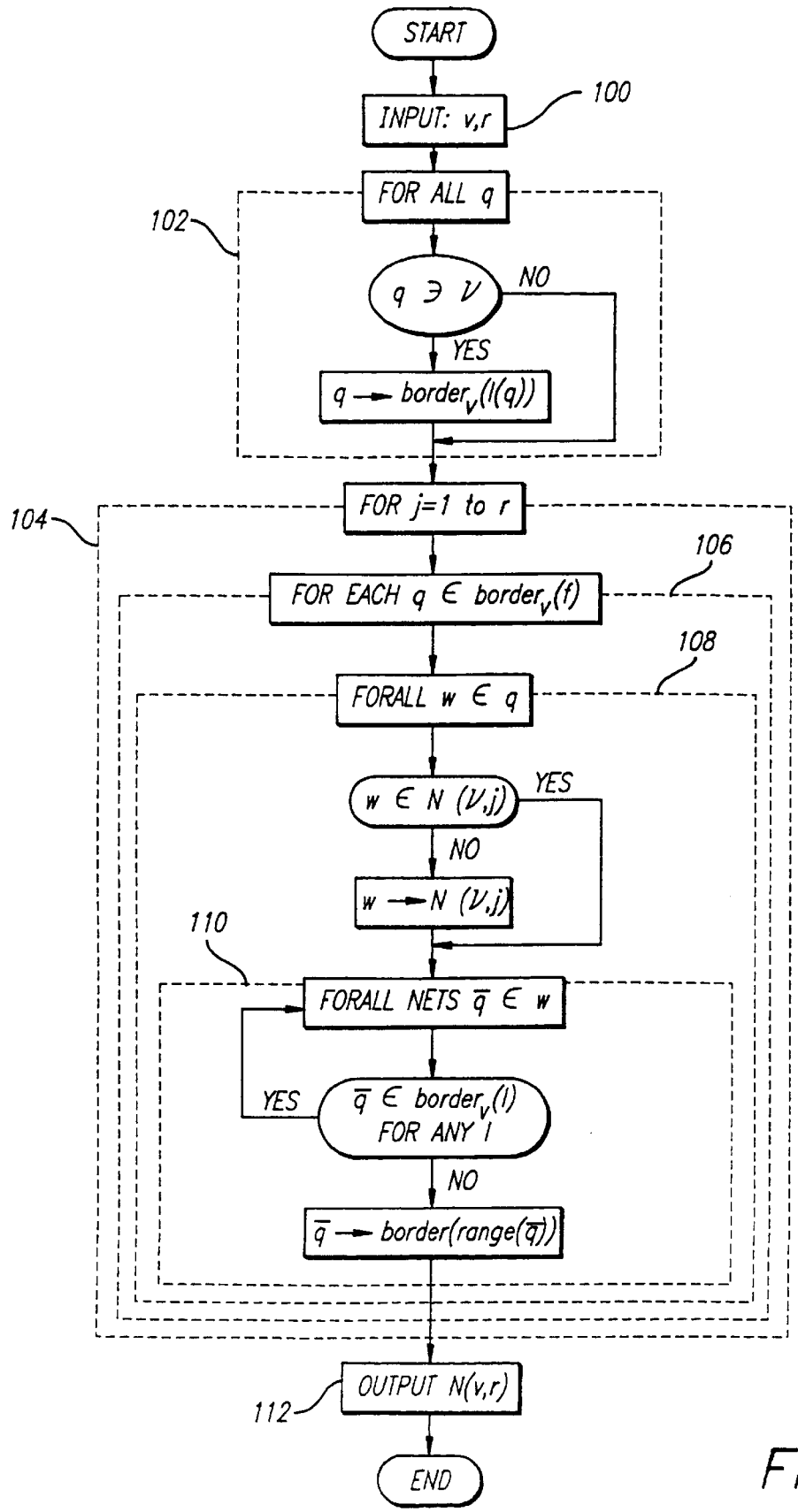
FIG. 5 is a flowchart illustrating the formation of a cell cluster or "neighborhood" in accordance with the present invention.

FIG. 5 is a flowchart illustrating the formation of a cell cluster or "neighborhood" N(v,M) in accordance with the present invention. The term "neighborhood" is illustrative of the fact that the clusters can be "fuzzy", with one cell being included in two or more clusters, and two or more clusters being allowed to overlap.

Initially, a target number M of cells are designated to be included in a neighborhood. A number of cells between 15 and 30 tends to work best, with the optimal number being about 20 cells in each neighborhood. The algorithm outlined below is executed until $C_1 * M$ cells are collected within various neighborhoods. $C_1$ is a predetermined parameter. The preferred value of $C_1$ is 2.

The first step is to specify a particular cell v to constitute the center of the cluster N, and a value for M as indicated in a step 100.

The flowchart of FIG. 5 includes a plurality of nested loops indicated by broken lines. This notation indicates that all of the steps included within each loop are to be performed for all outer loops.

A step 102 which follows the first step 100 of inputting values of v and M is to determine which nets include the center cell $v_c$, and assigning all these nets to corresponding borders.

The next step, designated as 104, is to examine all borders, starting with border,, in increasing order of index.

The next step 106 is to assign nets to borders in index order. A step 108 includes assigning all cells which are not in the neighborhood from the nets in the current border to the neighborhood. A step 110 includes assigning all nets which contain cells just included in the neighborhood, if these nets have not been previously assigned to any border, to corresponding borders. The cluster or neighborhood N(v,m) is output in a step 112.

Figure 6:
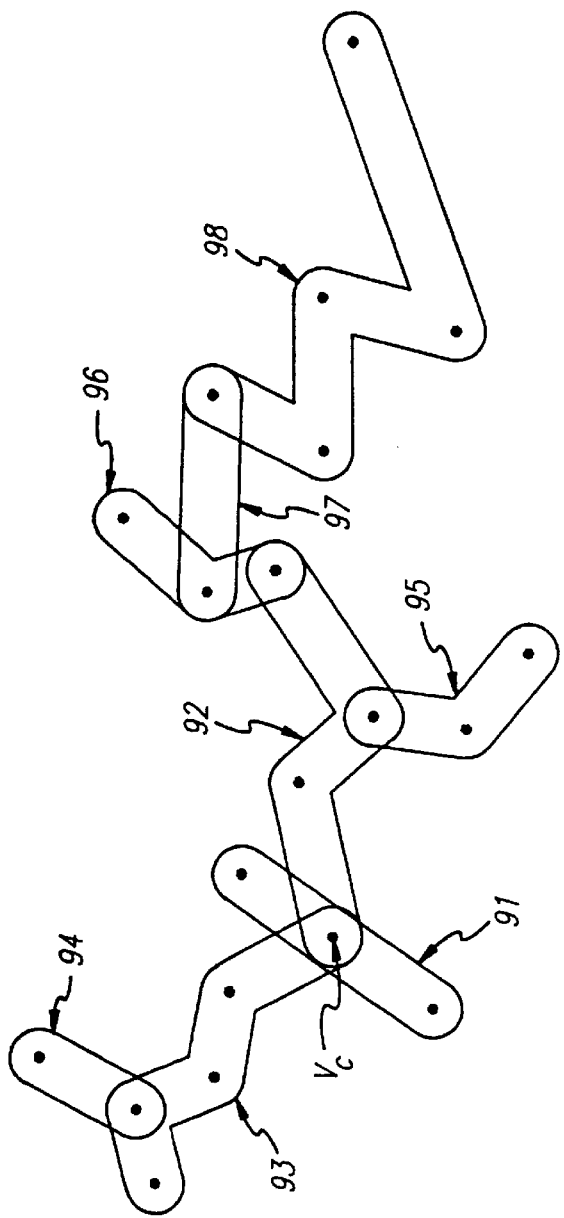
FIG. 6 is an illustration of a center cell and nets.

The method of FIG. 5 will be described further with reference being made to an example illustrated in FIG. 6. This example includes a center cell $v_c$ and nets $q_1$ to $q_8$.

Step 102 includes assigning all nets that include the center cell v to borders. The nets $q_1$, $q_2$ and $q_3$ all include the center cell v. Since the distances from the center cell $v_c$ to these nets is zero, the ranges of these nets are equal to their lengths.

The net q, has a length of (3−1)=2, and is assigned to $border_2$. The nets $q_2$ and $q_3$ have lengths 3 and 4, and are assigned to the borders $border_3$ and $border_4$ respectively.

In steps 104 and 106, the borders are examined in increasing order of index to determine if they include any nets. Border, does not include any nets. $Border_2$ includes the net $q_1$. Therefore, step 108 is performed, in which all cells w in the net $q_1$ are assigned to the cluster or neighborhood N(v,j).

In step 110, it is determined if there are any other nets connected to cells that were just assigned to the neighborhood. In this case, there are not, and the processing returns to step 104 to examine the next border.

The next border is $border_3$ which contains the net $q_2$. All of the cells w in the net ($q_2$ (except v) are assigned to the neighborhood. The method then performs step 110 to determine if any other nets q̃ include any of the cells w (just included in the neighborhood) of the net $q_2$. In the illustrated example, the nets $q_5$ and $q_6$ include cells which are also included in the net $q_2$, and are thereby connected to the net $q_2$. If these nets have not been assigned to borders, then they are now assigned to the borders having indices equal to their ranges respectively. The ranges of both nets $q_5$ and $q_6$ are 5, so these nets are assigned to $border_5$.

The steps 104 and 106 are then performed for the next border, more specifically $border_4$ which includes the net $q_3$. In step 108, all cells of the net $q_3$ are assigned to the cluster or neighborhood. Then, step 110 is performed to determine if any other nets q̃ include cells which are also included in the net $q_3$. In this case, the net $q_4$ is connected to the net $q_3$. The net $q_4$ has a range of 5, and is assigned to $border_5$.

The next border is $border_5$, which contains the nets $q_4$, $q_5$ and $q_6$. No other nets are connected to $q_4$ and $q_5$, but all of the cells of the nets $q_4$ and $q_5$ are assigned to the cluster. All of the cells of the net $q_6$ are also assigned to the cluster. The net $q_6$ is connected to the net $q_7$, and $q_7$ is added to $border_6$.

Examination of the next border, $border_6$, indicates it contains the net $q_7$. All cells of the net $q_7$ are assigned to the cluster, if they were not assigned previously. Since the net $q_8$ is connected to the net $q_7$, the net $q_8$ may also be added to the cluster. The net $q_8$ has a range of 11, and may be assigned to $border_{11}$.

In this manner, clusters or neighborhoods are grown one border at a time until a maximum size is reached. In addition, the borders are grown by "hitting" nets having corresponding ranges through net interconnections starting at the center cell v.

Section 3: Optimization of Cell Neighborhood System

In the foregoing process of constructing neighborhoods, a list of the nets processed is generated. That list of nets includes all nets incident to cells included in the neighborhood. Once the neighborhood is established, coordinates are assigned to each individual cell. For each cell v, the neighborhood of the cell is constructed and optimized using the cell as the center. A target number of cells $C_1*M$ for the neighborhood is also defined. For purposes of relatively large VLSI chips, testing and operation has shown that about a twenty cell neighborhood yields effective convergence results. Larger or smaller neighborhood sizes may also be employed while still within the scope of the invention. An alternative measure for the parameter M is the total height of all cells in the neighborhood, with height defined as the physical y-axis dimension of an individual cell. A maximum total cell height may alternately be used to define the neighborhood size.

Figure 7:
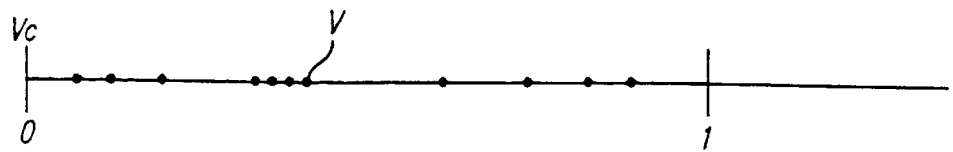
FIG. 7 shows that the cell v is assigned a coordinate between 0 and 1.

In accordance with the current invention, we assign coordinates to each cell and to each net in the neighborhood. We assign the center $V_c$ of the neighborhood the coordinate 0.0. We also assign the coordinates 1.0 to all cells not included in the neighborhood. Neighborhood cell assignment step assigns a cell v from the neighborhood coordinate values equal to $\rho(v_c, v)/R$, where $\rho(v_c, v)$ equals the length of the shortest path between the vertices $v_c$ and v, and R is the maximum radius value for the neighborhood. As seen in FIG. 7, v is necessarily not less than 0 and not greater than 1. We term the assigned coordinates "Z(v)" for each v.

Figure 8:
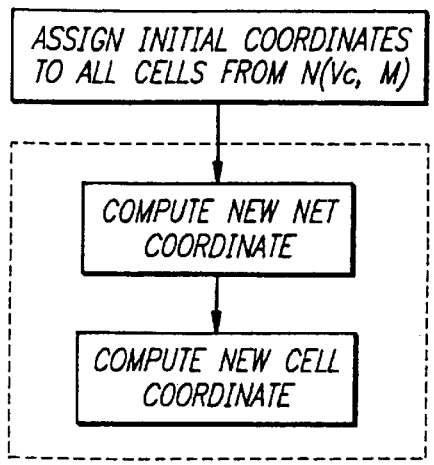
FIG. 8 is a flowchart illustrating the iteration of the recomputing of the net and cell coordinates.

As shown in FIG. 8, we then iterate recomputing of net and cell coordinates by iterating two procedures, as follow:

Procedure 1: The new net coordinates are computed such that for any net q within the set of nets Q, $$Z[q] = \frac{1}{|q|}\left(\sum_{v \in q} Z[v]\right)$$

where |q| is the number of pins of the net q. This equation sums the total of the current coordinates of the cell v and sums this for all cells in an individual net, then divides by the total number of pins on the net. The result of the summation and division is the coordinate of the net q.

Procedure 2: In new cell coordinate computation, for each cell v, the weight β[v] is represented by:

$$\beta[v] = \frac{1}{\sum \frac{1}{|q|}}$$

where for a net q, v is an element of q.
The new cell coordinate Z[v] is equal to:

$$\beta[v] * \sum \frac{1}{|q|} Z(q)$$

We apply the iteration procedure only on cells from the neighborhood except the center and only on nets that have at least one cell in the neighborhood. The iteration is generally accomplished for a pre-determined number of times, preferably 15 to 20 times.

Section 3A: Parallel Cell Placement with Minimal Conflicts

Figure 43:
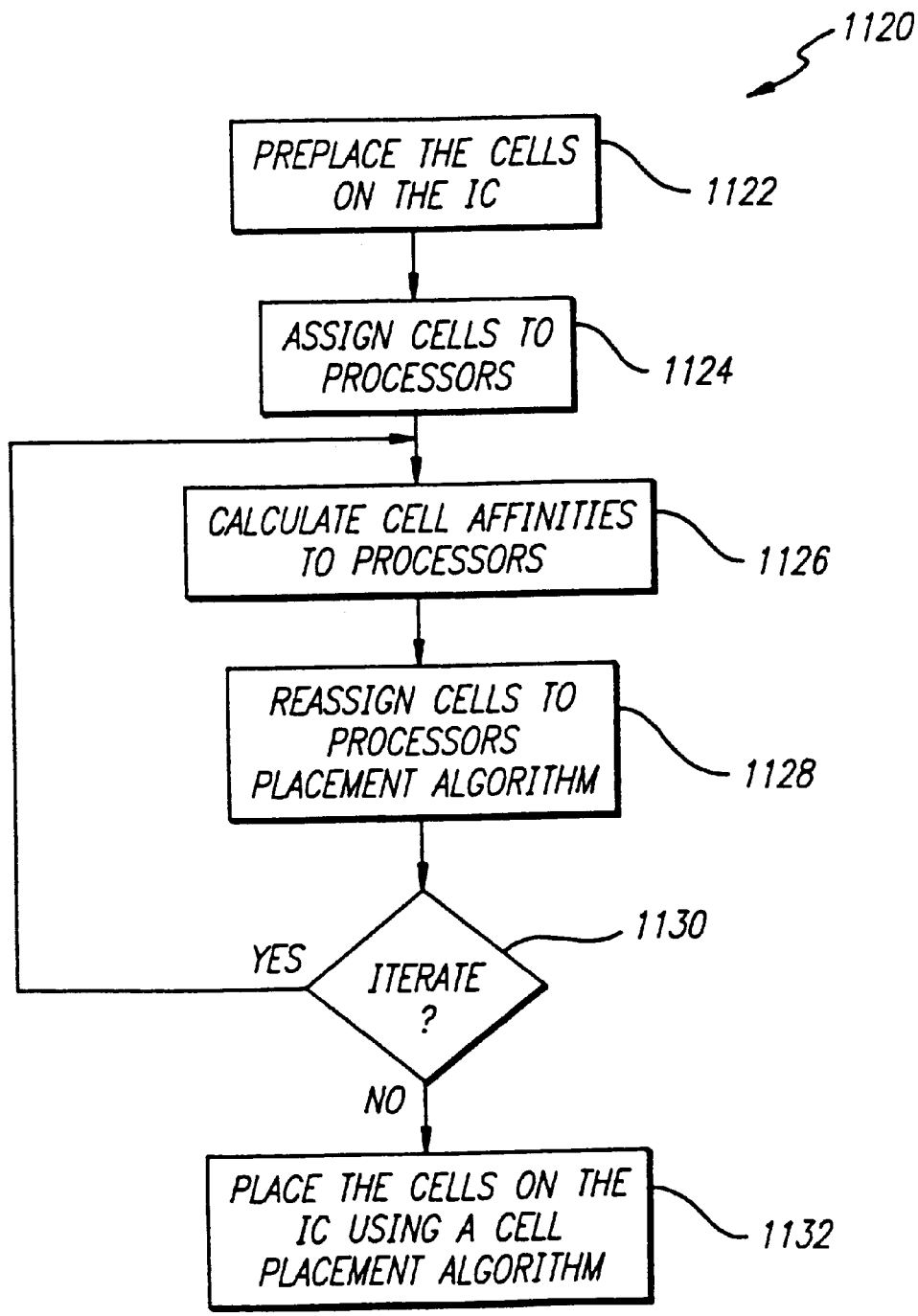
FIG. 43 is a flowchart illustrating the steps taken by the parallel processing technique of the present invention for simultaneous cell placement.

Referring now to FIG. 43, a flowchart 1120 illustrates the steps taken by the parallel processing technique of the present invention for simultaneous cell placement. As indicated by reference numeral 1122, the cells are preplaced onto the IC. However, unlike the preplacement 1112 of FIG. 42, the technique of the present invention does not necessitate a "good" preplacement. As discussed above, prior art techniques require "good" preplacement of the cells to minimize crossover nets and inter-processor communications overheads. In contrast, the preplacement step of the present invention is merely a step to provide a starting point for the cell placement algorithm being implemented.

As indicated by the reference numeral 1124, each of the cells of the IC are assigned to one of the multiple processors which will be used to place the cells onto the IC. The details of the method for assigning the cells to the processors are discussed in the Assigning Cells to Processors subsection below. Because the cells, not the regions, of the IC are assigned to the processors, and because the cells of the same net will generally be assigned to the same processor (as will be discussed below), the crossover net problems are minimized. Also, each of the multiple processors can be assigned to approximately the same number of cells or cells requiring movements, thereby balancing the work load among the processors. Starting from the initial assignment 1122, the number of conflicts are reduced by reassigning 1128 the cells to other processors while keeping the processors' loads balanced.

After the initial assignment of cells to the processors, the cells can be re-assigned between the processors 1126 to further reduce possible crossover net problems and to increase the efficiency of parallelization of the cell placement algorithm. This is done by calculating the affinities of the cells to each of the multiple processors, and reassigning the cells to different processors to increase the overall affinity of the system. The affinity of a cell to a processor can be defined as the degree of tendency of the cell to belong with the other cells of that processor. The details of the affinity calculation and the reassignment of the cells are discussed in the Affinity Calculation and Cell Reassignment subsection below.

As indicated by reference numeral 1128, the affinity calculation 1126 and the cell reassignments 1128 are iterated for a predetermined number of times or until a predetermined condition is met such as no further improvement or no further increase in the overall cell affinity.

To facilitate the discussion of the present invention, the following terms are used in this specification:

| | |
|---|---|
| NC | the number of cells of the integrated circuit; |
| NN | the number of nets; |
| NP | the number of processors; |
| $C_1, \ldots, C_{NC}$ | the cells; |
| $N_1, \ldots, N_{NN}$ | the nets; |
| $P_1, \ldots, P_{NP}$ | the available processors; and |
| time ($C_i$) | the runtime that the placement algorithm needs to make the decision about moving the cell $C_i$. |

The value of time($C_i$) for each of the cells can be obtained experimentally or by estimate based on the specific placement algorithm being implemented. Time($C_i$) usually depends on the number of nets to which the cell belongs, or the cell degrees. Then, the total time needed to perform all cell moves, or the total_load, can be expressed as $$total\_load = \sum_{i=1}^{NC} time(C_i)$$

Assigning Cells to Processors

As discussed above, the work load can be evenly distributed among the processors by assigning, to each of the processors, the average_load where the average_load is $$average\_load = \frac{total\_load}{NP}$$

Unlike the prior art techniques where the processors are assigned to regions of the IC, the present invention assigns the cells of the IC to each of the processors. For the initial assignment, the cells are divided into parts with the equal total times. More precisely, the following method is used. First, beginning with the first cell, $C_1$, we find a set, containing minimum number of cells, with a total time(C) which is greater than or equal to the average_load. This is accomplished by finding the minimal $i_1$ such that $$\sum_{i=1}^{i_1} time(C_i) \geq average\_load$$

and the found set of cells $\{C_1, \ldots, C_{i1}\}$ are assigned to the first processor $P_1$. Then, the process is repeated beginning with the cell $C_{i1+1}$. Then, we find the next set of cells $\{C_{i1+1}, \ldots, C_{i2}\}$ where $$\sum_{i=i_1+1}^{i_2} time(C_i) \geq average\_load$$

and assign the set to $P_2$, and so on until all the cells are assigned to a processor. At the end of the process, an even distribution of the work load is achieved because each of the processors $P_1$ to $P_{NP-1}$ are assigned to a set of cells with total work load equal to or slightly more than the average_load. The last processor, $P_{NP}$, is assigned to a set of cells with total work load equal to or slightly less than the average_load.

For each processor $P_k$, the work load of the processor can be defined as $$load(P_k) = \sum_{C_i \text{ is assigned to } P_k} time(C_i)$$

Affinity Calculation and Cell Reassignment

The reduction of crossover nets and inter-processor communications can be achieved by assigning the cells to processors to obtain the highest affinity value for the entire system. In this invention, the affinity of a cell to switch from the currently assigned processor to another processor consists of two parts. The first one is the reduction in number of conflicts and the second one controls the processors' load balance. Assuming that cell $C_i$ is currently assigned to processor $P_k$, its affinity to switch to processor $P_j$ is determined by:

$$affinity(C_i, P_j) = netlist\_affinity(C_i, P_j) + \lambda \cdot load\_affinity(C_i, P_j)$$

and we define cell_affinity ($C_i$) as the greatest of these affinities, or the greatest affinity of the cell $C_i$ to switch from its currently assigned processor $P_k$ to any of the other processor $P_j$, i.e., $$cell\_affinity(C_i) = \max_{1 \leq j \leq NP} affinity(C_i, P_j)$$

The netlist_affinity($C_i$, $P_j$) is the total reduction in number of crossover net conflicts if we reassign the cell $C_i$ from the current processor $P_k$ to the processor $P_j$. The reduction in the conflicts can be calculated as the difference between the number of conflicts the net, to which the cell belongs to, produces before and after the movement of the cell. Thus, the value of netlist_affinity($C_i$, $P_j$) depends upon the method used to calculate the number of conflicts caused by a net.

The best way to calculate the number of conflicts caused by net N, denoted as conflicts(N), is to maintain an array $(a_1, \ldots, a_{NP})$ for each net N where each $a_j$ represents the number of cells from net N currently assigned to processor Pj. Then, the conflicts(N) for any N is $$conflicts(N) = \sum_{1 \leq i \leq NP, i \neq j} a_i$$

Alternatively, conflicts(N) can be the number of different processors having cells from the net N minus 1.

Yet another method to determine conflicts(N) is to assign 1 if cells from N are assigned to more than one processor and 0 otherwise.

The load_affinity is the work load balancing factor and is determined by $$load\_affinity(C_i, P_j) = \frac{load(P_k) - load(P_j)}{average\_load}$$

A constant, λ, may be used as the weighing factor to shift the relative importance between the netlist_affinity and the load_affinity. A small constant value would reduce the relative effect of the load_affinity factor in the overall affinity calculation, thereby giving the netlist_affinity factor a relatively larger role in the determination of the affinity. In this case, the cells of the integrated circuit are more likely to be reassigned to processors based upon the reduction in the number of conflicts the reassignment will effect. On the other hand, a larger constant value would increase the relative effect of the load_affinity factor in the overall affinity calculation, thereby giving the load_affinity factor a relatively larger role in the determination of the affinity. Consequently, the cells of the integrated circuit are more likely to be reassigned to processors based upon work load balance among the processors.

Once the cell affinities are calculated as discussed above, the cells are reassigned 1128 among the processors to increase the overall affinity of the system. To avoid local minimum, we do not reassign all the cells with positive affinity, but only certain percentage p of them (usually, p=40). Then we find the number threshold such that p% of positive affinities are greater than threshold.

In all subsequent iterations 1130, we calculate affinities again and reassign cells with the affinity greater than threshold by moving the cell from the current processor to the one that cell has the maximal affinity to.

The number of iterations 1130 can fixed, or repeated until a predetermined condition is met such as no further improvements are possible.

Figure 44:
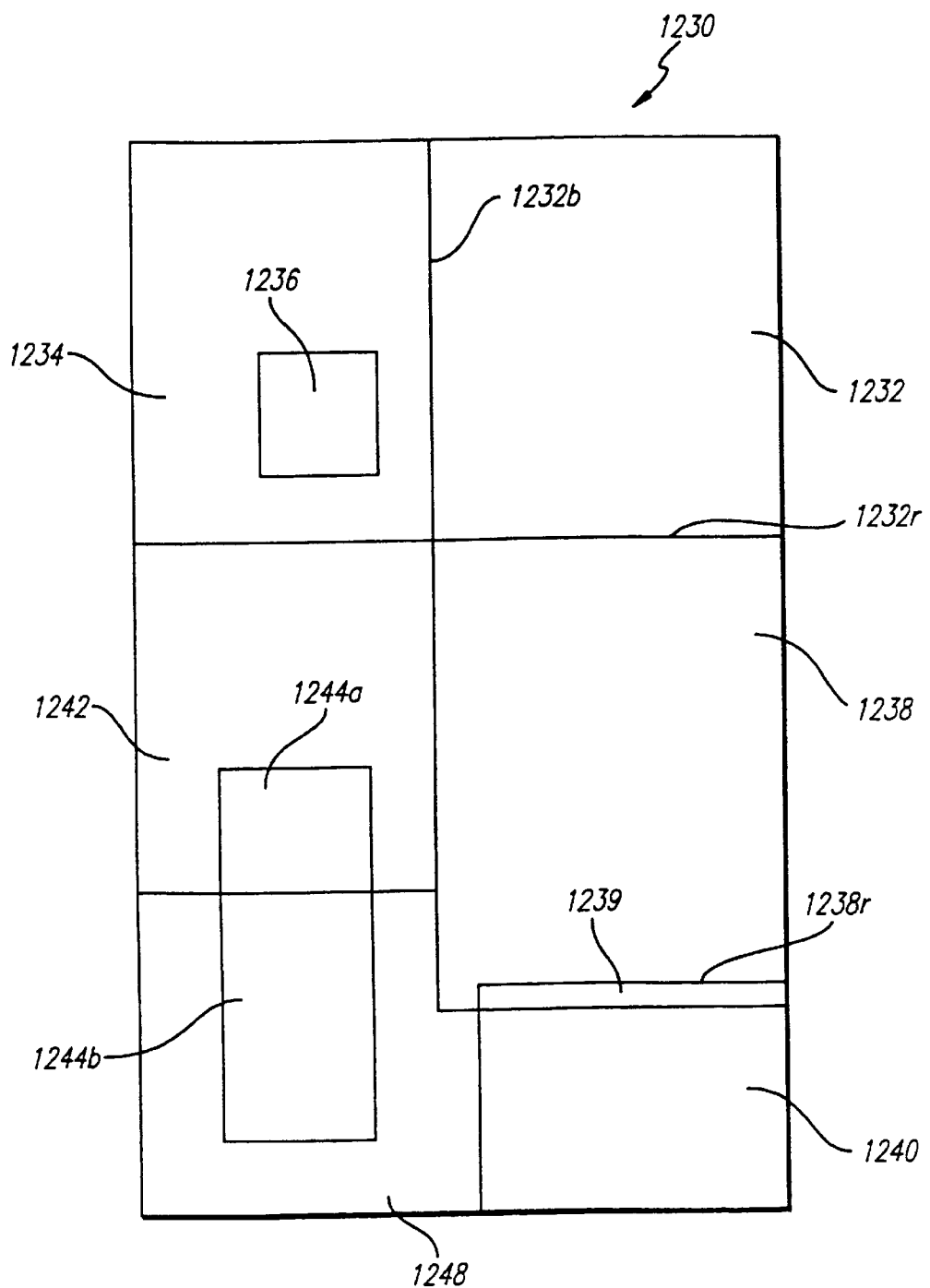
FIG. 44 illustrates an example of a possible assignment of core space area to various functions.

Referring now to FIG. 44, an apparatus 1140 for parallelizing cell placement with minimal number of conflicts is illustrated. The apparatus 1140 comprises a plurality of processors 1142 and memory 1146 for storing instructions for the processors 1142 as described above. The processors 1142 may be of any commercially produced RISC or CISC processors commonly made by a number of vendors, or custom made processors such as LSI Logic's CoreWare modules. The processors and the memory is connected 1152. Also connected to the processors 1142 and memory 1146 are an input device 1144 and an output device 1148 for retrieving the IC information, the cell list, and the preplacement information 1154 to the apparatus 1140 and for outputting the final cell placement information 1150.

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer harddrives, and other magnetic, optical, other machine readable media, whether alone or in combination with one or more of the algorithms and steps described herein.

Section 3B: Floor Plan Optimization

Step One: Assign Portions of the Core Space to the Functions.

Referring to FIG. 44, the first step of the cell placement optimization method is to assign portions of core space 1230 to the functions of the integrated circuit. For illustration, this specification will use an example of an integrated circuit design with eight (8) functions denoted as f1, f2, f3, f4, f5, f6, f7, and f8.

The assignment of the functions to the portions of core space 1230 is made in a manner designed to minimize some specific cost function. The cost function may require uniform space utilization over the entire floor. For example, a cost function may require that each function utilize 70% of its assigned area. Another cost function may require that each function meet a predetermined level of utilization of the floor assigned to the function. For instance, a cost function may require f1 to utilize 70% of its assigned area and f2 to utilized 80% of its assigned area. This second example cost function describes the general case for which the first example cost function is a special case. For the purposes of our discussion, the second, the more general cost function, will be further discussed and considered.

In our example, the eight functions are assigned to the portions of the core space 1230 as shown by Table 3B(1) below.

TABLE 3B(1)

| Function: | f1 | f2 | f3 | f4 | f5 | f6 | f7 | f8 |
|---|---|---|---|---|---|---|---|---|
| Reference Number of the Assigned Portion of the Core Space 30 as illustrated in FIG. 2 | 1232 | 1234 | 1236 | 1238 | 1239 | 1242 | 1244a | 1246 |
|  |  |  |  |  | 1239 | 1240 |  | 1244b |  |

Some portions border each other while other portions overlap. Core portion 1232, assigned to f1, borders core portions 1234 and 1238 assigned to functions f2 and f4 respectively. Portion 1238–1239 (combination of portions 1238 and 1239) is assigned to f4 and overlaps portion 1239–1240 (combination of portions 1239 and 1240) assigned to f5.

The border area and the overlap areas will be used by the method of the present invention to optimally place cells such that the capacity distribution and utilization requirements are met. As described below, the bordering and the overlapping areas are used to shift the capacities of the functions assigned to the bordering and overlapping portions of the core space to create additional capacity for placing the cells of the functions with a shortage of capacity. For example, suppose the capacity of the core portion 1238–1239 is 25,000 cell height units, but only 20,000 cell height units are required to implement f4. The excess 5,000 cell capacity of the portion 1238–1239 can be reassigned to f1, whose assigned core portion 1232 borders the portion 1238–1239, or to f5, whose assigned core portion 1239–1240 overlaps the portion 1238–1239.

When the excess capacity of portion 1238–1239 (assigned to function f4) is shifted, or reassigned, to portion 1232 (f1) is shifted to then the cells of function f1 can cross the order 32r to be placed within portion 1238–1239.

Likewise, f5 (portion 1239–1240) can be implemented to use the excess 5,000 cell height unit capacity of portion 1238–1239 (f4) by moving the cells of f4 out from, and moving the cells of f5 into, the overlap area 1239. The technique of using the common overlapping area to shift excess capacity from one portion assigned to a function to anther portion can be used, in addition to the border-encroachment method discussed in the previous paragraph, to control the capacity distribution and utilization.

Moreover, the capacity-shifting technique using the bordering and the overlapping regions, can be employed to shift excess capacity from one portion (function) of the integrated circuit to another portion of the integrated circuit even when the two portions do not share a border or an overlapping area. For example, if portion 1236 (assigned to f3) has a shortage of capacity, then the access capacity of portion 1238–1239 (f4) can be shifted to compensate for the shortage by first shifting the excess capacity of f4 to f1 (portion 1232), thereby creating access capacity for f1. Then, the access capacity of f1 can be shifted to f2 (portion 1234). Finally, the access capacity of f2 can be shifted to f3 (portion 1236) for the shortage.

The details of the implementation of the shifting technique will be discussed below.

Step Two: Define Regions.

Figure 45:
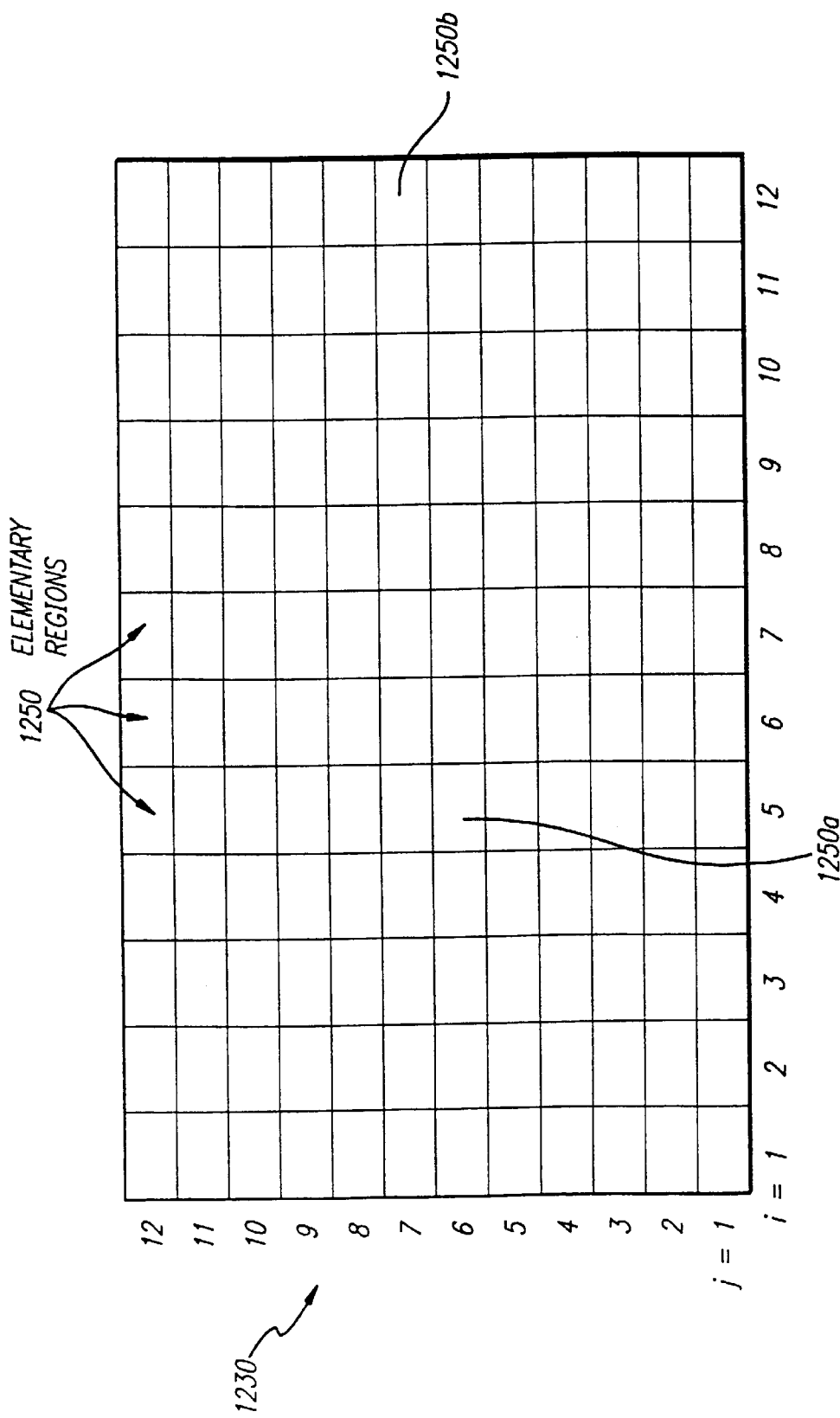
FIG. 45 illustrates a partitioning of core space according to one embodiment of the present invention.

Referring now to FIG. 45, once the functions of the integrated circuit are assigned specific portions (1231, 1234, 1236, 1238–1239, 1239–1240, 1242, 1244a, 1244b, and 1246) of the core space 1230, the core space is partitioned into a grid of elementary regions 1250. FIG. 45 shows the core space 1230 being partitioned into a grid of twelve rows by twelve columns containing 144 elementary regions 1250. For simplicity, only three elementary regions 1250 are referenced, and each of the elementary regions, or regions, will be referred to as $R_{i,j}$ where i is the column and j is the row on which the region $R_{i,j}$ is located. For instance, region 1250a is referred to as $R_{5,6}$ and region 1250b, $R_{12,7}$.

Figure 46:
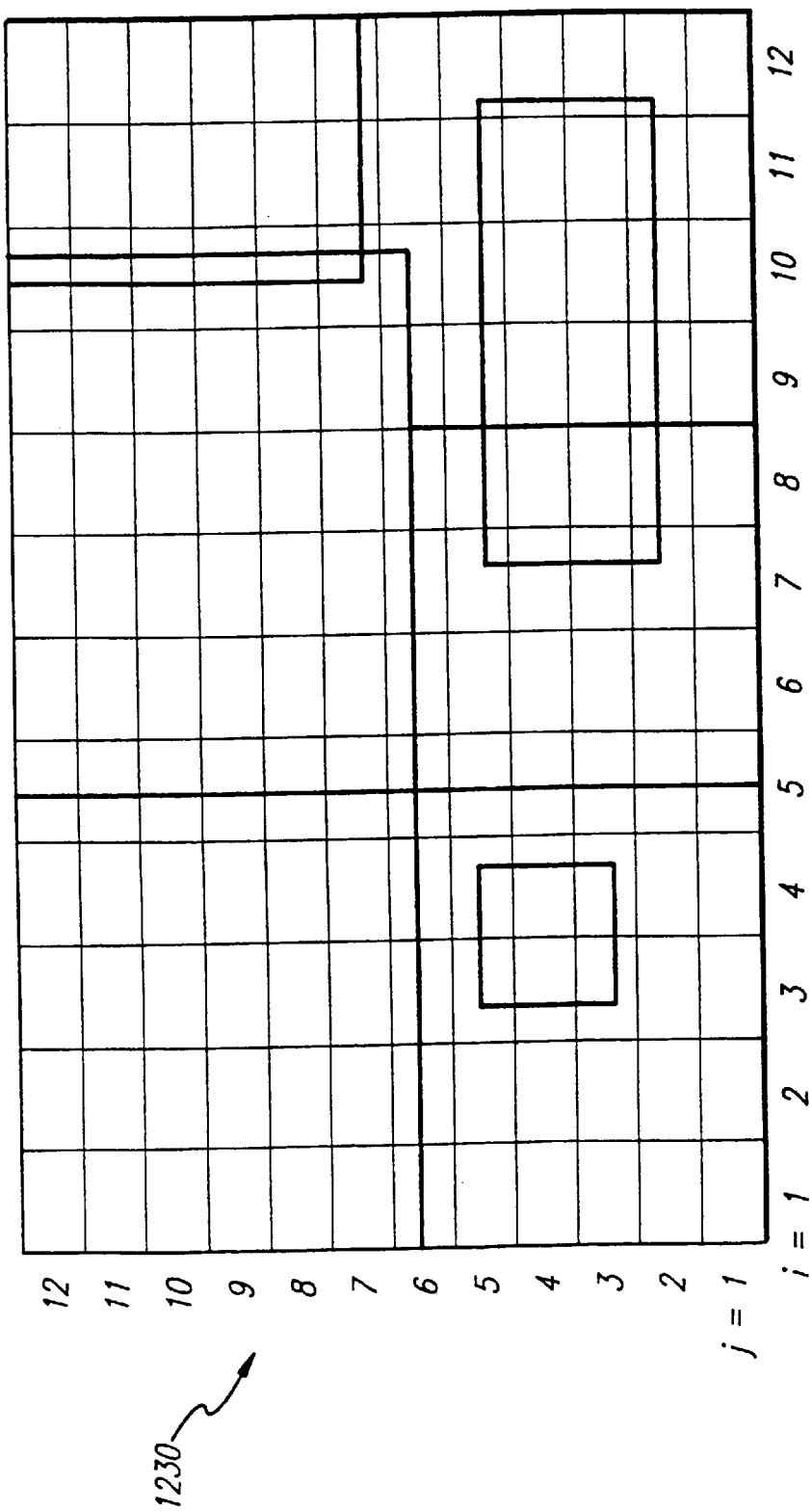
FIG. 46 illustrates the relationship between the partitioning grid and a function-area assignment layout.

Each region is assigned to each of the portions which takes space from the region. FIG. 46 shows the relationship between the regions and the portions of the core space. As the table illustrates, in contrast to the one-to-one relationship between functions and portions, there is a one-to-many relationship between portions and the regions.

Figure 47:
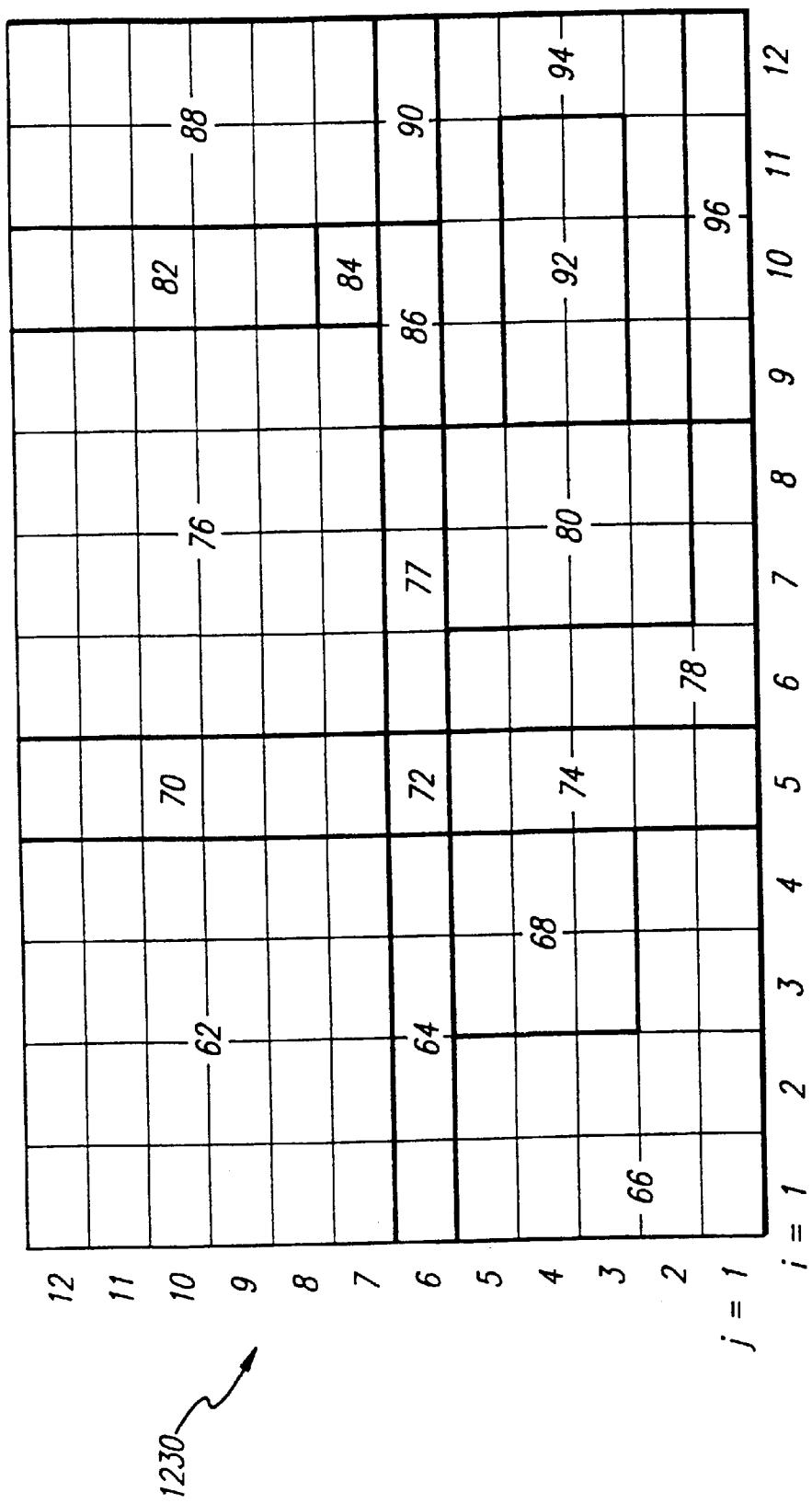
FIG. 47 illustrates the definition of pieces of the core space according to one embodiment of the present invention.

If a border between two or more portions lies within a region, then the region is assigned to all of the portions which have its border within the region. For instance, as illustrated by FIGS. 44, 46, and 47, and by Table 3B(2) below, $R_{5,6}$ is assigned to portions 32 (f1), 34 (f2), 38 (f4), and 42 (f6). Table 3B(2) below partially lists the functions of the integrated circuit, the portions assigned to the listed function, and the regions assigned to the listed portions.

TABLE 3B(2)

| Function | Assigned Portion | Assigned Elementary Regions |
|---|---|---|
| f1 | 1232 | $R_{1,12}, R_{2,12}, R_{3,12}, R_{4,12}, R_{5,12},$ $R_{1,11}, R_{2,11}, R_{3,11}, R_{4,11}, R_{5,11},$ $R_{1,10}, R_{2,10}, R_{3,10}, R_{4,10}, R_{5,10},$ $R_{1,9}, R_{2,9}, R_{3,9}, R_{4,9}, R_{5,9},$ $R_{1,8}, R_{2,8}, R_{3,8}, R_{4,8}, R_{5,8},$ $R_{1,7}, R_{2,7}, R_{3,7}, R_{4,7}, R_{5,7},$ $R_{1,6}, R_{2,6}, R_{3,6}, R_{4,6}, R_{5,6},$ |

TABLE 3B(2)-continued

| Function | Assigned Portion | Assigned Elementary Regions |
|---|---|---|
| f2 | 1234 | $R_{1,6}, R_{2,6}, R_{3,6}, R_{4,6}, R_{5,6},$ $R_{1,5}, R_{2,5}, R_{3,5}, R_{4,5}, R_{5,5},$ $R_{1,4}, R_{2,4}, R_{3,4}, R_{4,4}, R_{5,4},$ $R_{1,3}, R_{2,3}, R_{3,3}, R_{4,3}, R_{5,3},$ $R_{1,2}, R_{2,2}, R_{3,2}, R_{4,2}, R_{5,2},$ $R_{1,1}, R_{2,1}, R_{3,1}, R_{4,1}, R_{5,1}$ |
| ... | ... | |
| f8 | 1246 | $R_{10,6}, R_{11,6}, R_{12,6},$ $R_{9,5}, R_{10,5}, R_{11,5}, R_{12,5},$ $R_{12,4},$ $R_{12,3},$ $R_{9,2}, R_{10,2}, R_{11,2}, R_{12,2},$ $R_{9,1}, R_{10,1}, R_{11,1}, R_{12,1}$ |

Step Three: Define the Pieces.

Figure 48:
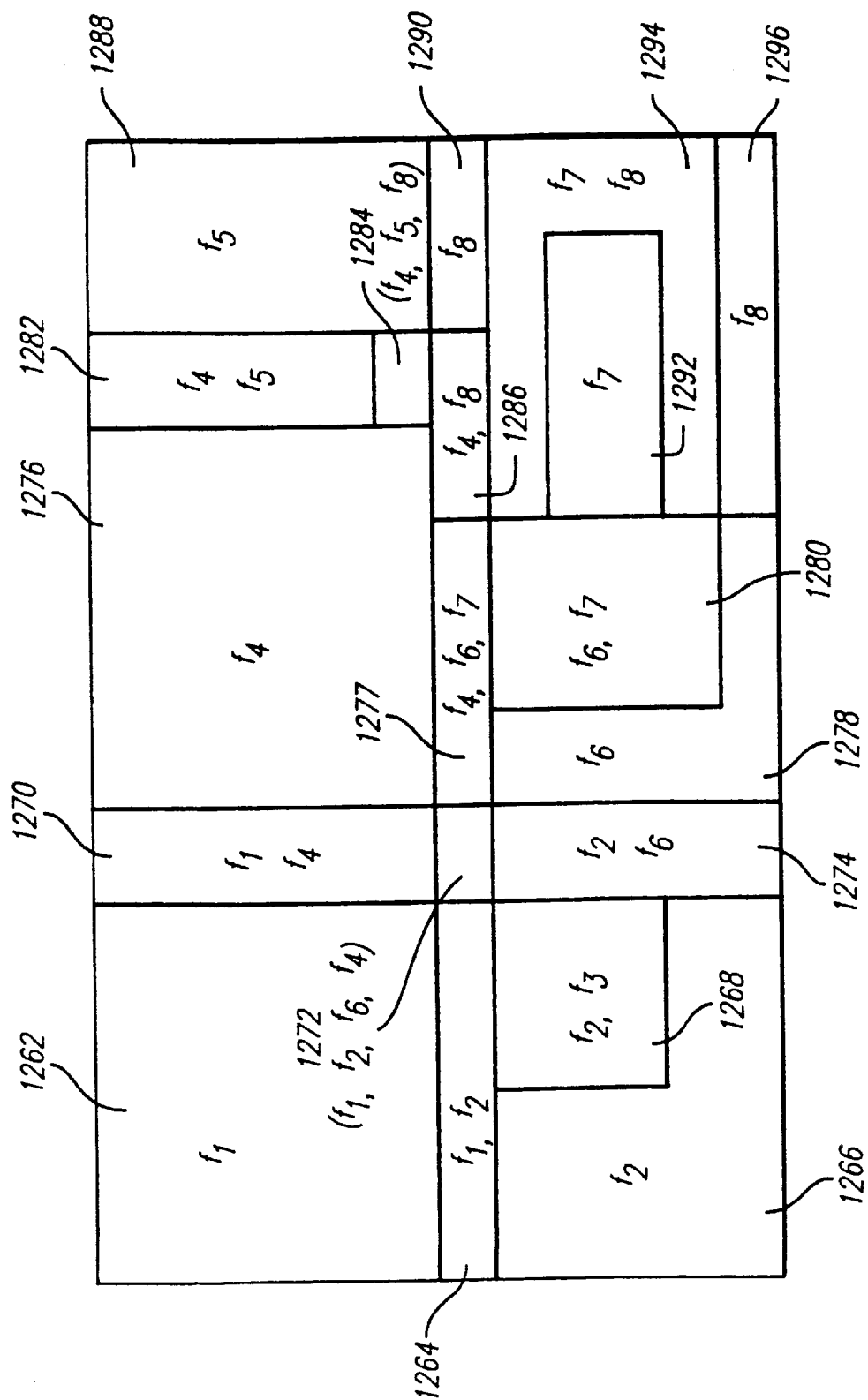
FIG. 48 illustrates the pieces of the core space according to one embodiment of the present invention.

Referring to FIGS. 47 and 48, after partitioning the core region 1230 into a grid of elementary regions 1250, the elementary regions 1250 are grouped into pieces, each piece being defined as a set of regions 1250 assigned to the same function or the same set of functions. Typically, a piece of the IC comprises a set of adjacent regions as illustrated by the figures of this specification; however, adjacency of the regions is not required to define a piece.

FIG. 47 illustrates the relationship between the pieces and the regions of the core space, and Table 3B(3) below partially lists the pieces of the core space and the regions comprising each of the listed pieces. FIG. 48 shows all of the pieces of the integrated circuit 1230 for the example illustrated by FIGS. 44–47. For clarity of discussion, the pieces are referred to Pnnnn where nnnn is the reference number of the piece as illustrated by FIG. 48.

TABLE 3B(3)

| Piece reference according to FIGS. 47 and 48 | Elementary Regions comprising the Piece |
|---|---|
| P1262 | $R_{1,12}, R_{2,12}, R_{3,12}, R_{4,12},$ $R_{1,11}, R_{2,11}, R_{3,11}, R_{4,11},$ $R_{1,10}, R_{2,10}, R_{3,10}, R_{4,10},$ $R_{1,9}, R_{2,9}, R_{3,9}, R_{4,9},$ $R_{1,8}, R_{2,8}, R_{3,8}, R_{4,8},$ $R_{1,7}, R_{2,7}, R_{3,7}, R_{4,7}$ |
| P1264 | $R_{1,6}, R_{2,6}, R_{3,6}, R_{4,6}$ |
| ... | ... |
| P1296 | $R_{9,1}, R_{10,1}, R_{11,1}, R_{12,1}$ |

For convenience, the following expressions are used:

| | |
|---|---|
| $\Im$ | set of all pieces of the core; |
| $\Im(f)$ | set of all pieces from which the portion of the core assigned to function $f$ may take some space. |

Referring to FIG. 48, in our example, $\Im=\{$P1262, P1264, P1266, P1268, P1270, P1272, P1274, P1276, P1277, P1278, P1280, P1282, P1284, P1286, P1288, P1290, P1292, P1294, P1296$\}$. Table 3B(4) below lists the $\Im(f)$ for some of the functions of the example integrated circuit.

TABLE 3B(4)

| Set | Members of the Set (FIG. 48 reference numbers to the pieces) |
|---|---|
| ℑ(f1) | P1262, P1264, P1270, P1272 |
| ℑ(f2) | P1264, P1266, P1268, P1272, P1274 |
| ... | ... |
| ℑ(f8) | P1286, P1290, P1294, P1296 |

As shown by FIGS. 47 and 48 and by Tables 3B(3) and 3B(4), piece 12P62 comprises all elementary regions belonging to f1 only. Piece 1264 comprises elementary regions each of which belongs to both f1 and f2. Note that a piece can comprise only a single elementary region. For instance, piece P1272 comprises only one elementary region $R_{5,6}$ which belong to functions f1, f2, f4, and f6.

Each of the pieces has a capacity, or a maximum number of cells which can be placed in the core space defined by the piece. If a piece is assigned to a single portion (assigned to a function) of the core space, then entire capacity of the piece is available to the portion (i.e., to accommodate the cells of the function assigned to that portion); however, a piece, such as P1270, can be assigned to two or more portions, each portion representing a function. In such a case, the capacity of the piece is divided and allocated to the functions to which the piece belongs. Therefore, the following notation is used to express the capacity of a piece assigned to a portion, which, in turn, is assigned to a function:

$X_{f,P}$=the capacity assigned to function f in piece P

For example, if piece P1264 has capacity for 4,000 cell height units, then $X_{f1,P64}$ may be 1,000 cell height units while $X_{f2,P1264}$ may be 3,000 cell height units.

Step Four: Define Capacity and Utilization Requirements

A cell placement is acceptable when the placement results in a predetermined level of utilization for each of the portions assigned to the functions of the circuit.

To place the cells with a built in factor to achieve the predetermined level of utilization, the cells are given fictive heights prior to being placed on the core space. The fictive height of a cell is the height of the cell used to calculate the space, or the number of cell height units, required to place the cell on the core space.

The actual height of a cell is usually measured in millimicrons. Because all of the standard cells have the same width, the cell height is usually used as the measure of capacity as well has the height of the cell.

For example, if a function's target utilization rate is fifty percent, then the cells of the function should be placed on the core space such that the cells actually use fifty percent of the space provided for the cells on the core space. That is, when the cells of the function are placed on the core space, the ratio between the actual amount of the capacity used by the cells divided by the amount of the capacity taken up by or reserved for the cells must be fifty percent. Alternatively expressed, the utilization ratio determines the density of the space taken up to place the cells of the function.

Therefore, if a function's target utilization rate is 50%, and the function is implemented by using two cells C1 and C2 with cell heights of four (4) and six (6) units, respectively, then the fictive heights of each of the cells is set to eight (8) and twelve (12), respectively. The result is that when the cells C1 and C2 are placed, they take up twenty (20) cell height units while actually using ten (10) cell height units, or the fifty percent of the space taken up. At this point, the following definition becomes useful:

hh(f)=the sum of all fictive heights of all cells of the function f.

For each piece of the core space, the following may be defined:

cap(P)=the capacity of the piece P.

Then, to meet the predetermined capacity distribution and utilization requirements, the following two expressions must be satisfied:

Expression (A): cap(P)=sum of all $X_{f,P}$ where P is a member of ℑ(f), for all P's of the circuit;

Expression (B): hh(f)≦sum of all $X_{f,P}$ where P is a member of ℑ(f), for all functions of the circuit.

Expression (A) states that, for each piece P, the capacity of the piece, cap(P), must equal to the sum of $X_{f,P}$ for all functions f to which P is a member. For example, referring to FIGS. 47 and 47, the capacity of P1264 (piece 1264), cap(1264), must equal the capacity of P1264 assigned to f1 and f2. Alternatively expressed, cap(1264)=$X_{f1,P1264}$+$X_{f2,P1264}$.

If cap(P) is less than the sum of all $X_{f,P}$ for any of the pieces, then the capacity of the P, cap(P), is over-allocated, and the placement of the core space is not possible. To remedy the situation, the capacities of the pieces must be reallocated to the functions. On the other hand, if cap(P) is greater than the sum of all $X_{f,P}$ for any of the pieces, then the capacity of P, cap(P), is under-allocated, meaning that some core space of the piece is not allocated to any of the functions.

If the capacity allocations, $X_{f,P}$, for all of the pieces of the core space meet Expression (A), then a feasible cell placement, or a solution, exists for a valid cell placement. If the capacity allocations, $X_{f,P}$, does not meet Expression (A) for any piece of the core space, then a feasible cell placement does not exist. In the latter case, a feasible solution does not exist because not meeting Expression (A) means that the sum of the capacities of the functions assigned to the piece exceeds the actual capacity of the piece itself.

Expression (B) states that, for each function, the sum of the fictive heights of all the cells of the function must be less than or equal to the sum of the capacities the function is assigned in each of the piece in which the function is assigned capacities. For example, referring to FIGS. 46 and 48, the sum of the fictive heights of all of the cells of f1 (assigned to portion 1232, which comprises P1262, P1264, P1270, and P1272) must be less than or equal to the sum of the capacities of f1 in P1262, P1264, P1270, and P1272. That is, hh(f1)≦$X_{f1,P1262}$+$X_{f1,P1264}$+$X_{f1,P1270}$+$X_{f1,P1272}$.

If the sum of all fictive heights of all the cells of the function is greater than the sum of all the capacities of the function in each of its pieces, then there is insufficient amount of the core pace to place the cells of the function.

In summary, if Expression (A) is not satisfied, then a solution is not feasible. In such a case, for a feasible placement solution, the functions must be reassigned to different portions of the core space, the pieces may be redefined, or the capacities of the pieces may be reallocated to the functions until Expression (A) is met. When Expression (A) is met, then a feasible cell placement exists, and Expression (B) is analyzed. If Expression (B) is met for a given cell placement, then the placement is a correct, and the processing stops. If Expression (B) is not met, then the following steps, Step Five, Step Six, and Step Seven, are followed to shift, or reallocate, the capacities of the pieces to meet Expression (B).

Step Five: Construct the Graph.

Figure 49:
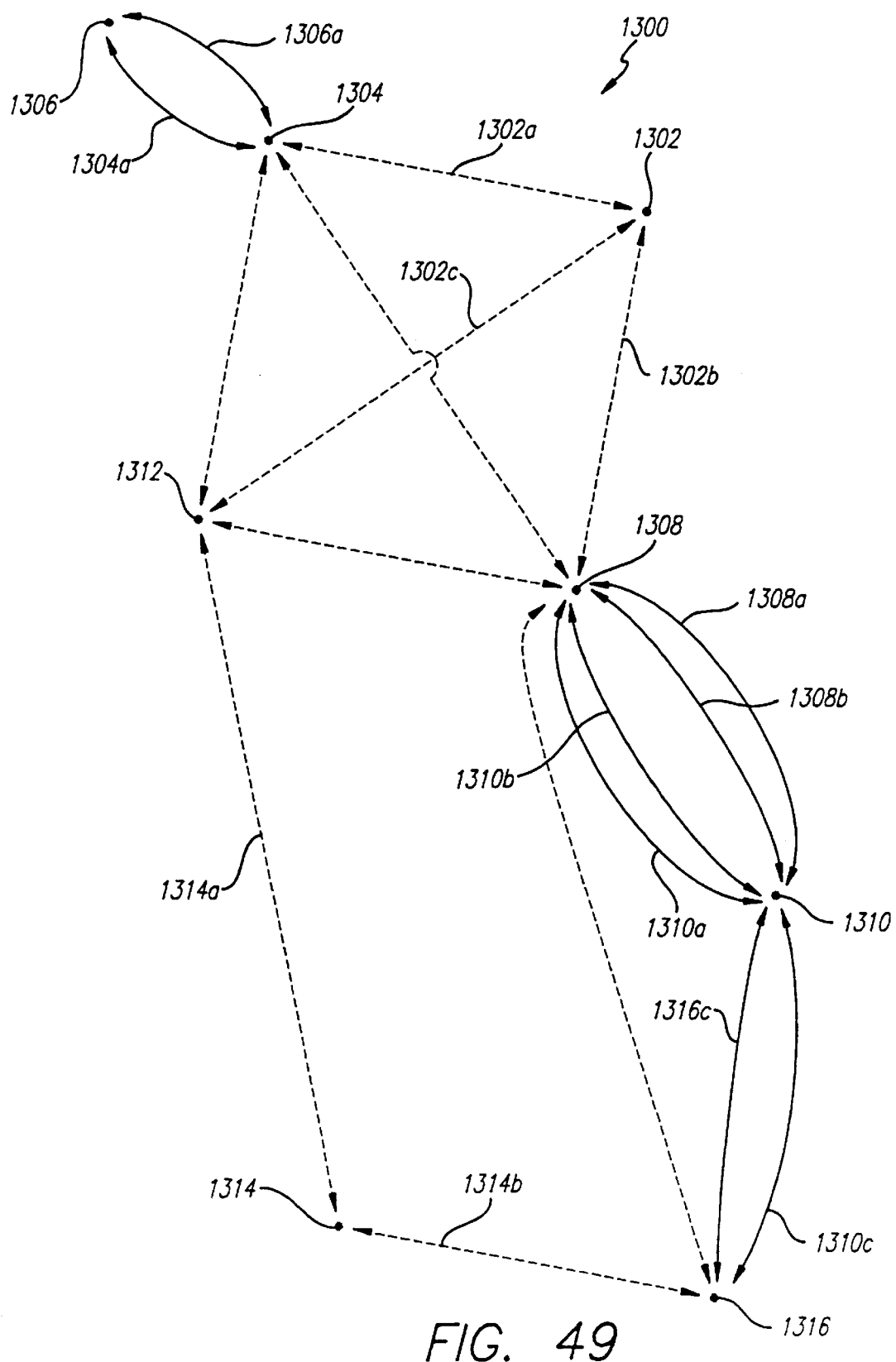
FIG. 49 illustrates a graph of the functions of the core space of FIGS. 2–6 according to one embodiment of the present invention.

Referring now to FIG. 49, a graph 1300 is constructed where each of the vertices of the graph corresponds to a function, and each of the edges connecting the vertices represents the pieces which contain borders or overlapping areas of the functions (vertices) which it connects.

In the instant example, the vertices (1302, 1304, 1306, 1308, 1310, 1312, 1314, and 1316) of the graph 1300 correspond to functions f1, f2, f3, f4, f5, f6, f7, and f8, respectively. Vertices are connected (by an edge) if the corresponding functions share at least one piece of the core. Continuing to refer to FIG. 49, for simplicity, each of the dashed lines of the figure indicates multiple edges connecting the vertices while each of the solid lines indicates a single connection between the vertices.

Continuing to refer to FIG. 49, dashed-line edges 1302a, 1302b, and 1302c indicate that f1 (represented by vertex 1302) shares at least one piece with each of the functions f2 (vertex 1304), f4 (vertex 1308), and f6 (vertex 1312), respectively. Likewise, the dashed-line edges 1314a and 1314b indicate that f7 (represented by vertex 1314) shares at least one piece of the core with functions f6 (vertex 1312) and f8 (vertex 1316), respectively.

The solid-line edges 1304a and 1306a show that functions f2 (vertex 1304) and f3 (vertex 1306) share piece P1268 (see FIGS. 47 and 48) of the core. Two different edges are used to indicate sharing of one piece of the core between two functions (vertices). The first edge represents the capacity of the shared piece assigned to the first vertex (function), which is potentially available to the second vertex (function). The second edge represents the capacity of the shared piece assigned to the second vertex (function), which is potentially available to the first vertex (function).

For example, edge 1304a, represents $X_{f2,P1268}$ (the capacity of P1268 assigned to f2). The same capacity, $X_{f2,P12689}$ is also the maximum amount of capacity f2 may given up within P1268 if f2 is found to have excess capacity. The direction of the arrow of edge 1304a indicates the direction in which the capacity may be reallocated, or shifted.

Edge 1304a is denoted as X(f3, f2,P1268), and has the value $X_{f2,P1268}$. Likewise, the edge 1306a, denoted W(f2, f3,P1268), has the value $X_{f3,P1268}$, and represents the capacity of piece 1268 assigned to f3 (vertex 1306), which is potentially available to f2 (vertex 1304).

Referring primarily to FIG. 49 but also referring to FIGS. 47 and 48, vertices 1308 and 1310 (representing f4 and f5, respectively) have two pairs of edges (1308a, 1310a and 1308b, 1310b) connecting them because f4 and f5 share two different pieces, P1282 and P1284. In this case, the value of the edges are:

edge 1308a, denoted W(f5,f4,P1282),has the value $X_{f4, P1282}$;

edge 1310a, denoted W(f4,f5,P1282), has the value $X_{f5, P1282}$;

edge 1308b, denoted W(f5,f4,P1284), has the value $X_{f4, P1284}$; and edge 1310b, denoted W(f4,f5,P1284), has the value $X_{f5, P1284}$.

Step Six: Identify the Functions with Capacity Shortages and the Functions with Excess Capacity.

After building the graph 1300, each of the vertices (functions) are analyzed and grouped into two sets of vertices V1 and V2. All functions (vertices) with deficiencies of capacity are assigned to group V1. All functions with a shortage of the core space satisfy the expression:

hh(f)>the sum of the capacities of all pieces which contribute core space to the function (i.e.,the sum of all $X_{f,P}$ for all P belonging to $\Im(f)$).

In other words, V1 contains all vertices (functions) which do not have sufficient core space to place all of their cells.

The functions (vertices) with excess core space are assigned to V2. All functions with excess core space satisfy the expression:

hh(f)<sum of the capacities of all pieces which contribute core space to the function (i.e., the sum of all $X_{f,P}$ for all P belonging to $\Im(f)$).

In other words, V2 contains all vertices (functions) which have more than the core space needed to place their cells.

Step Seven: Shifting Excess Capacities to Meet Deficiencies.

For each of the vertices of V1, the graph 1300 is traversed until a vertex belonging to V2 is encountered. The traversal is in the opposite direction of the arrows of the FIGS. 49 and 50 because the direction of the arrow indicates the direction in which the excess capacities can be shifted.

During the traversal, a chain of the vertices and the edges traversed is maintained. The chain begins with a first vertex (function, $f_{first}$) in V1 and ends in a second vertex (function, $f_{second}$) in V2.

The maximum capacity that can be shifted from $f_{second}$ to $f_{first}$, a, is the smallest of the following three values:
1. the amount of the shortage of $f_{first}$, i.e. $hh(f_{first})-(\text{sum of the capacities of all P where P is a member of } \Im(f_{first}))$;
2. the amount of excess capacity of $f_{second}$, ie. (sum of capacities of all P where P is a member of $\Im(f_{second})$)-$hh(f_{second})$;
3. the smallest maximum-capacity of any of the edges of the chain. The capacity of each of the edges is expressed as W(f1,f2,P).

After building the chain through which excess capacity of a piece can be shifted, the capacities of the each pieces of the chain, is updated as to shift the amount of capacity, represented by a, from the second vertex ($f_{second}$) to the first ($f_{first}$) vertex by updating the edge values of each of the edges of the chain.

Figure 50:
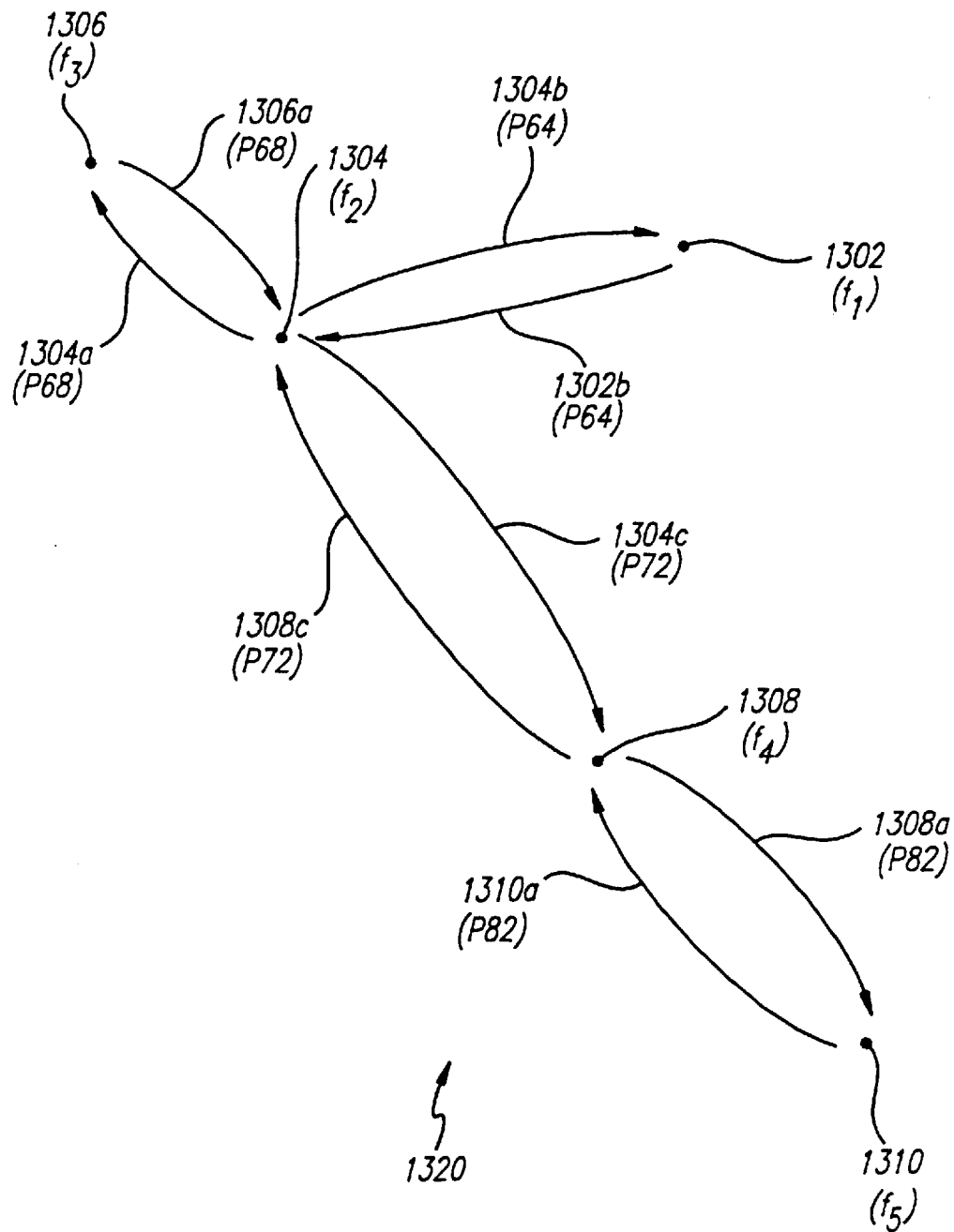
FIG. 50 illustrates a graph of the functions of the core space of FIGS. 2–6 showing capacity shifting in accordance with the present invention.

The process can best be illustrated using an example shown by FIG. 50. Referring primarily to FIG. 50, but also to FIGS. 44–48, the following facts are assumed for this illustration:

A. The vertices have the following properties:
1. vertex 1306 (representing f3 and belonging to set V1) is deficient by 500 cell height units. Alternatively expressed, hh(f3)>$X_{f3,P1268}$ and hh(f3)-$X_{f3,P1268}$=500 cell height units;
2. vertex 1302 (f1, set V2) has 300 excess capacity;
3. vertex 1310 (f5, V2) has 1200 excess capacity;
4. vertices 1304 (f2) and 108 (f4) have no deficiencies or excess capacities.

B. The edges have the following properties:
1. 1304a=W(f3,f2,P1268)=$X_{f2,P1268}$=800 cell height units;
2. 1302b=W(f2,f1,P1264)=$X_{f1,P1264}$=400 cell height units;
3. 1308c=W(f2,f4,P1272)=$X_{f4,P1272}$=200 cell height units;
4. 1310a=W(f4,f5,P1282)=$X_{f5,P1282}$=300 cell height units.

Given the graph 1320 of FIG. 50 with above-listed facts, the 500 cell height unit deficiency of f3 can be remedied by shifting the capacities along the following two chains of the graph 1320.

Chain 1:

Continuing to refer to FIG. 50 but also referring to FIGS. 44–48, the 300 excess capacity of f1 (vertex 1302) can be shifted to f3 (vertex 1306) via piece 1264 (edge 1302b), f2 (vertex 1304), and piece 1268 (edge 1304a).

The chain can be denoted 1302 → 1302b → 1304 → 1304a → 1306. The maximum capacity of the chain, α, is the minimum of the following three numbers:

(1) 500, the deficiency of f3;

(2) 300, the amount of excess capacity of f1; and (3) 400, the lowest maximum edge capacity of all of the edges of the chain, which, in this case, is from the edge 1302b.

Therefore, the α of Chain 1 is 300.

The actual shifting of 300 cell height units from f1 (vertex 102) to f3 (vertex 1306) is accomplished as follows:

(1) reallocating Xf1,P1264 to be 300 units less than its previous value, thereby freeing space for cells of f2 in piece P1264;

(2) reallocating Xf2,P1264 to be 300 units more than its previous value, thereby taking the freed space, and creating an excess capacity of 300 units in f2;

(3) reallocating Xf2,P1268 to be 300 units less than its previous value, thereby freeing space for cells of f3 in piece P1268; and (4) reallocating Xf1,P1268 to be 300 units more than its previous value, thereby adding space for cells of f3 in piece P1268, alleviating the shortage by 300 cell height units.

After the above-listed operations to shift 300 cell height units from f1 to f3, the shortage of capacity for f3 is reduced to 200 height units.

Chain 2:

The 200 units of 1200 excess capacity of function f5 can be shifted to f3 in a similar operation using Chain 2 which can be denoted 1310 → 1310a → 1308 → 1308c → 1304 → 1304a → 1306. The maximum capacity, α, of Chain 2 is 200, the lowest maximum edge capacity of all of the edges of the chain, which, in this case, is from edge 1308c.

The above described process is repeated for each of the vertices (functions) of the set V1 until no vertices remain in the set. Set V1 cannot be emptied if at least one vertex (function) of the set does not have sufficient core space to place all of its cells. In that case the placement is not possible under the given parameters.

Also, a vertex (function) cannot be reached to claim its excess core space when the total space assigned to the functions in the neighborhood is less than the minimal required to place the cells of the respective functions. To overcome this problem, the process disclosed by this document can be rerun after making one or more of the following changes:

1. the utilization of some or all of the neighboring functions can be increased;

2. the physical area assigned to the neighboring functions can be increased; or 3. elementary region grid can be modified to create shared core space pieces encompassing the function and its neighboring functions.

Section 4: Iterative One Dimensional Preplacement Optimization

A one dimensional iterative optimization initially provides a fast, good cell coordinate placement. The one dimensional iterative optimization is performed in both the x and y directions. As may be appreciated by one of ordinary skill in the art, the iterative optimization may be performed in the y direction initially, but the preferred method is to perform it in the x direction. In the x direction, a netlist or hypergraph H includes the set V of cells v and the set Q of nets q. In addition, it should be noted that where "x" or "X" is used below for calculation in the x-direction, when calculating in the y-direction, "y" or "Y" would be used. As used herein, "z" and "Z" are universal notations representing either "x" and "X", on the one hand, or "y" and "Y" on the other, depending on which direction is being considered.

Figure 9:
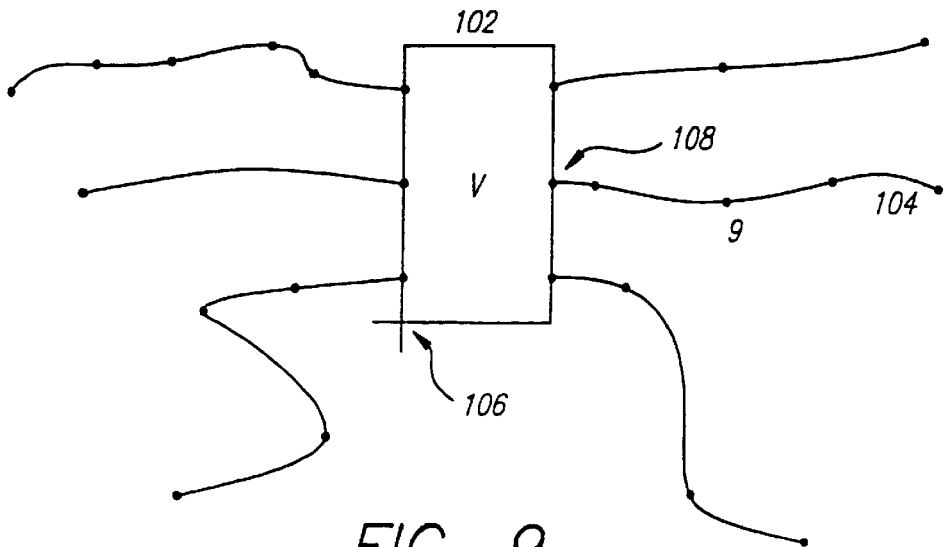
FIG. 9 illustrates a cell having several pins which belong to the net.

FIG. 9 illustrates a cell v 102 having several pins which belong to the net q 104. For purposes of pin offset definition for cell shifting and exact positioning purposes, the origin 106 of the cell defines the default "position" of the cell. If a net q 104 is being evaluated by the system, then the pin 108 on the cell v 102 which is on the net q 104 is positionally defined relative to the origin 106. Any point may be defined as the origin of the cell, including its center of mass, but the preferred embodiment is to define the origin at the physical lower left corner of the cell as shown in FIG. 9.

Figure 10:
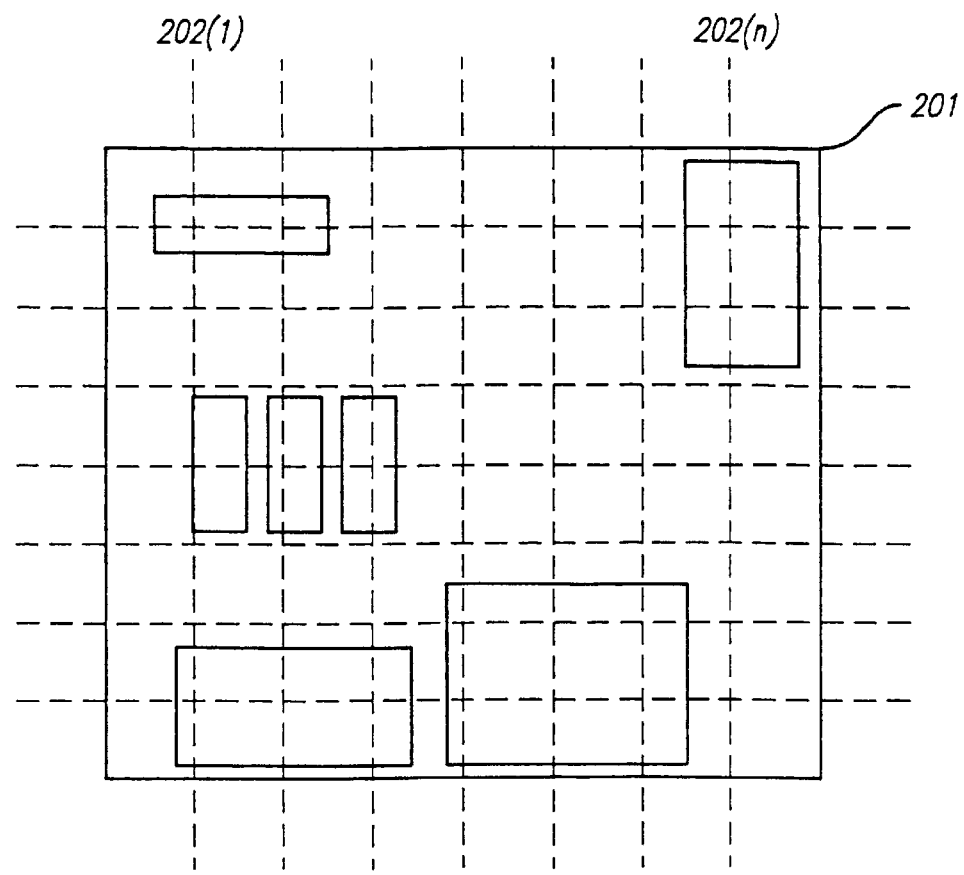
FIG. 10 is an illustration of a core divided into subregions.

As shown in FIG. 10, the core 201 is divided into subregions R. Initially, the preferred value of R is one, indicating the core is not subdivided. The subdivision of the core is represented by an array X[i] of x-coordinates of vertical dividing lines 202(1) through 202(n) and an array Y[j] of y-coordinates of horizontal dividing lines. For each interval X[i] and X[i+1], a dividing point is calculated to determine finer resolution. Each cell v belongs to some of these intervals, and the interval function I[v] is equal to i if the cell v belongs to the interval X[i], X[i+1]. The current coordinates of the cell v are denoted as Z[v], while the coordinates of the net q are denoted by Z[q].

Figure 11:
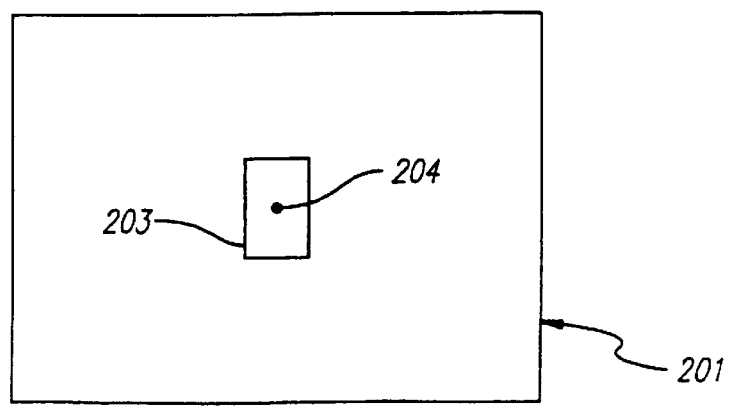
FIG. 11 is an illustration of a moveable cell within the core region.

In initial placement optimization initialization step 250, each movable cell coordinate is assigned a coordinate of a dividing point of the interval the cell occupies. Thus Z[v] =DX[I[v]]. DX is typically the midpoint of the interval, but the dividing point may be at a different location in each interval while still within the scope of the current invention. As shown in FIG. 11, for each moveable cell within the core region 201, the movable cell coordinate 203 is located at the dividing point 204 of the interval, which is a point at a percentage of the width or length of the core region 201. The preferred implementation is locating the dividing point 204 at the center point of the surface abstraction of the core region. Fixed cells are assigned their real coordinates.

Figure 12:
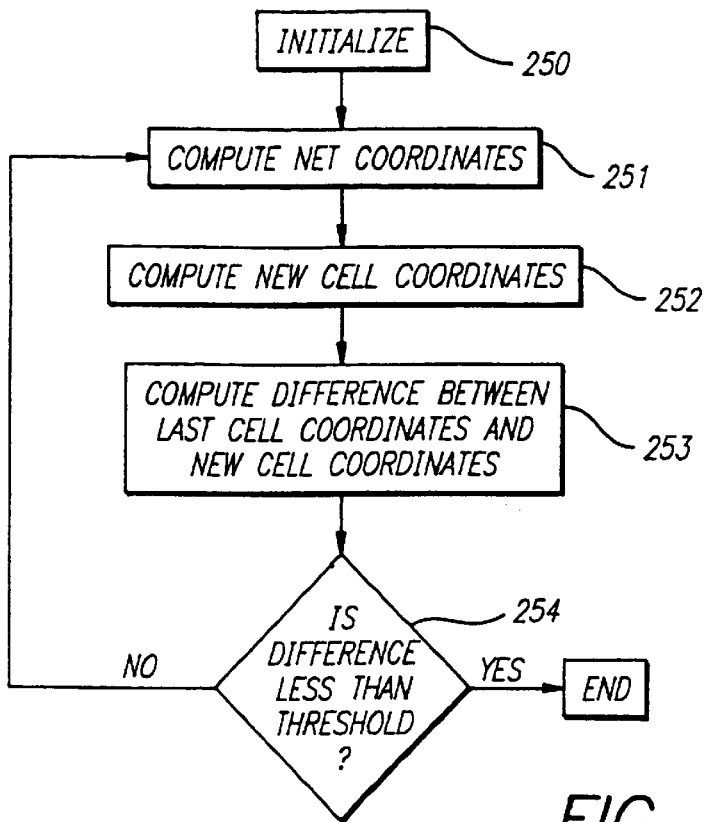
FIG. 12 is a flowchart that demonstrates the procedure for obtaining an initial one dimensional placement of the movable cells.

The flowchart of FIG. 12 demonstrates the procedure for obtaining an initial one dimensional placement of the movable cells. The movable cells are assigned the coordinate of the center of the region where they are located in initialization step 250. In net coordinate computation step 251, new net coordinates are computed. These new net coordinates are computed such that for any net q within the set of nets Q, $$Z[q] = \frac{1}{|q|}\left(\sum_{v \in q}((Z[v] + z(v, q)))\right)$$

where |q| is the number of pins of the net q. This equation sums the total of the current coordinates of the cell v and the z-offset (x or y depending on the direction) of the pin on the cell which belongs to the net q, and sums this for all cells in an individual net, then divides by the total number of pins on the net. The result of the summation and division is the coordinate of the net q.

In new cell coordinate computation step 252, for each cell v, the weight B[v] is represented by:

$$\beta[v] = \frac{1}{\sum \frac{1}{|q|}}$$

where for a net q, v is an element of q.

For each interval X[i], X[i+1] and each cell v from that interval, the new cell coordinate Z[v] is equal to:

$$\beta[v] * \sum \frac{1}{|q|} Z^*(q,i)$$

Z*(q,i) is calculated by determining a temporary value a, where a initially equals Z[q]. If a is greater than X[i+1], or is outside the interval, then a is set to the greater border condition, or equal to X[i+1]. If a is less than X[i], again outside the interval, then a is set to the lesser border condition X[i]. Finally, Z*(q,i) is set equal to a.

Figure 13:
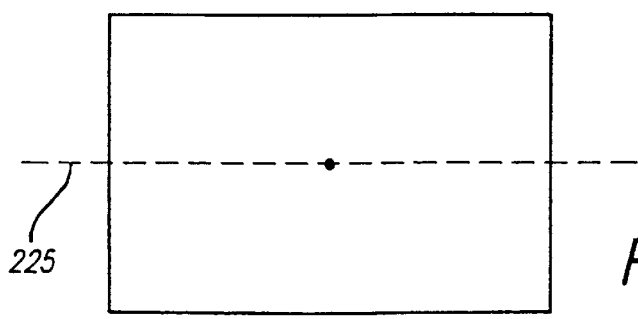
FIG. 13 is an illustration of the coordinates of the nets along an imaginary line.
Figure 14:
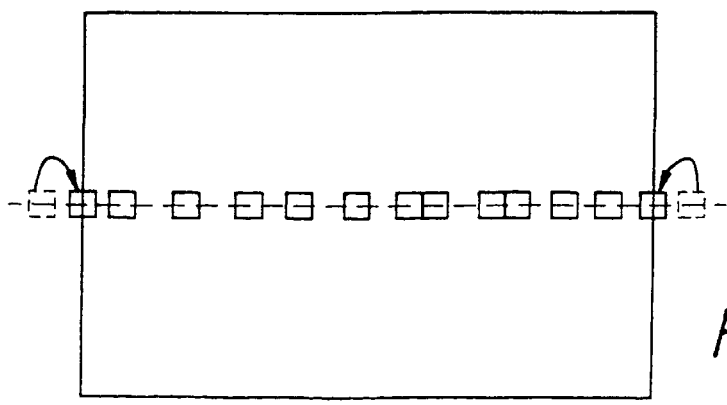
FIG. 14 is an illustration of the coordinates of the nets along an imaginary line.

This set of steps places the coordinates of the nets along an imaginary line as shown in FIG. 13, line 225. Cells are placed along this line based on the results of the initial Z(v) calculation described above, and these positions are subsequently iteratively moved to new positions in the region. The positions of cells within the region are shown in FIG. 14, which includes positions where some of the nets are initially outside the region. These out of bounds nets are then set to the edge of the region.

Once the new cell coordinates are computed, the difference between the previous value of the cost function and the new value of the cost function is determined in step 253. The typical cost function used is wire length and the cost function is computed as the average of the half-perimeters of boundary boxes for all nets. The typical cost function used is wire length and the cost function is computed as the average of the half-perimeters of boundary boxes for all nets. This difference is evaluated in step 254, and if the difference is not below a predetermined threshold, the cell positions are iterated by repeating net coordinate computation step 251 and new cell coordinate computation step 252. This iteration procedure is repeated for a number of times, such as one hundred times, or until the difference in cost function of two consecutive iterations is less than a predetermined threshold, such as 0.001 microns. A unit may be any measure, but the preferred distance threshold is 0.001 microns. The number of iterations and the threshold may vary while still within the scope of the invention.

Section 5: Fast Procedure for Finding a Levelizing Cut Point

The surface abstraction, or core region 201, denotes a region R[i,j]. The previous one dimensional fast preplacement procedure provides a given dividing point DX[i], if the region is divided horizontally, or DY[j] if the region is divided vertically. This dividing point may be anywhere along the line containing the cells from the previous procedure, but the preferred location is the midpoint of the line.

Figure 15:
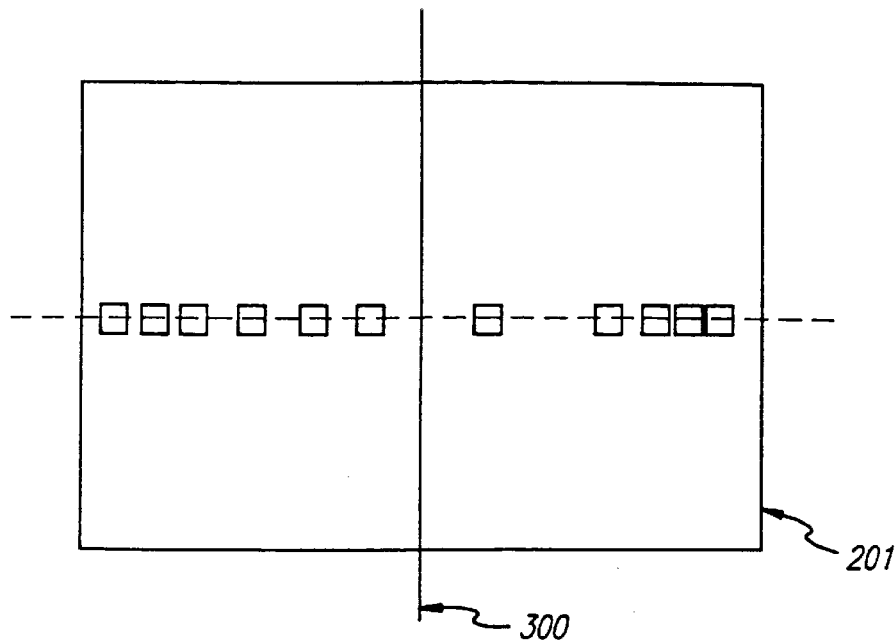
FIG. 15 is an illustration of the placement of nets along the line in the direction partitioned along a dividing line providing two subregions containing the cell positions.
Figure 16:
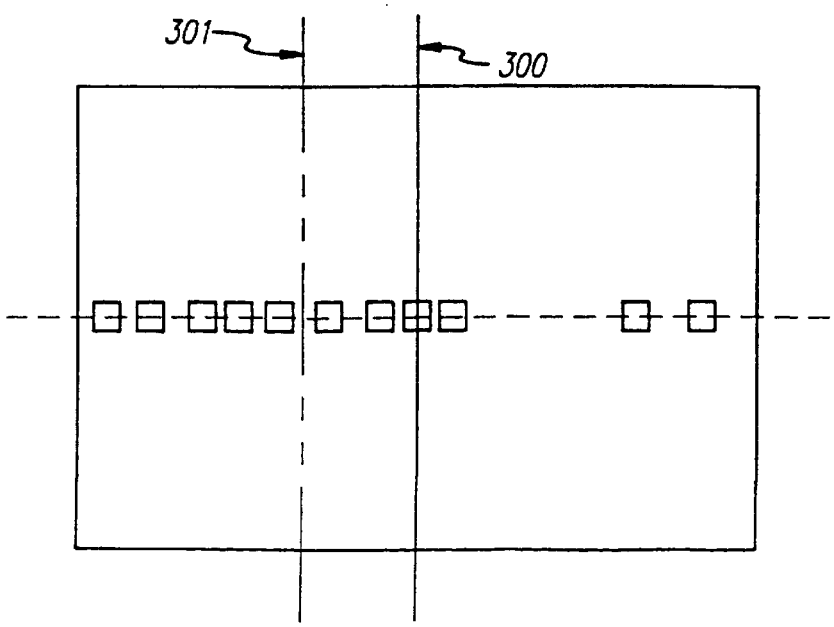
FIG. 16 is an illustration of a region physically divided in half by a dividing point.

The dividing point in the current example generates two subregions in the region R[i,j]. As shown in FIG. 15, the placement of nets along the line in the x direction is partitioned along a dividing line 300 providing two subregions containing the cell positions. The capacity of each of these regions is the area of the regions without all fixed cells or blockages. The capacities of the two regions are cap0 and cap1. A cut point, $Z_0$, is desired which divides the cells such that a percentage of cells or cell heights is proportional to the size of the region. For example, if a 50% cut point is desired, the required location for the cut point is where the two regions, defined by the physical 50% border dividing the surface abstraction, would have equal numbers of cells or of cell heights. As shown in FIG. 16, a region physically divided in half by a dividing point 300 may not have a cut point and cut line 301 coexistent with the region dividing point. The sum of all heights of all cells having coordinates lower than $Z_0$, or of the total quantity of cells having coordinates lower than $Z_0$ must not be greater than $$\frac{cap0}{cap0 + cap1}$$

and the sum of all heights of all cells having coordinates greater than $Z_0$, or of the total quantity of cells having coordinates greater than $Z_0$ must not be greater than $$\frac{cap1}{cap0 + cap1}$$

It is preferable to use the total of all cell heights, but other parameters, such as the number of cells, may be used while still within the scope of the invention.

Figure 18:
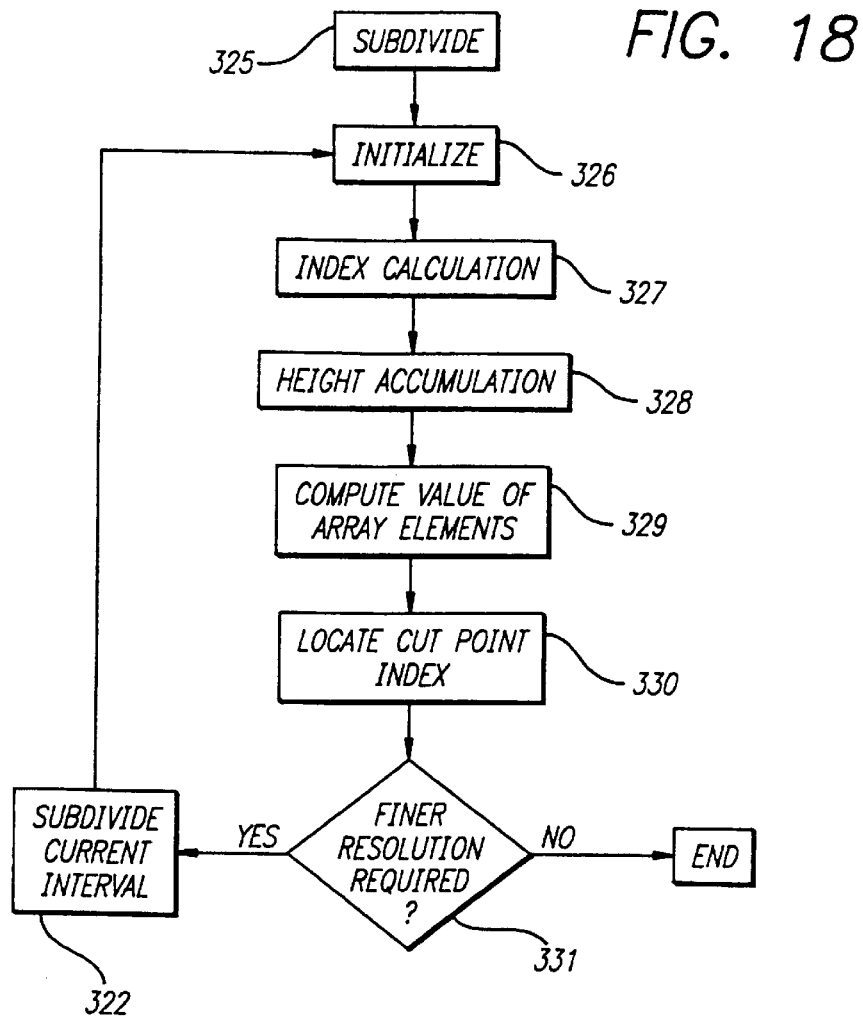
FIG. 18 is a flowchart relating finding a levelizing cut point.

Initially, if all cells within a given region R[i,j] are within an interval (A,B), the (A,B) interval is subdivided into N equal subintervals in subdivision step 325 as shown in FIG. 18. Initialization step 326 initializes an array S[k] having N elements, stores the sum of heights of all cells having subintervals with indices less than or equal to k, and initializes all the elements of array S[k] with the value zero. For each cell v within the region R[i,j], index calculation step 327 computes an index n(v) of the subinterval where the cell v coordinate is located:

$$n(v) = ]\frac{(Z(v) - A)}{(B - A)/N}[$$

As an example, assume (A,B) is an interval from 0 to 200 and 10 equal subintervals are desired. In fact, a number in the range of 1000 such intervals would normally be desired, but 10 is used here for purposes of illustration. Further, assume that one cell is located in each of the ten subintervals, as shown in FIG. 17, although it would be probable that subintervals would contain more than one cell. Assigning A has a value of zero, and B a value of 200, n(v) for a cell in this arrangement is equal to the minimum integer value greater than Z(v)/10 for the cell. The designation "]x[" denotes take the minimum integer greater than x, such that for x having a value of 1.3, the value of ]x[ is 2.

This results in an integer value for a subinterval within the (A,B) region where the individual cell is located. Height accumulation step 328 accumulates the heights of the cells in each subinterval within the array S[k] according to the relationship:

$$S[n(v)] = S[n(v)] + h(v)$$

where h(v) is the height of cell v. Value of array elements step 329 calculates the values within S[k] by iterating for k equal to 2, k being less than or equal to N, incrementing k, $$S[k] = S[k-n1] + S[k]$$

Cut point index locator step 330 locates the minimal index $k_0$ such that $$\frac{cap0}{cap0 + cap1} * S[N] \le S[k_0]$$

The levelizing cut point, where cell height is equivalent to the percentage of area within the surface abstraction is equal to $$Z_0 = A + (k_0 - 0.5) * \frac{B - A}{N}$$

Clustering of cells within a single region, or at a border of a region, may provide an inaccurate cut point. In such a case, where the levelizing cut point requires a higher accuracy, the subinterval where the levelizing cutpoint is located may be again divided into N subintervals in subdivision step 332 and the procedure repeated, locating a second levelizing cutpoint.

Once the levelizing cutpoint is located, all cells are shifted according to the following procedure.

Section 6: Median Control and Increase in Resolution

Figure 19:
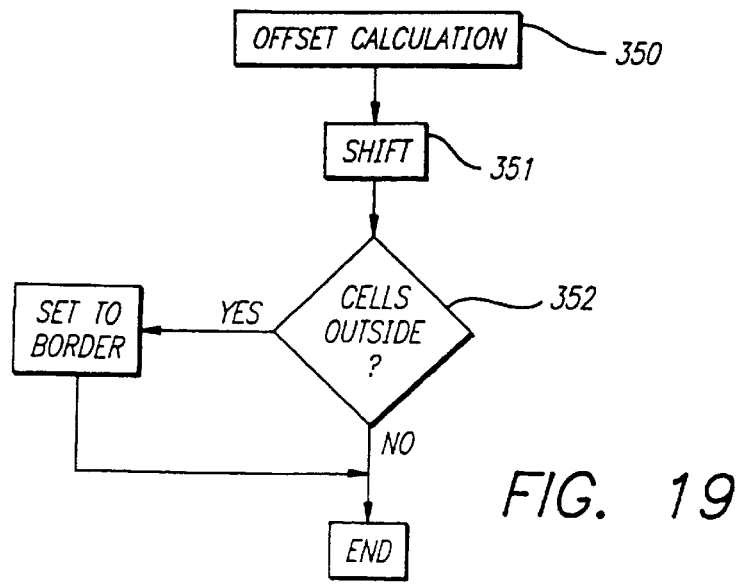
FIG. 19 is an illustration of the calculation step which determines the offset of the cut line from the dividing line.

For a given region R[i,j] having a dividing point D, the levelizing cut point $Z_0$ divides the cloud of cells proportionally to the capacities of the subregions induced by the dividing point D. From FIG. 19, offset calculation step 350 determines the offset of the cut line from the dividing line, where A is the difference between the coordinates of dividing point D and the levelizing cut point $Z_0$. Coordinates for each cell in the region are modified such that for any cell v within the region R[i,j], the cloud of cells is shifted in shifting step 351 such that the cut point is collocated with the dividing point:

$a=Z[v]+A$

For cells outside the region, those cells are placed at the border of the region. If a is greater than X[I[v]+1] then a is equal to X[I[v]+1]. If X is less than X[i[v]], then a is equal to X[I[v]]. Z[v] is then set equal to this value a.

In the preferred embodiment, the system initially places all cells at the center of the two-dimensional abstraction of the chip surface. The system then performs a predetermined number of iterations of the One Dimensional Preplacement Optimization in one direction, such as the x direction. The surface abstraction is then subdivided into sub-regions by dividing the surface abstraction in the opposite direction. The system then uses the Levelizing Cut Point procedure to partition the cells into groups proportional to the capacities of the subregions. The Median Control procedure then modifies the coordinates of the cells. The Levelizing Cut Point and Median Control procedures are iterated a specified number of times (preferably 6) with the specified number of iterations comprising a Block. The average cost function is computed after a Block is performed. After each Block, an overall cost function, described below, is computed. After repeating this Block a predetermined number of times (typically 10), the system computes the average cost of each cost calculated during these Block iterations. The current average cost value is compared with the previous average cost value, and if the difference between the average value and the previous value is less than a predetermined value (such as $10^{-3}$), the procedure for the first level of hierarchy is complete. Cells are then assigned to the respective subregions depending on the calculated coordinates.

If the average cost function has not decreased by a specified amount, further Blocks of computations are required. At the end of this iterative procedure the cells are assigned to subregions in such a way that the capacities of the subregions are not violated.

After assignment of the cells to a respective subregion, as is described in §1 above, the system may repeat the aforementioned procedures based on a cut in the opposite direction. If, for example, the initial iterative one-dimensional preplacement optimization divides the available space on the surface abstraction by a vertical line, or divides in the x direction, the system executes the finding of a levelizing cut point procedure and the median control and resolution increase procedure in this direction. Upon completion of these procedures, the cells are assigned to one of the two regions, and the procedure may be repeated in the y-direction, based on the cells located in the two regions, after other optimization procedures discussed below are completed. As shown in FIG. 20, the two regions are divided using two dividing lines in the y direction and cells are placed along these two lines. The system locates a levelizing cut point for each region and partitions out the cells to the four remaining cells. This division in the y direction creates a second level of hierarchy.

For purposes of this patent specification, hierarchy levels are determined based on the number of divisions of the surface abstraction. The level of hierarchy is the sum of the number of times the surface abstraction is divided into separate regions. For example, if the surface abstraction has been divided three times in the x direction and two times in the y direction, the system has reached the fifth level of hierarchy. The total number of regions is equal to $2^{(Levelx+Levely)}$, with "Levelx" meaning the number of occasions that the surface abstraction has been divided in the x direction and "Levely" means the number of occasions that the surface abstraction has been divided in the y direction. Thus, in the previous example, 32 regions exist at the fifth level of hierarchy.

Section 7: Universal Affinity Driven Discrete Placement Optimization

After each surface abstraction division, the system performs a discrete placement optimization. For purposes of illustrating this procedure, it is assumed that the previous routines have furnished two sets of cells partitioned into two regions on the surface abstraction. All cells are located in the centers of each region.

Figure 21:
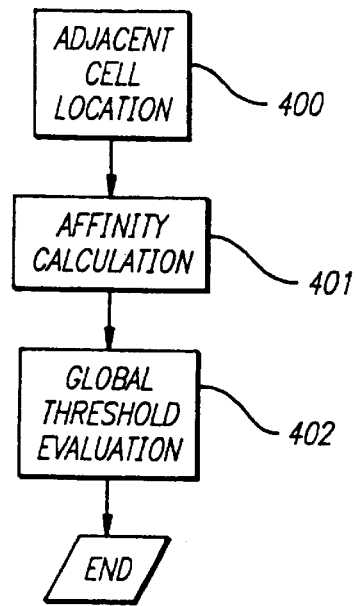
FIG. 21 is an illustration of adjacent cell location step which initially considers moving a cell from its current position to each of the adjacent regions, as well as considering leaving the cell in the current region.

The system calculates affinities and cost functions for the arrangement. An affinity is calculated based on current cell placement and blockages in a chip. Affinities are heuristically connected with a desired cost function, which should be minimized. Affinities can be driven by cell density, wire length, minimizing maximal cut, clustering, etc., or some combination of these parameters depending on the goal sought to be achieved. Affinities may be positive or negative, and relate to the quality of an alternate placement of a cell. For example, having a cell with a higher affinity at a first location and a lower affinity at a second location indicates that the preferred placement of the cell is the first location. The parameter of the discrete placement optimization is E, which represents the accuracy of the placement, and is a small number, such as $10^{-3}$ or $10^{-4}$. From FIG. 21, adjacent cell location step 400 initially considers moving a cell from its current position to each of the adjacent regions, as well as considering leaving the cell in the current region. For higher levels of hierarchy (i.e., a substantial number of regions), nine total regions are evaluated for cells not located on an edge of the surface abstraction. Affinity calculation step 401 calculates, for each adjacent region, the maximum affinity of the cell is moved to these adjacent regions. The total number of cells having an affinity greater than a predetermined value p is denoted $N_p$. For the initial placement received from the preceding procedural steps, the affinities for the cells are calculated and ordered according to these affinities.

Global threshold evaluation step 402 finds a threshold number, Globthresh, such that the total number of cells, $N_{GlobThresh}$, having an affinity greater than the threshold number, is less than e multiplied by the number of all cells having positive affinities, or $N_0$. Practice has shown that optimal results occur for e having a value of from 30 to 40 percent.

Figure 22:
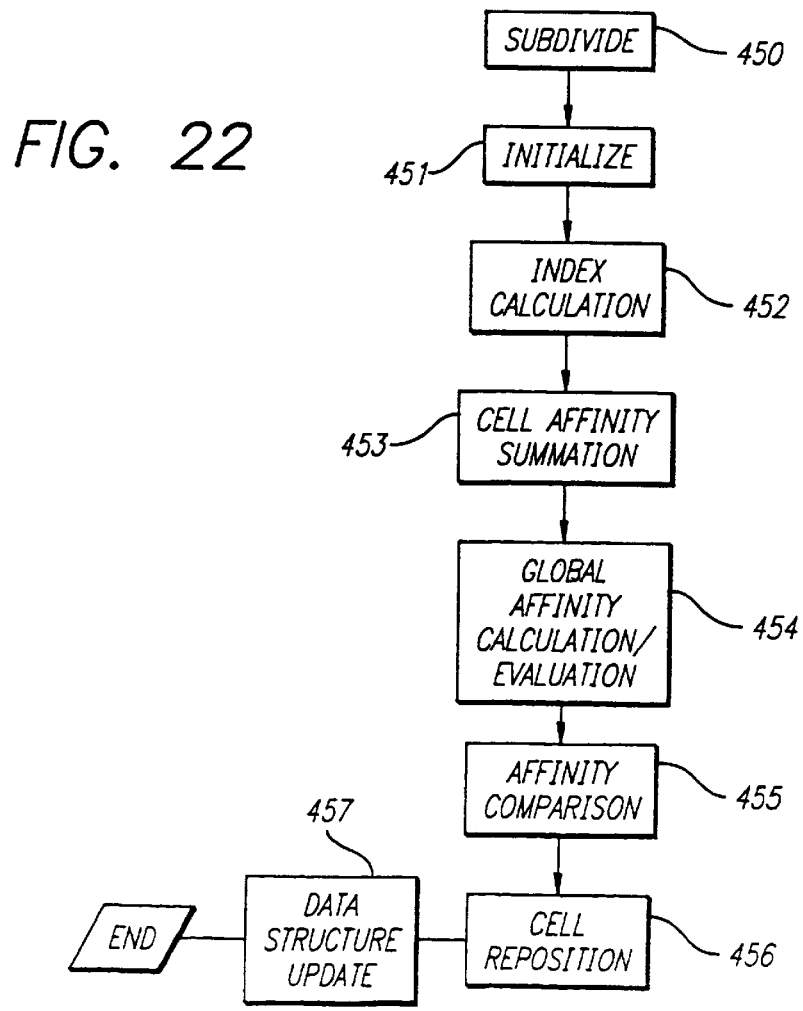
FIG. 22 is an illustration of the (A,B) interval which is subdivided into equal subintervals in subdivision step 450.

The overall global threshold is determined using a similar procedure to that described above with reference to the procedure for finding the levelizing cut point. The affinities are ordered sequentially, and all cells are defined to be within an interval (A,B), exclusive of negative affinities. With reference to FIG. 22, the (A,B) interval is subdivided into k equal subintervals in subdivision step 450. Initialization step 451 defines an affinity array A[i] having i elements. The initial value of all elements of this array is 0. A[i] stores the number of cells whose affinities are greater than or equal to (k−i)*L, where L is the length of the subinterval within (A,B). For each cell v, calculation step 452 computes an index i(v) of the subinterval where the cell v affinity is located:

$$i(v)=K+1-]\text{MaxAff}(v)/L[$$

MaxAff(v) is the maximum affinity over all adjacent regions for the cell v. This calculation yields an integer value denoting a subinterval within the (A,B) region where the individual cell affinity is located. Now for each cell v we increase the appropriate element of the array by 1 such that A(i(v))=A(i(v))+1. Cell affinity summation array step 453 calculates the value of A[i] by iterating for i equal to 2, i being less than or equal to k, incrementing i, $$A[i]=A[i-1]+A[i]$$

Global affinity evaluation step 454 determines the global affinity threshold GlobThresh using the previous equation such that GlobThresh is equal to i where i is the minimum i such that $N_0 \cdot \epsilon$ is less than or equal to A[i].

After calculating GlobThresh, the system evaluates the list of all cells in a predetermined sequential order. Affinity comparison step 455 calculates the maximal affinity for the present region and for each adjacent region. If the affinity for an adjacent region is greater than the global threshold GlobThresh, the cell is placed in the new region in cell repositioning step 456. The original cell position data structure is updated in data structure update step 457. Then steps 455, 456 and 457 are iterated as a block 458, generally 3 times.

The result of this procedure is a global threshold for all cells. Some cells have been moved to adjacent regions, altering affinities of other cells. The procedure is then repeated two more times, for a total of three iterations, through the list of all movable cells using the same threshold.

As an additional and optional procedure, a local threshold can be calculated in addition to the global threshold. The local threshold is calculated in the same fashion as the global threshold, but with respect to only the cells from the region where the cell is located. If we use this additional, optional procedure, we move the cell only if the maximal affinity is greater than both the global threshold and the local threshold.

An average cost function, representing the average of the three values of the cost function calculated after each iteration, is computed. Now we compute a new threshold as described above in step 454. This entire procedure, from threshold computation through cost function computation (block 459), is repeated a predetermined number of times (usually 10 times). Each time block 459 is repeated the predetermined number of times, the average value of the average cost function is calculated and compared with the previous average value of the average cost function value. If $$\text{AvgCost}_{i-1}(1+\delta)*\text{AvgCost}_i$$

then the optimization process is halted. $\delta$ is a small number, typically $10^{-3}$ or $10^{-4}$.

Section 8: Density Driven Capacity Penalty System

The surface abstraction is partitioned alternately in the vertical and horizontal directions, where each division denotes an additional level of hierarchy. The levels of hierarchy, $\text{Lev}_x$ and $\text{Lev}_y$ determine the number of hierarchy levels. The number of grids, or channels of regions, in each direction are given as $\text{Grid}_x$, equal to $2^{Lev_x}$, and $\text{Grid}_y$, equal to $2^{Lev_y}$. Each region on each level of hierarchy is determined by ($\text{Lev}_x$, $\text{Lev}_y$, i, j) where i and j are the indices of corresponding surface abstraction segments. The capacity of each region is a function of these four parameters. The system then calculates the sum of the heights in each region.

Figure 23:
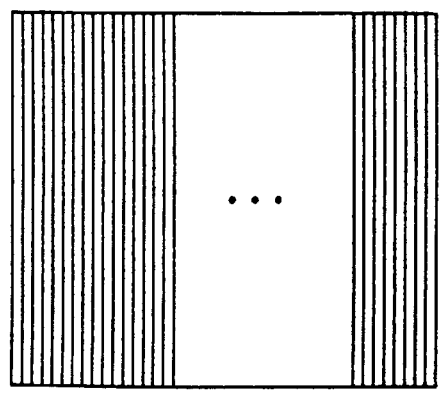
FIG. 23 is an illustration of the cell region having a certain number of columns, or possibly rows, located therein.

The system then calculates a region capacity in terms of the heights of cells which can be located within a single region. This capacity of cell heights accounts for rows or columns of locations where cells may be located. As shown in FIG. 23, the cell region will have a certain number of columns, or possibly rows, located therein. The cell height capacity represents the space available to individual cells within the region and is based on the hierarchy of the surface abstraction. As outlined below, the highest level of hierarchy defines a single column per region. As may be appreciated by one of ordinary skill in the art, rows may be used rather than columns to define a total cell width capacity rather than a height capacity.

All cells are located at the center of a region during some phases of the placement procedure. The height of a single cell may extend into more than one region. A parameter ColKey is assigned to this placement system process. The center of each cell is assigned to the center of the region it occupies. If ColKey has a value of 0, the entire height of the cell is located within a single region. If ColKey is equal to 1, the height of the cell is distributed to the regions the cell overlaps. For example, if a cell has a height of 16 units while the region has a height of ten units, three units are assigned to the cell above and three to the cell below the current cell. Cells located in an edge region are assigned to the region away from the edge, and not to any region outside the edge. Hence in the example previously presented, ten units of the cell would be assigned to the edge region and three to the region above the edge region.

Movement of the cells from one region to another requires updating the total of the heights in each region.

Figure 24:
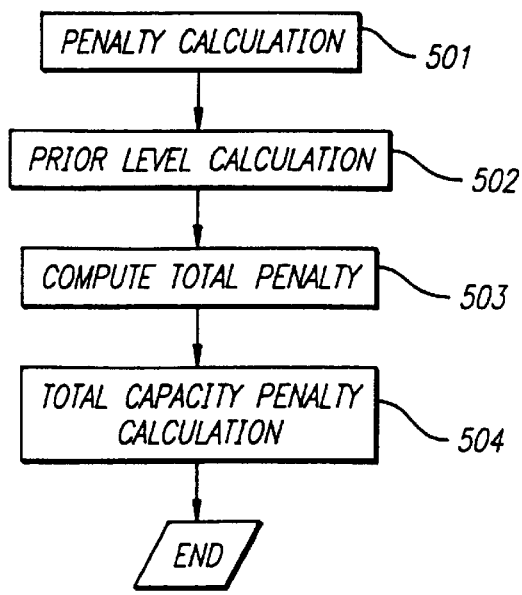
FIG. 24 is an illustration of the penalty calculation step 501.

Each cell v is located within regions with indices I[v] and J[v], in the x and y directions, respectively. Movement of a cell to an adjacent region is denoted by $\Delta_i$ and $\Delta_j$, where $\Delta_i$ is a movement in the horizontal direction, with a rightward movement being +1, and $\Delta_j$ representing vertical movement, upward yielding a+1 value. $\Delta_i$ and $\Delta_j$ each are set at either −1, 0 or +1. From FIG. 24, penalty calculation step 501 computes a penalty, $\text{PenCapB}(v,\alpha,\Delta_i,\Delta_j)$, equal to the following values:

$$\frac{SumHeight[I[v]][J[v]]}{Cap[I[v]][J[v]]} * 2^k$$

for $\Delta_i$ and $\Delta_j$ both equal to zero; and $$\frac{SumHeight[I[v]+\Delta_i][J[v]+\Delta_j] + \alpha * h(v)}{Cap[I[v]+\Delta_i][J[v]+\Delta_j]} * 2^k$$

otherwise (i.e., either or both $\Delta_i$ and $\Delta_j$ have a value other than 0 (−1 or +1)). α represents the degree of counting, which affects the movability of a cell v to a new region, α will typically have a value between 0.1 and 1. Prior level calculation step 502 computes the penalty for the regions three levels before the current level. For example, if the current hierarchy divides the surface abstraction into 64 by 64 total regions, then three levels before has 8 by 8 regions. A total of 64 eight by eight regions will fit into a 64 by 64 area. The total penalty, PenCap8(v, $\Delta_i,\Delta_j$), is calculated in the same manner as the PenCapB calculation in total penalty computation step 503. The total capacity penalty is calculated in step 504 according to the following formula:

$$PenCap(v, \Delta_i, \Delta_j) = \lambda * PenCapB(v, \alpha, \Delta_i, \Delta_j) +$$
$$Sw * \lambda_{ad} * PenCap8(v, \Delta_i, \Delta_j) +$$
$$ColKey * \lambda_{col} * PenCapCol(v, \beta, \Delta_i, \Delta_j)$$

where λ is the capacity penalty weight in the total affinity, and Sw is a switch parameter set to 0 or 1 depending on whether use of the PenCap8 variable is desired. PenCap8 is used only when the area is divided into 16 by 16 regions or more. $\lambda_{ad}$ and $\lambda_{col}$ are the relative weights of corresponding penalties. The use of these various penalties allow the user to drive the placement based on predetermined desired characteristics. If capacity in individual columns is to be penalized more than other capacity weights, then the value of $\lambda_{col}$ is greater than the other λ factors, i.e. λ and $\lambda_{ad}$, where all λ factors are between zero and one. While design and performance are generally a matter of choice, experience has demonstrated that λ may initially be set to the following value:

$$\lambda = \lambda_0 * \frac{CoreX}{GridX * GridY}$$

where $\lambda_0$ ranges between 0.5 and 1.5, and CoreX is the x dimension of the core. The values initially selected for $\lambda_{col}$ and $\lambda_{ad}$ are 16 and 16.

Section 9: Wire Length Driven Affinity System

An alternate embodiment of the current design is to calculate affinities and penalties according to the relative wire lengths of different designs. This procedure provides a set of affinities providing the minimal wire length over all feasible placement solutions.

For each cell v and net q, the minimum and maximum values for the X component penalties are as follows:

$$X_{min}(v,q) = \min_{w \neq v, w \in q}(X(w) + x(w,q))$$
$$X_{max}(v,q) = \max_{w \neq v, w \in q}(X(w) + x(w,q))$$

where X(w) is the current coordinate of the cell origin, x(v,q) is a pin offset from the origin where the pin belongs to the net q. The y component penalties are similar:

$$Y_{min}(v,q) = \min_{w \neq v, w \in q}(Y(w) + y(w,q))$$
$$Y_{max}(v,q) = \max_{w \neq v, w \in q}(Y(w) + y(w,q))$$

Figure 25:
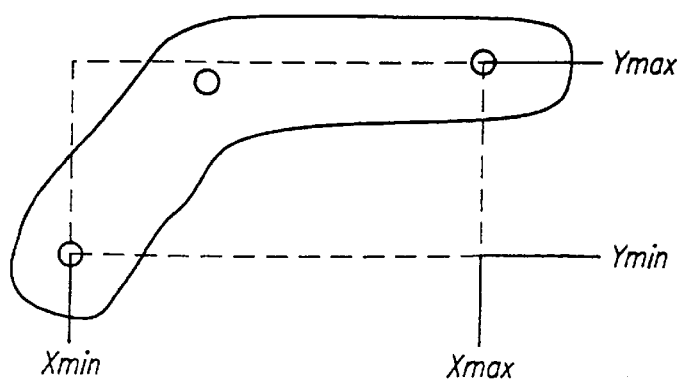
FIG. 25 is an illustration of a three pin net.

These equations define a bounding box 550 containing the net q 551, as shown for a three pin net in FIG. 25.

The borders of the region where the cell v is located are denoted by:

$X_l(v) = X[I[v]]$ $X_r(v) = X[I[v]+1]$ $Y_l(v) = Y[I[v]]$ $Y_u(v) = Y[I[v]+1]$

The penalty vector for cell v and net q in the x-direction is:

(PenHPx(v,q,−1), PenHPx(v,q,0), PenHPx(v,q,1))

These values correspond respectively to movement of the cell to the left, nonmovement of the cell in the horizontal direction, and movement of the cell to the right.

The penalty vector for cell v and net q in the y-direction is:

(PenHPy(v,q,−1), PenHPy(v,q,0), PenHPy(v,q,1))

These values correspond respectively to movement of the cell upward, nonmovement of the cell in the vertical direction, and movement of the cell downward.

The penalty vector for the individual situation is as follows. If $X_{max}$ is less than $X_l$, then the vector representation for the penalty in the x direction is (−1,0,1), indicating zero penalty for keeping the cell in its current location, a penalty of one for moving the cell to the right, and a penalty of −1 for moving the cell to the left. This indicates that a cell in the net is outside the left boundary of the region, and movement of the entire net to the right would be a penalty for the wire length. Movement of the cell to the left would be a negative penalty, or benefit, to the wire length. For $X_{min}$ greater than $X_r$, the penalty vector is (1,0,−1). For $X_{min}$ less than $X_l$ and $X_{max}$ less than or equal to $X_r$, the penalty vector is (0,0,1). For $X_{min}$ less than $X_l$ and $X_{max}$ greater than $X_r$, the penalty vector is (0,0,0). For $X_{min}$ greater than or equal to $X_l$ and $X_{max}$ less than or equal to $X_r$, the penalty vector is (1,0,1). For $X_{min}$ greater than or equal to $X_l$ and $X_{max}$ greater than $X_r$, the penalty vector is (1,0,0). Similar vectors result for positions of the cells in the y direction.

The total penalty for a cell v in the X direction is a normalized sum of the penalties in the X direction over all nets incident to the cell v:

$$PenHP_X(v, \Delta_i) = (XI[1] - XI[0]) * \sum_{q \ni v} PenHP_X(v, q, \Delta_i)$$

In the Y direction, $$PenHP_Y(v, \Delta_j) = (YJ[1] - YJ[0]) * \sum_{q \ni v} PenHP_Y(v, q, \Delta_j)$$

The total penalty is the sum of the x and y components:

$PenHP(v,\Delta_i,\Delta_j) = PenHP_X(v,\Delta_i) + PenHP_Y(v,\Delta_j)$

The affinity is the opposite of the penalty:

$AffHP(v,\Delta_i, \Delta_j) = -PenHP(v,\Delta_p,\Delta_p)$ and a first combined affinity is calculated based on both capacity and wire length:

$$Aff iv(v,\Delta_i,\Delta_j)=AffHP(v,\Delta_i,\Delta_j)+QEF(v)*AffCap(v,\Delta_i,\Delta_j)$$

QEF(v) represents a scaling factor having the following parameters:

$$QEF(v) = \frac{\log\left(\frac{Height(v)}{\text{AvgHeight of All Cells}}\right) + A}{B}$$

where Height(v) represents the height of the cell v. Although any values may be used for A and B in this equation, experience and testing has shown that the values of 5 and 5 produce the most beneficial results.

Section 10: Minimizing Maximal Cut Driven Affinity System

Another parameter used to produce an affinity for improving cell placement is minimizing the maximal number of nets that intersect the unit segment of the grid system imposed of the surface abstraction of the chip. Net overlap inherently yields inefficiency of wiring, and thus minimizing the number of nets which cross other nets improves overall system efficiency. For each level of chip core partitioning hierarchy, the number and position of the vertical and horizontal lines which induced the level of partitioning hierarchy are evaluated, including determining the number of nets which intersect a line partitioning the cell into regions. Initially, the system determines the number of nets which intersect the lines and the relative affinities for these line crossings. The system moves the cells and the nets change position based on relative affinities, and then the number of net crossings and affinities are recomputed.

Figure 26:
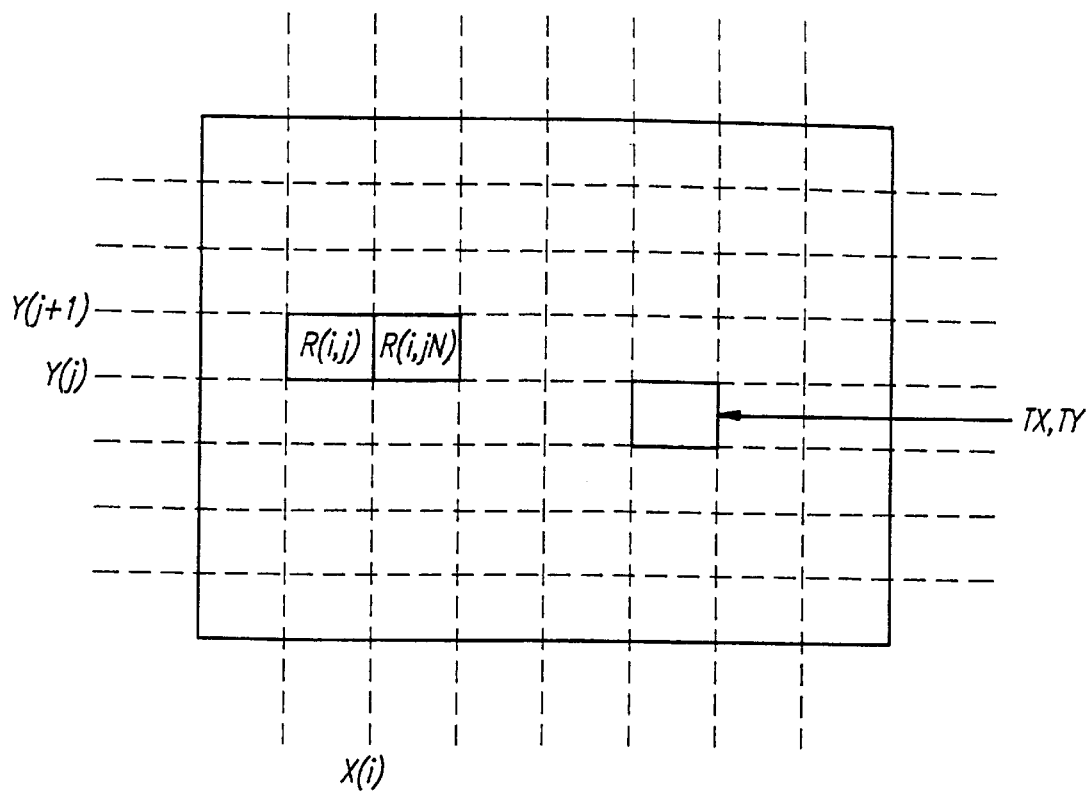
FIG. 26 is an illustration of each dividing line partitions regions, and each of these regions has a capacity denoting the volume of cells which can fit within the region.

As shown in FIG. 26, each dividing line partitions regions, and each of these regions has a capacity denoting the volume of cells which can fit within the region. The system performs the following procedure once after each bisection. The system calculates the capacities as an average capacity of regions adjacent to the dividing line. In FIG. 26, the capacity of dividing line X(i) is defined as the average capacity of all regions to the left of the line and all regions to the right of the line. The system calculates average vertical line capacity and average horizontal line capacity for all lines, representing the amount of wiring which is available over the entire surface abstraction. The capacity may also represent available space for wiring available on multiple layers of the chip. The capacity of each horizontal and vertical line is then divided by the corresponding horizontal or vertical average values. Hence, if the capacity of the line represented by X(i) in FIG. 26 has a capacity of 1500 cells and the average capacity of all vertical lines on the surface abstraction is 1000 cells, the relative cut of the line is 1.5. The ratio of the number of nets crossing a line and the capacity of the line are defined as the relative cut.

Figure 27:
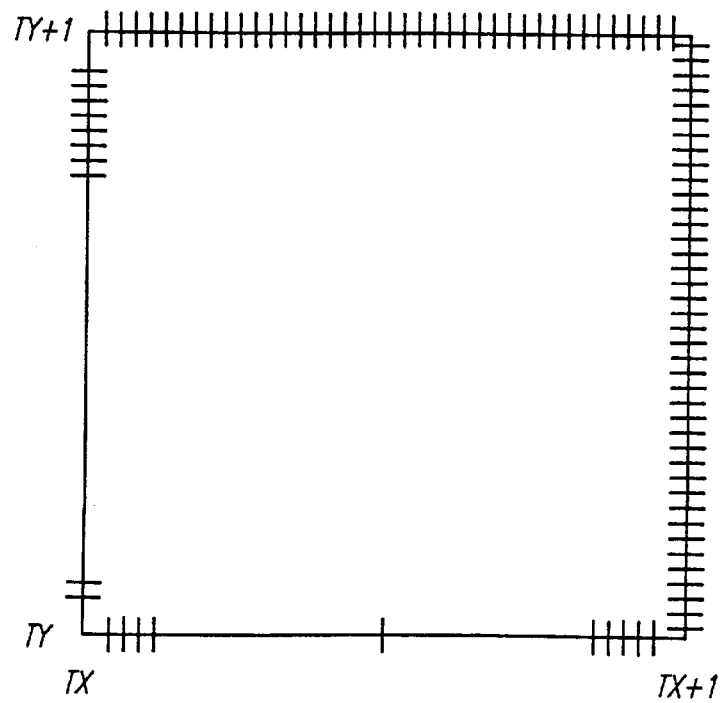
FIG. 27 represents a region having indices (TX, TY).

Before each optimization step in the affinity driven discrete placement optimization procedure, and particularly before calculation of global and/or local thresholds, the system calculates a midcut for the surface abstraction. The midcut represents the average relative cut over all lines of the surface abstraction. FIG. 27 represents a region having indices (TX, TY). The number of cuts represents, with the current cell configuration, the number of times a net crosses a boundary, while the capacity of the line represents the total number of possible crossings of the particular boundary. The system calculates four penalties which represent the cost of a change for a half-perimeter move of cells within the region one unit to the right, left, up, and down:

$$DXL = (XI[1] - XI[0]) * \left(1 - \beta + \beta * \left(\frac{CutX[TX]}{CapX[TX]} \bigg/ (MidCut)\right)\right)$$

$$DXR = (XI[1] - XI[0]) * \left(1 - \beta + \beta * \left(\frac{CutX[TX+1]}{CapX[TX+1]} \bigg/ (MidCut)\right)\right)$$

$$DYB = (YJ[1] - YJ[0]) * \left(1 - \beta + \beta * \left(\frac{CutY[TY]}{CapY[TY]} \bigg/ (MidCut)\right)\right)$$

$$DYT = (YJ[1] - YJ[0]) * \left(1 - \beta + \beta * \left(\frac{CutY[TY+1]}{CapY[TY+1]} \bigg/ (MidCut)\right)\right)$$

These equations, as illustrated in FIG. 27, represent the number of cuts over region dividing lines TX, TX+1, TY, and TY+1 relative to the capacity of the dividing lines. The XI and YJ factors represent the size of one region. The factor $\beta$ represents the relative penalty associated with cuts, and testing has shown that a reasonable range for $\beta$ factors is 0.4 to 0.5. As shown in FIG. 27, for a region twenty units in length on the x and y sides, with ten cuts along each dimension and a capacity for one hundred cuts, with an average number of cuts equal to twenty cuts, and a $\beta$ factor of 0.45, the values for DXL and DYB are 11.045 each. For 40 cuts on the right hand side and upper side of the regions, the values are 11.18.

Discrete affinities in the x and y direction represent the numbers of nets whose half-perimeter decreases on movement of cells across the boundary minus the number of nets whose halfperimeter increases when a cell moves in a given direction.

$$AffX[i], i=-1,0,1; AffY[j], j=-1,0,1$$

Affinity for zero movement represents the numbers calculated above. Movement of a cell in a particular direction, such as crossing a boundary line, induces an affinity for that cell. From FIG. 27, movement of the cell to the right and up decreases the penalty, or increases the affinity for the cell. Thus affinity in the x direction, AffX, for movement to the right is −1, to the left is 1, and affinity for movement in the y direction, AffY for movement of the cell upward is −1, and downward is 1. Affinity for keeping the cell in its current position is 0.

The discrete affinities for movement in each of the four directions are multiplied by the corresponding factor:

$$AffcutX[-1]=AffX[-1]*DXL$$

$$AffcutY[-1]=AffY[-1]*DYB$$

$$AffcutX[1]=AffX[1]*DXR$$

$$AffcutY[1]=AffY[1]*DYT$$

Total affinities for movement of the cell in the vertical and horizontal directions are the summation of affinities in the X and Y directions:

$$Affcut[i][j]=AffcutX[i]+AffcutY[j]$$

An alternative embodiment of this procedure is to use the square of the number of crossings as a component of the cost of change for the halfperimeter move. For movement to the left, this would yield an equation of:

$$DXL = (XI[1] - XI[0]) * \left(1 - \beta' + \beta' * \left(\frac{CutX^2[TX]}{CapX[TX]} \bigg/ (MidCut)\right)\right)$$

Squaring the factors increases the emphasis on the number of cuts, and balancing with new β' factors yields an arrangement wherein the total number of cuts converge rapidly to a relatively uniform quantity.

Section 11: Neighborhood System Driven Optimization

Figure 28:
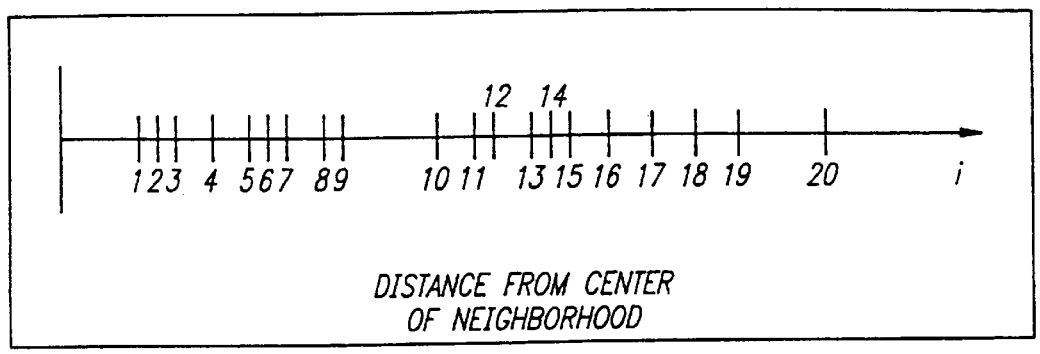
FIG. 28 illustrates an ordering of cells within the neighborhood.

Each moveable cell v is located within a neighborhood Neigh(v) constructed in accordance with the optimization of cell neighborhood system procedure outlined above. That procedure yields an ordering of cells according to the cells' distance from the center of the neighborhood, after optimization. FIG. 28 illustrates such an ordering of cells within the neighborhood, Neigh(v)=(w(v,1), w(v,2), . . . w(v,M)), where M is the size of the neighborhood, generally in the range of 20 cells.

Figure 29:
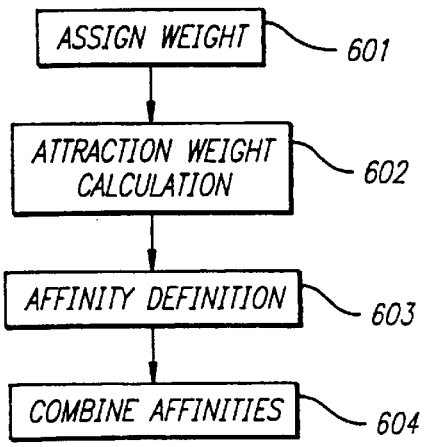
FIG. 29 is an illustration of the weight assignment step which assigns each cell a weight equal to the size of the neighborhood minus the index of the cell.

From FIG. 29, weight assignment step 601 assigns each cell a weight equal to the size of the neighborhood M minus the index of the cell i. Thus, for a neighborhood of size 20, the 20th cell has a weight of 0, while the first cell has a weight of 19.

An alternate preferred method of assigning weights is to declare a number L, where L equals M plus some positive integer, such as 2, and weights range from 21 down to 2. The reason for this shift is that the weight accorded to a factor of 1 is infinitely greater in terms of multiplications than a factor of zero. Thus relative weights may be misleading if low number factors, such as zero and one, are used as weighing factors. Any monotonically decreasing function may be employed in defining the weights accorded the cells within the neighborhood.

The system then calculates attraction weights in step 602. The total sum of the weights attracting the neighborhood to the region are defined as follows:

$$SumWeight_l(v) = \sum_{i:(X(w(v,i)) < X_l(v))} Weight(w(v, i))$$

$$SumWeight_o(v) = \sum_{i:(X_l(v) \leq X(w(v,i)) < X_r(v))} Weight(w(v, i))$$

$$SumWeight_r(v) = \sum_{i:(X(w(v,i)) > X_r(v))} Weight(w(v, i))$$

Figure 30:
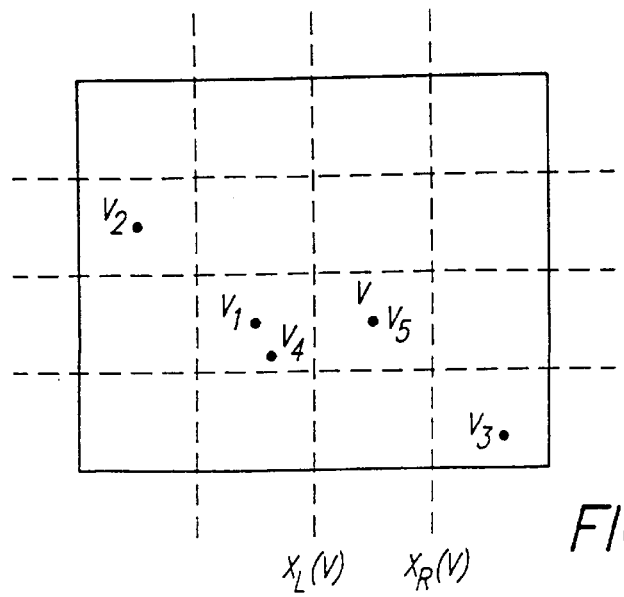
FIG. 30 is an illustration of the weights of the neighborhood attraction in a direction.

These equations represent the weights of the neighborhood attraction in a direction. For example, assume a neighborhood $(v_1, v_2, \ldots v_5)$, as shown in FIG. 30. The weights assigned to the individual cells in the neighborhoods represent the relative heights of the cells, but can be any measure of load accorded to the individual cell. The relative weights of the cells is (7, 6, 5, 4, 3). From the previous equations, the sum of weights to the left of the current region minimum line in the x direction, $x_L(v)$, is 7 plus 6 plus 4, or 17. The sum of weights to the right of the current region maximum line, $x_R(v)$, is 5. The sum of weights within the region bounded by the $x_L(v)$ and $X_R(v)$ lines is 3.

In affinity definition step 603, the system then defines the following neighborhood affinities for movement of cells in each particular direction:

$$AffNeighborhood_X(v, 0) = 0$$

$$AffNeighborhood_X(v, -1) = \frac{2 * Grid_Y}{Grid_X + Grid_Y} * \frac{1}{M^2} *$$
$$(SumWeight_l(v) - SumWeight_o(v) - SumWeight_r(v))$$

$$AffNeighborhood_X(v, 1) = \frac{2 * Grid_Y}{Grid_X + Grid_Y} * \frac{1}{M^2} *$$
$$(SumWeight_r(v) - SumWeight_o(v) - SumWeight_l(v))$$

These values represent the relative overall benefit of moving the location of the neighborhood in a particular direction or leaving the neighborhood in its current position. $Grid_x$ and $Grid_y$ are identical to the values outlined above in reference to the density driven capacity penalty system, and represent the number of grids, or lines of regions, in the X and Y directions. Grid, is equal to $2^{Lex}$ and $Grid_y$ is equal to $2^{Ley}$, where $Lev_x$ and $Lev_y$ define the number of hierarchy levels. The number M represents the number of cells in the neighborhood.

Resuming with the example of FIG. 30, M is equal to five and we are in the fourth level of hierarchy. Thus, $AffNeighborhood_x(v,0)$ equals 0, and $AffNeighborhood_x(v,-1)$ equals $(2*2/(2+2))* 1/52* (17-5-3)$, or 9/25. $AffNeighborhood_x(v,1)$ equals $(2*2/(2+2))*1/52*(3-5-17)$, or −19/25. Hence the X affinities for this example are (9/25, 0, −19/25) for leftward, center, and rightward movement, respectively. The Y affinities for this example are (−17/25, 0, and −15/25). Selecting the highest affinities yields the result that the neighborhood should be moved to the left and remain in its current vertical position. Affinities for the X and Y directions are therefore combined in step 604 to yield a total neighborhood affinity for movement of the current neighborhood to another region within the nine regions adjacent a non-edge region.

Affinities may be combined while still within the scope of the current invention. Combinations of capacity affinities, wire length affinities, cut affinities, and neighborhood affinities present an enhanced system of determining the preferred direction of movement of a cell or net. Such an affinity combination may include combining the following affinities:

$$Aff(v,\Delta_i,\Delta_j) = AffNeighborhood(v,\Delta_i,\Delta_j) + QEF(v)*AffCap(v,\Delta i,\Delta_j)$$

As outlined above, QEF(v) represents the capacity penalty influence factor, which is a function of cell v relative height. Such a combination of affinities takes into account cell position as well as relative weight accorded to an individual neighborhood.

Section 12: Functional Sieve Optimization Technique

The combination of affinities introduces an element of randomization. A deterministic system for combining affinities which converges at a relatively rapid rate is desired to optimally utilize affinities. Such a system which iteratively optimizes cell placement using a combination of affinities is the functional sieve approach.

The functional sieve performs several calculated iterations of combining affinities and moving cells based on relative affinities and then computing cost functions for the new cell positions. The functional sieve utilizes the following basic formula:

$$Aff(v,\Delta_i,\Delta_j) = i*AffNeighborhood(v,\Delta_i,v_j) + \mu_2* AffHP(v,\Delta_i,\Delta_j) + QEF(v)*AffCap(v,\Delta_i,\Delta_j)$$

Figure 31:
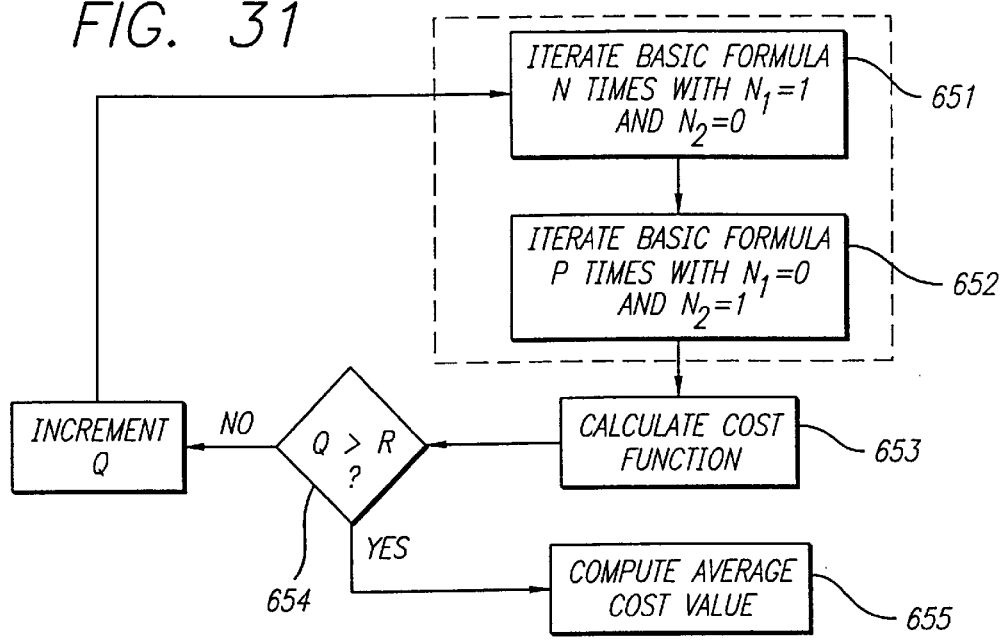
FIG. 31 is an illustration of the system which iterates a predetermined number of times, preferably once, calculating affinities.

As illustrated in FIG. 31, the system in step 651 iterates a predetermined number of times, preferably once, calculating the above affinities with $\mu_1$ equal to one and equal to zero. This iterative procedure produces affinities and cells which are then repositioned based on the combined neighborhood and capacity affinities. Subsequently, the system in step 652 performs a predetermined number of optimization iterations with $\mu_1$ equal to zero and $\mu_2$ equal to one, moving the cells based on cut and capacity affinities. The first iterative procedure involving neighborhood and capacity affinities combined with the second iterative procedure entailing cut and capacity affinities define a major iteration. After this major iteration, the system in step 653 calculates the value of the cost function. The preferred cost function is wire length.

After computing the cost function, the system performs a predetermined number of major iterations and calculates the cost function after each major iteration. The preferred number of major iterations and cost function calculations is six. After this predetermined number of major iterations and cost function value calculations, the system computes the average cost value for all of the costs calculated in the previous steps. This procedure steps through different affinity evaluations and obtains a preferred overall movement of cells on the surface abstraction. The functional sieve optimization process is halted when two consecutive cost average function values satisfy a given accuracy, such as $10^{-3}$ or $10^{-4}$.

During the discrete placement procedure described above, the $\mu_1$ parameter is utilized in a larger number of iterations than the $\mu_2$ parameter. Subsequently, the system performs several iterations with $\mu_1$ equal to zero. The entire block is iterated a predetermined number of times in this discrete placement procedure, typically three to five times.

During final placement, a crystallization procedure produces fine placement of the cells after the aforementioned functional sieve procedure is completed. The system uses a small non-zero value, such as $10^{-2}$, for $\mu_1$ a predetermined number of times, such as once, in the major iteration and the zero value several times. This procedure produces a detailed placement of cells.

An alternate embodiment of the current functional sieve alters the multiplying factors for the various affinities. Such an embodiment is particularly useful in crowded net situations, and emphasizes cross cuts while taking advantage of open nets.

The basic equation for the alternative embodiment is:

$$Aff(v, \Delta_i, \Delta_j) = $$
$$\mu_1 * AffNeighborhood(v, \Delta_i, \Delta_j) + [(1 - \beta) * AffHP(v, \Delta_i, \Delta_j) + $$
$$\beta * AffCut(v, \Delta_i, \Delta_j)] + \mu_2 * QEF(v) * AffCap(v, \Delta_i, \Delta_j)$$

where $\beta$ is a number between zero and one, depending on the emphasis desired placed on the number of cuts.

The affinity combinations disclosed within this functional sieve operation are not limited to those disclosed here, and may include other combinations using other weighing factors. Such an alternate weighing and affinity scheme would produce a desirable placement of cells and still within the scope of the present invention.

Section 13: Coarse Overflow Remover (Bulldozer)

A coarse overflow remover procedure is applied on the highest level of the chip core region hierarchy when each region contains a piece of only one column. The list of cells is scanned in the order of decreasing heights in order to find a new region for each of them. A list of cells in order of decreasing cell height is made. If the height of a cell is smaller than the available space in the corresponding column segment, then the cell retains its location. Most of the cells will keep their previous positions if the initial cell density is acceptable.

Figure 33:
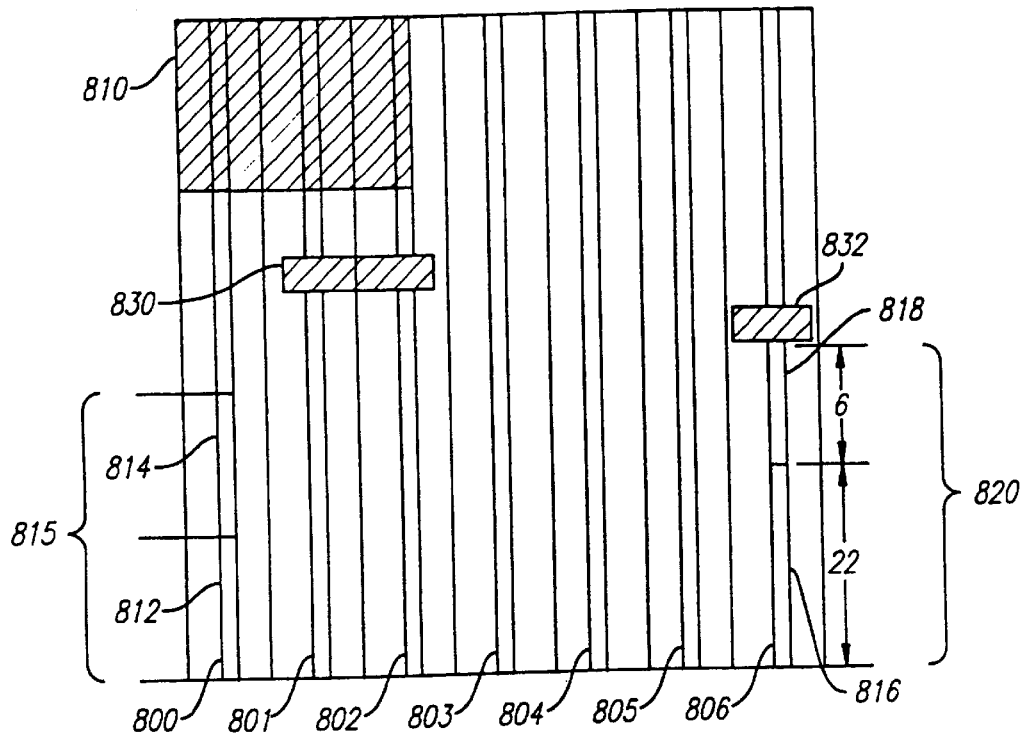
FIG. 33 is an illustration of a portion of the chip that has seven columns which are partitioned into maximal segments without blockages.

FIG. 33 represents a portion of the chip that has seven columns 800–806. As shown in FIG. 33, the cell columns 800–806 are partitioned into maximal segments without blockages. A plurality of megacells 810 may be located in the upper left corner. The megacells 810 are shown to extend across the columns 800–802. A first blockage 830 extends across the second and third columns 801 and 802, and a second blockage 832 extends across the column 806. Column 800 has two adjacent regions 812 and 814 that are assigned to a single column segment 815. Each of the column segments actually consists of a few regions, and each region belongs to exactly one of the segments. For each segment the total height of all cells assigned to the segment is retained. For example, The column 806 segment includes a region 816 that has a cell height of twenty-two and an adjacent region 818 that has a cell height of six. Therefore, the column segment 806 includes a column segment 820 that has a cell height of twenty-eight. This process is applied only to cells that have been already scanned, i.e. in the beginning of the process all those sums are equal to 0.

Figure 34:
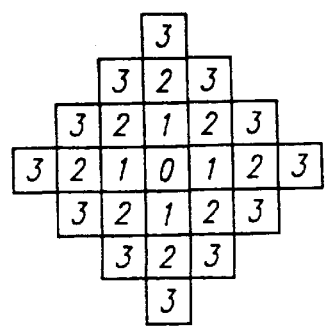
FIG. 34 is a preferred order for scanning the regions.

The capacity of a column segment is its height. The next cell from the list will get a new position according to the following rule: look for the closest (using Manhattan distance) region to the current cell so that the corresponding column segment will not have an overflow capacity if the next cell is assigned to that region. A preferred order for scanning the regions is shown in FIG. 34. First consider the original region (marked with the numeral 0) and then consider the regions having a distance of 1, then consider the regions having a distance of 2, etc.

This step considers only cells that already were assigned new positions and the current one. Usually, a cell is going to stay on the old position. As soon as the region is found that satisfies this condition, the region scanning is stopped, and assign the cell to that region. If the original region satisfies the condition, the cell is reassigned to the original region.

Section 14: Overlap Remover with Minimal Noise

Figure 35:
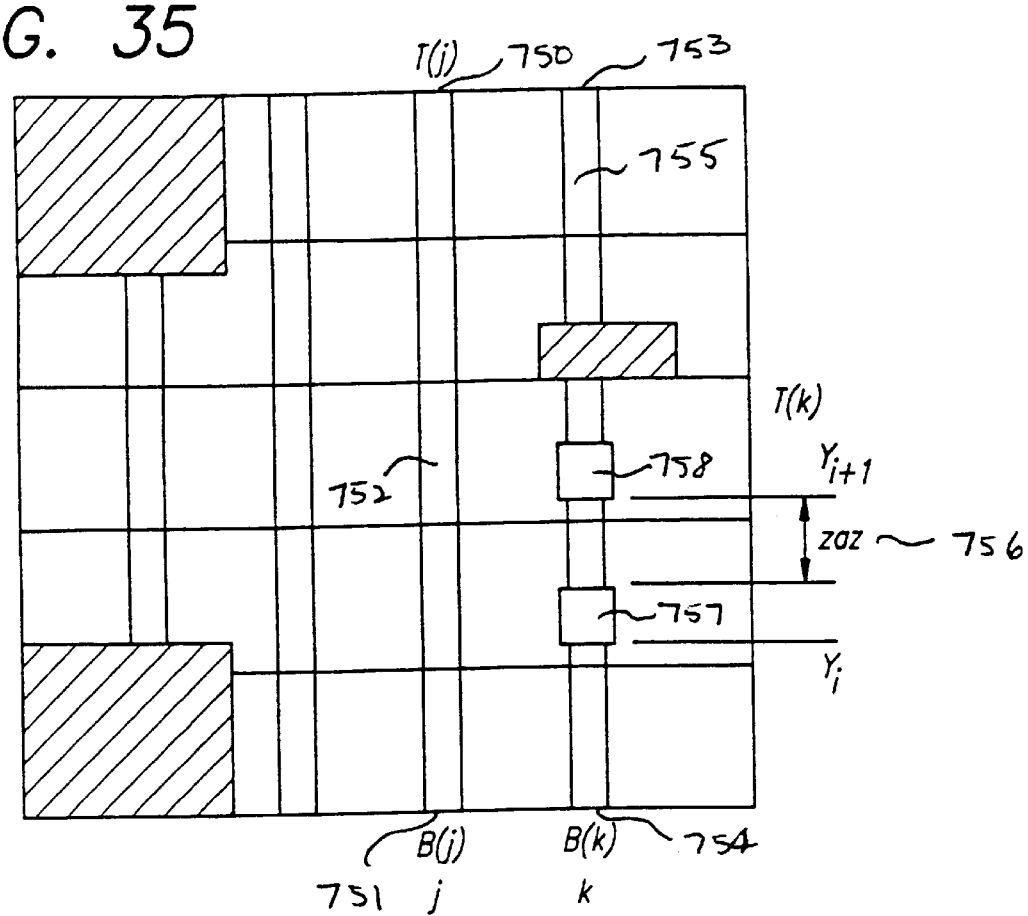
FIG. 35 is an illustration that denotes the top and bottom of the column.
Figure 36:
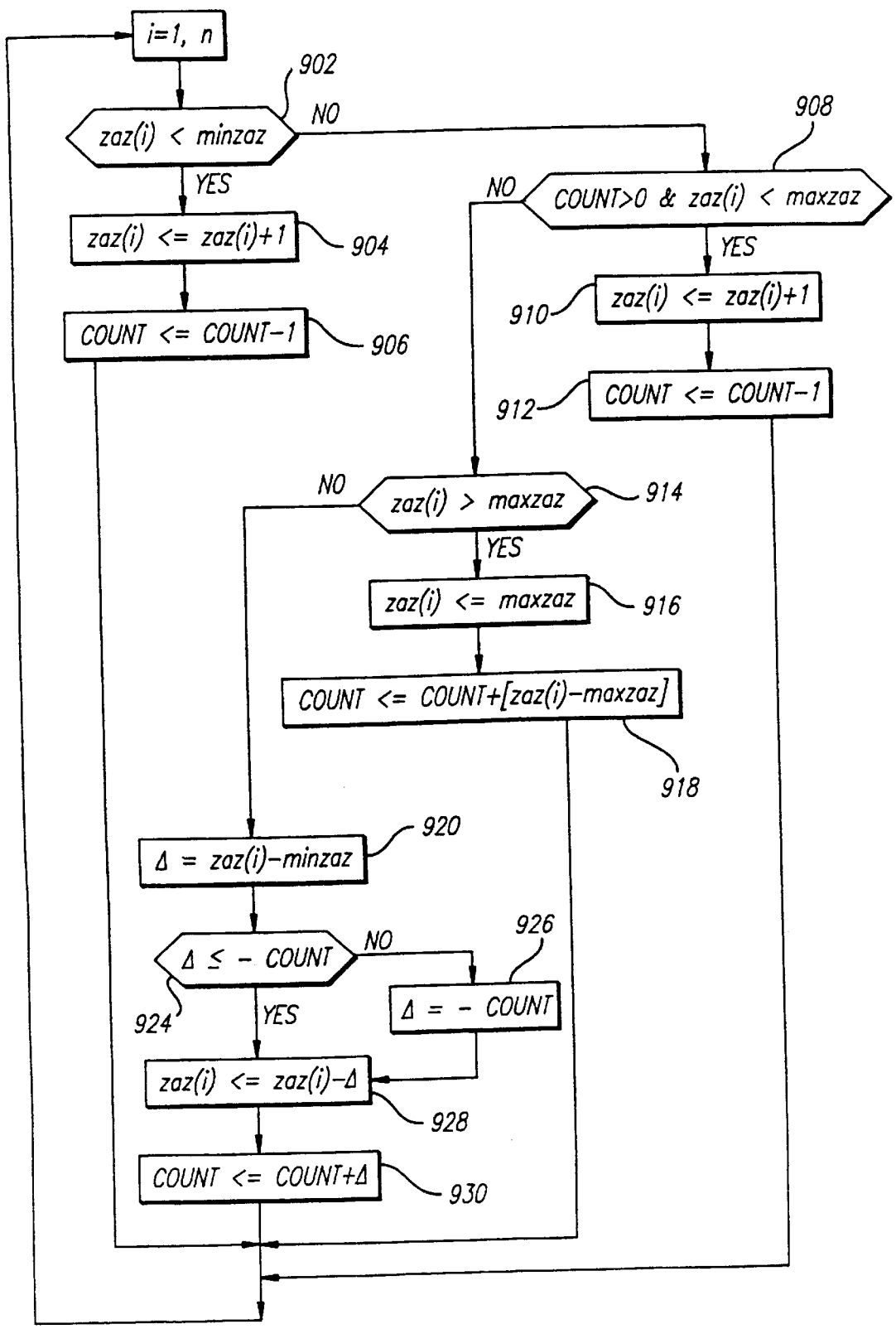
FIG. 36 is a flowchart of a preferred process adjusting cell spacing in the column to remove overlap with minimal noise.

The purpose of this process is to smoothly remove cell overlap with minimal increase of the wire length. FIG. 36 is a flow chart of an overlap remover according to the invention. The overlap remover process is applied separately to each column of cells. It is assumed that each column is continuously connected with no blockages between cells of the same column. As shown in FIG. 35, denote the top and bottom of the column with index j by T[j] and B[j], respectively. Similarly the top and bottom of column k are denoted by T[k] and B[k], respectively. The vertical grid step is used as the unit of measure.

First the cells in a column are sorted in the order of increasing cell bottom y coordinates. Denote cells in that order by $$v_1, v_2, \ldots v_n$$

The bottom coordinates of these cells are $$Y_1 \leq Y_2 \leq \ldots \leq Y_n$$

As shown in FIG. 35, the parameter zaz is defined as the distance between the top of one cell in a column and the bottom of the next cell upward. There must be at least one grid space between adjacent cells to have a feasible layout.

Figure 37:
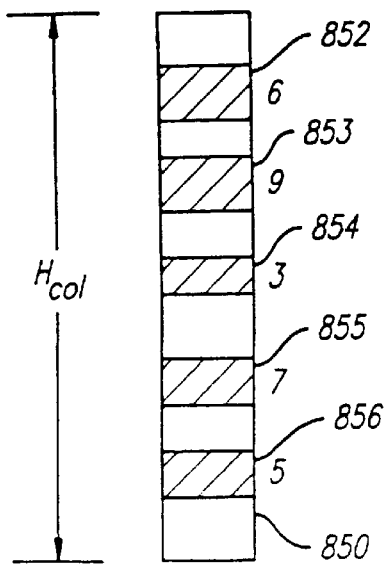
FIG. 37 illustrates a column containing cells of specified heights.

FIG. 37 illustrates a numerical example. Suppose a column 850 has a height $H_{col}$=60 and that the column 850 consists of five regions 852–856 that contain cells with heights of 5, 7, 3, 9 and 6, respectively. The total cell height is $$H_{cell} = \sum_{v \in column} height(v_i).$$

$$H_{cell} = 5 + 7 + 3 + 9 + 6 = 30$$

The average extra space per cell is now calculated as $$\frac{H_{col} - H_{cell}}{\text{total no. of cells} + 1} = \frac{60 - 30}{5 + 1} = 5.$$

The parameter minzaz satisfies the condition $$minzaz < \frac{H_{col} - H_{cell}}{\#cells + 1}.$$

Therefore, for the example given a possible value for minzaz is 3.

The following array is calculated:

$$zaz[0]=Y_1-B[j]; \ zaz[n]=T[j]-Y_n$$

$$zaz[i]=Y_{i+1}-Y_i-NormH[v_i]; \ i=1, 2, \ldots, n-1,$$

where Norms $[v_i]$ is the cell height in grids.

The parameter of the overlap remover process is integer values of minzaz, which can be positive or negative. The process further includes the step of modifying the array zaz such that all its elements are not less than minzaz. The array elements are processed forward and backward alternately. The following procedure is executed:

(a) At the beginning of the process the counter is initialized to zero. If the processing element is less than minzaz, then the element is increased by 1 and the counter is decreased by 1 and the next element is processed.

(b) If the element is greater than minzaz and also positive, but the counter is negative, then the counter is increased by 1 and the element is decreased by 1. The steps (a) and (b) are repeated until the condition is satisfied. Then we proceed with the next element.

(c) If all elements became not less than minzaz [zaz(i) $\geq$ minzaz) and the counter has zero value, the process is stopped. The cells are moved in one grid interval increments until the condition is satisfied.

FIG. 36 is a flowchart of a preferred process adjusting cell spacing in the column to remove overlap with minimal noise. The process of adjusting cell spacing begins with a step 900 where all movable cells from i=1 to i=n are to be considered. For each cell i, the spacing zaz(i) between the top of cell i and the bottom of cell i+1 is compared to minzaz in a process step 902. If zaz(i) is less than minzaz, then zaz(i) is replaced with zaz(i) plus one grid step (zaz(i)$\Leftarrow$zaz(i)+1) in a process step 904. A counter is then decremented by one in a process step 906. The foregoing steps 900, 902, 904 and 906 are repeated until zaz(i) is not less than minzaz.

If zaz(i) is not less than minzaz, then a process step 908 compares zaz(i) a parameter maxzaz, where maxzaz is the largest value of zaz(i) that will be permitted on the chip. If zaz(i) is less than maxzaz and the count is greater than 0, then zaz(i) is replaced by zaz(i) plus one grid step (zaz(i)$\Leftarrow$zaz(i)+1) in a process step 910. The counter is then decremented by one in a process step 912, and the foregoing steps 902, 908, 910 and 912 are repeated until the count becomes zero.

The remaining situation to be considered is when zaz(i) is not less than minzaz and the condition count>0 and zaz(i)<maxzaz is not satisfied. In a process step 914 zaz(i) is compared to maxzaz. If zaz(i) is greater than maxzaz, then zaz(i) is replaced by maxzaz in a step 916. The count then is incremented by the quantity [zaz(i)−maxzaz] in a step 918. The steps 902, 908, 914, 916 and 918 are repeated for the selected cell until the condition zaz(i)>maxzaz of step 914 is not satisfied.

The process of adjusting cell spacing then proceeds to a step 920 where a parameter $\Delta$ is defined such that $\Delta$=zaz(i)−minzaz. Then in a step 924 the parameter $\Delta$ is compared to the negative of the count to determine whether $\Delta \geq$−count. If $\Delta$ is not less than or equal to −count, then the parameter $\Delta$ is set equal to −count in a step 926; and the process proceeds to a step 928. If in the step 924, the parameter $\Delta$ is less than or equal to −count, then the process proceeds to the step 928 where zaz(i) is replaced with zaz(i)−$\Delta$. The count is then incremented by parameter $\Delta$ in a step 930, and the process of adjusting cell spacing is completed.

The result of adjusting the cell spacing in accordance with this preferred process is that overlap between cells is removed and spacing that were too large have been reduced to acceptable values. Cells that previously overlapped now have a spacing zaz(i) of one grid space. Cells that were too far apart now have spacings zaz(i) such that minzaz$\leq$zaz(i)$\leq$maxzaz.

After finishing the procedure the cell coordinates are modified:

$$Y_1=B[I]+zaz[0];$$

$$Y_i=Y_{i-1}-NormH[v_i]+zaz[i-1],$$

For i=2,3, . . . ,n.

Section 15: Sinusoidal Optimization

This procedure significantly levelizes the cell density with almost no increase in wire length. The ColKey parameter has been discussed above in the section that describes the density-driven capacity penalty system. For the sinusoidal optimization procedure the ColKey parameter should be set to 1. Setting the ColKey parameter to 1 means that the height of a cell is distributed over all regions with which the cell overlaps. Precisely, if the cell has been assigned to the highest level hierarchy region with an index j, it is assumed that the cell center is in the center of the region. Depending on the real height of the cell, the occupancy is updated for all regions the cell with which the cell overlaps.

The region occupancy is updated after every cell move. Because the number of cells higher than the smallest region height is relatively small, updating the region occupancy is not going to affect the complexity of the optimization. In addition to the basic region capacity penalty, which is calculated taking into account real cell dimensions as described above, the segment column capacity penalty is also used now. It is necessary to consider the capacity penalty to achieve more uniform distribution of big cells on the chip.

The main block of the sinusoidal optimization procedure comprises a number of big iterations of the discrete placement optimization described previously herein with reference to FIGS. 21 and 22. Denote that main block by Optim (k), where k is the number of iterations. The main parameter is the capacity penalty influence parameter $\lambda$, which has been described previously with reference to FIGS. 23 and 24. The value of the capacity penalty influence parameter $\lambda$ will be changed during the sinusoidal optimization process.

Steps that preferably are included in the sinusoidal optimization procedure are as follows:

```
{
  Optim(m);
  λ = λ · l
  Optim(2 · m);
  λ = λ · l
  Optim(m)
  λ = λ/l
  Optim(2 · m);
  λ = λ/l
}.
``` where m and l are predetermined integer parameters. Typically m is one of the numbers 6 to 10, and λ is 2. This sinusoidal optimization procedure typically is iterated in combination with the other levelizing procedures described herein, specifically, the dispersion-driven leveling system described in §16.

There are two types of sinusoidal optimization. One type is unconstrained and contains standard discrete placement optimization. The other type of sinusoidal optimization controls cell column densities inside the discrete placement optimization.

Section 16: Dispersion—Driven Levelizing System

Figure 32:
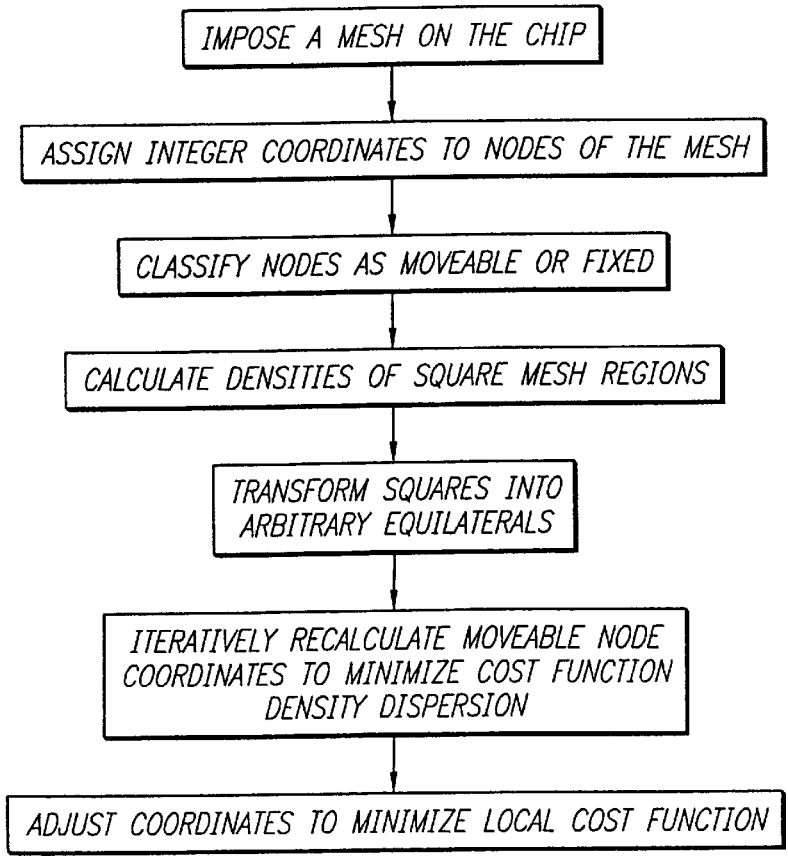
FIG. 32 is a flowchart associated with the density driven spring system.

This procedure does smooth continuous cell density levelization on the chip and is illustrated by FIG. 32. First, a new coordinate system is introduced on the chip by imposing a mesh on the chip and assigning integer coordinates to the nodes of the mesh. The nodes of the mesh are classified as to whether they are movable or fixed. Nodes of a square that overlaps with a blockage or a megacell are fixed. All other nodes are movable.

The densities of the square regions are calculated as a sum of portions of the height of the cells that overlap the region.

After coordinates are assigned to the nodes of the square mesh, the node coordinates are transformed such that the squares defined by the mesh are deformed into arbitrary equilaterals. A constraint on the deformation of the mesh is that regions that overlap with megacells are not deformed.

The coordinates of the movable nodes are iteratively recalculated to minimize the special cost function density dispersion. To speed up the convergence, the whole optimization procedure is organized hierarchically. Starting from the mesh square regions the hierarchy is built up using quadragrouping (reverse quadrasection).

On the hierarchy level k denote by den(k, i, j) the density of the region (k, i, j), and by s(k, i, j) the area of the region. The total density DEN will be the sum of the densities of the regions for all i and j.

$$DEN = \sum_i \sum_j den(k, i, j)$$

If the total available core area is a fixed number S, then define $$M = \frac{DEN}{S}$$

The density dispersion D is then given by $$D = \frac{1}{M} \sqrt{\sum \sum \frac{s(k, i, j)}{S} \cdot \left(\frac{den(k, i, j)}{s(k, i, j)} - M\right)^2}$$

which is the cost function. The dispersion is minimized by doing coordinate node local moves. Suppose the node is not on the core border and therefore has four adjacent regions. Then for each node A with coordinate (x, y) the local average density is computed as $$M(A) = \frac{\sum_1^4 den_i}{\sum_1^4 s_1(x, y)}$$

where $den_i$ are the densities of the four adjacent regions, and $s_i(x,y)$ are the areas of the images after deformation of the original regions assuming A has coordinates (x,y).

The local cost function is defined as $$\sum \frac{s_i(x, y)}{s} \left(\frac{den_i}{s_i(x, y)} - M(A)\right)^2$$

The coordinates for A are chosen in order to minimize the local cost function. An algorithm for minimizing the local cost is to separately move each point A(x,y) a distance δ to the left or right (up or down for the y coordinate). The value of δ can change with each coordinate. The value of the cost function is calculated for each move. In each local region the set of the coordinates that minimizes the cost function is chosen for the cells.

After all of the global levelization steps have been performed, there may still be some density "peaks" in the core region of the chip. The bulldozer procedure described above may be applied to remove these peaks. Finally, the sinusoidal optimization procedure is applied again to the chip surface, which is by now subdivided into cell columns. Reapplying the sinusoidal optimization process ensures that the cells will be evenly assigned to the columns as required by the structure of the final design.

Section 16A: Efficient MultiProcesing Of Cell Placement Algorithms

An exemplary integrated circuit chip is illustrated in FIG. 2 and generally designated by the reference numeral 26. For cell placement purposes, the entire integrated circuit 26, including all of its components may be processed under one of the placement algorithms discussed above. It is also possible to process a subset or a sub-area of the circuit 26. For the purposes of this discussion, the phrase "core area" will refer, in this section of the specification and its related claims, to the area of the integrated circuit 26 which is being processed for optimal cell placement.

Figure 39:
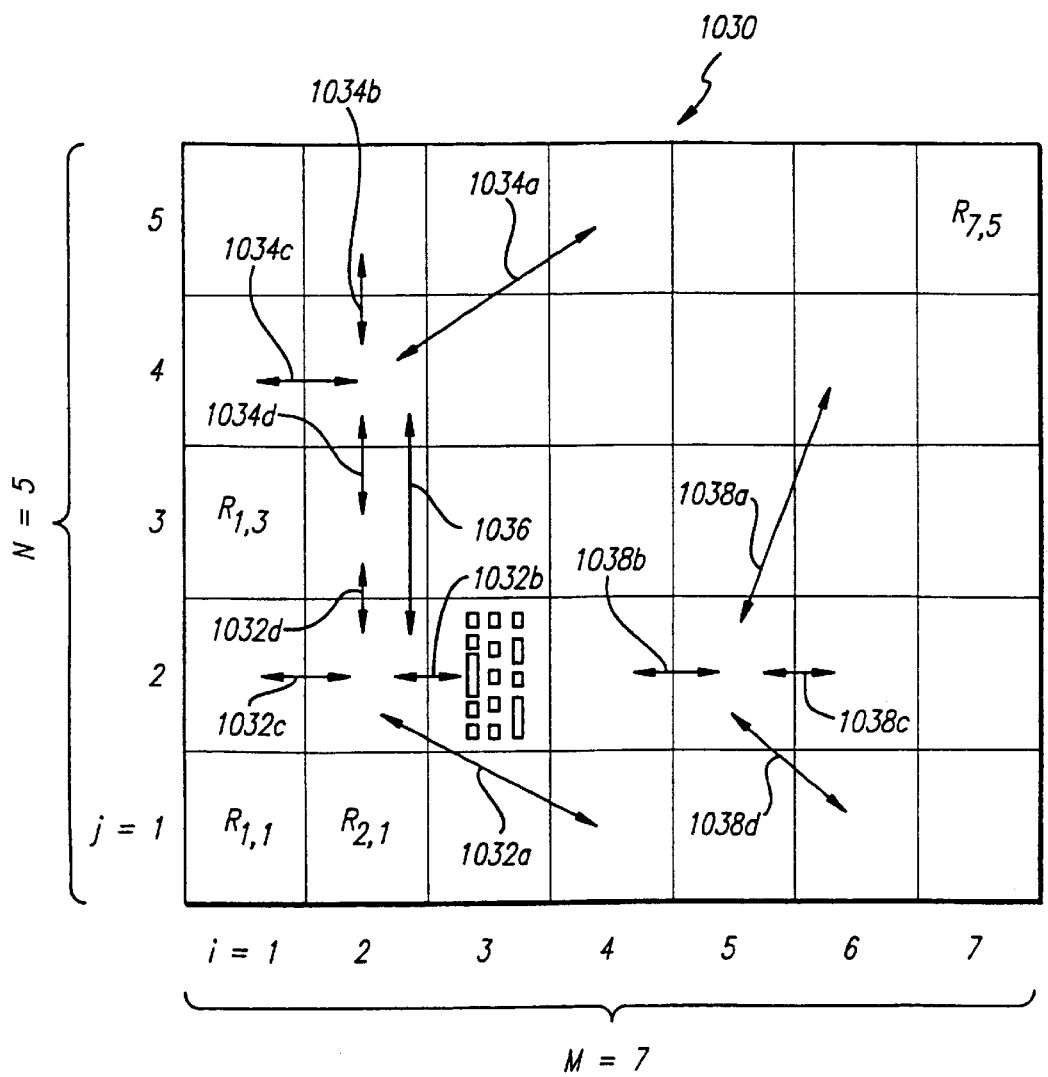
FIG. 39 illustrates a possible partitioning of a core region.

FIG. 39 illustrates one possible partitioning of a core area 1030 into a plurality of regions. Although the regions may be of any shape and configuration, FIG. 39 shows the core area 1030 being divided into a rectangular grid of seven (7) columns and five (5) rows. The number of columns, denoted as M, and the number of rows, denoted as N, may be arbitrarily assigned. Typically, however, M is set as one half of the number of cell columns in the core area, and N is set as the same number, resulting in a square grid.

To simplify the discussion, this specification will refer to each of the regions of the grid as $R_{i,j}$ where i refers to the column and j refers to the row on which the region $R_{i,j}$ is located. Again, referring to FIG. 39, the region located at the bottom, left corner of the core area 1030 is identified as $R_{1,1}$, the region adjacent to and to the right of $R_{1,1}$ is identified as $R_{1,2}$. Also in FIG. 39, regions $R_{1,3}$ and $R_{7,5}$ are identified. For simplicity, other regions are not specifically identified. In addition, each of the regions contain a large number of cells to be placed. Cells are not shown by FIG. 39, except that a representation of cells is shown in region $R_{3,2}$.

FIG. 39 also illustrates cell swaps between regions of the core area 1030, which are required by the optimization process to improve the fitness of the placement. The cell swaps are represented by double-pointed arrows 1032a, 1032b, 1032c, 1032d, 1034a, 1034b, 1034c, 1034d, 1036, 1038a, 1038b, 1038c, 1038d.

For the purposes of our discussion, it is assumed that three (3) processors—$P_1$, $P_2$, and $P_3$—are used to process simultaneously the cell placement algorithm.

If the regions are assigned to the processors sequentially, then the order in which the regions are processed and the processor assignments to the regions might be as shown below in Table 16A(1).

TABLE 16A(1)

| Row | | | | | | | |
|---|---|---|---|---|---|---|---|
| 5 | 5($P_2$) | 10($P_1$) | 15($P_3$) | 20($P_2$) | 25($P_1$) | 30($P_3$) | 35($P_2$) |
| 4 | 4($P_1$) | 9($P_3$) | 14($P_2$) | 19($P_1$) | 24($P_3$) | 29($P_2$) | 34($P_1$) |
| 3 | 3($P_3$) | 8($P_2$) | 13($P_1$) | 18($P_3$) | 23($P_2$) | 28($P_1$) | 33($P_3$) |
| 2 | 2($P_2$) | 7($P_1$) | 12($P_3$) | 17($P_2$) | 22($P_1$) | 27($P_3$) | 32($P_2$) |
| j = 1 | 1($P_1$) | 6($P_3$) | 11($P_2$) | 16($P_1$) | 21($P_3$) | 26($P_2$) | 31($P_1$) |
| | i = 1 | 2 | 3 | 4 | 5 | 6 | 7 |
| | Column | | | | | | |

The entire Table 16A(1) represents the core area 1030 of FIG. 39, and each of the rectangular areas of the table represent the corresponding rectangular region of FIG. 39. In the table, each of the regions has a number. The number corresponds to the region's rank in the order of processing. The specific processor which will process the cells of the region is also identified. Table 14(B)2 below sets forth the order in which the cells of the regions are processed by the processors.

TABLE 16A(2)

| Iteration | Set of regions simultaneously processed by $P_1$, $P_2$, and $P_3$ |
|---|---|
| 1 | $R_{1,1}$, $R_{1,2}$, and $R_{1,3}$ |
| 2 | $R_{1,4}$, $R_{1,5}$, and $R_{2,1}$ |
| 3 | $R_{2,2}$, $R_{2,3}$, and $R_{2,4}$ |
| ... | ... |
| 11 | $R_{7,1}$, $R_{7,2}$, and $R_{7,3}$ |
| 12 | $R_{7,4}$ and $R_{7,5}$ |

Under the cell placement process described above, the first set of regions $R_{1,1}$, $R_{1,2}$, and $R_{1,3}$ is processed by the three processors simultaneously. Then, the second set of regions is processed simultaneously, followed by the simultaneous processing of the third set of regions, and so on. However, as is discussed in detail below, simultaneous processing of the third set of regions—$R_{2,2}$, $R_{2,3}$, and $R_{2,4}$—generates the area-conflict, local optimum, and deadlock problems described above.

As illustrated by FIG. 39, regions $R_{2,2}$, $R_{2,3}$, and $R_{2,4}$ require the indicated cell movements, or cell swaps, to increase the fitness of the placement. The required cell movements are detailed in Table 16A(3) below.

TABLE 16A(3)

| R2,2 | Cell movements 1032a between $R_{2,2}$ and $R_{4,1}$; |
|---|---|
| | Cell movements 1032b between $R_{2,2}$ and $R_{3,2}$; |
| | Cell movements 1032c between $R_{2,2}$ and $R_{1,2}$; |
| | Cell movements 1032d between $R_{2,2}$ and $R_{2,3}$; and |
| | Cell movements 1036 between $R_{2,2}$ and $R_{2,4}$. |
| R2,3 | Cell movements 1032d between $R_{2,3}$ and $R_{2,2}$; and |
| | Cell movements 1034d between $R_{2,3}$ and $R_{2,4}$. |
| R2,4 | Cell movements 1034a between $R_{2,4}$ and $R_{4,5}$; |
| | Cell movements 1034b between $R_{2,4}$ and $R_{2,5}$; |
| | Cell movements 1034c between $R_{2,4}$ and $R_{1,4}$; |
| | Cell movements 1034d between $R_{2,4}$ and $R_{2,3}$; and |
| | Cell movements 1036 between $R_{2,4}$ and $R_{2,2}$. |

In this scenario, three sets of area-conflict problems arise. The first area-conflict is between $P_1$ (processing $R_{2,2}$) and $P_2$ (processing $R_{2,3}$). Both $P_1$ and $P_2$ are attempting to make cell movements 1032d into and out of the region being processed by the other processor. Likewise, due to the cell movements 1036, the second area-conflict is between $P_1$ and $P_3$ (processing $R_{2,4}$). The third area-conflict is between $P_2$ and $P_3$ due to the cell movements 1034d. Because of these conflicts, the parallel processing cannot be accomplished simultaneously. This is because at least one of the processors must wait for another to complete the cell movements in the conflicting regions before processing its own cells.

By constraining cell movements to adjacent regions only, the cell movement 1036 is eliminated from consideration, and the area-conflict between $P_1$ (processing $R_{2,2}$) and $P_3$ (processing $R_{2,4}$) is eliminated. However, the restriction of the movement of cells only to adjacent regions may eliminate cell movements which could result in a better overall fitness (global optimum). This is because the restriction traps the optimization process at an undesirable local optimum solution. In FIG. 39, if the cell movements are restricted to adjacent cells only, movements 1032a, 1034a, 1036, and 1038a are eliminated.

The final problem arising out of the current scenario is a possibility of a deadlock between the processors. If, for example, $P_1$ is waiting for $P_2$ to complete the cell movement 1032d, $P_2$ is waiting for $P_3$ to complete the movement 1034d, and $P_3$ is waiting for $P_1$ to complete the movement 1036, a deadlock is created.

All three problems discussed above can be minimized, or eliminated, if any two processors are, at any one time, operating sufficiently distant from each other to avoid area-conflicts. Automated assignments of regions to multiple processors for simultaneous processing such that the regions are sufficiently distant to avoid area conflicts is an important aspect of the present invention. The assignment is accomplished as follows: (1) dividing the core area into a plurality of rectangular regions of M columns by N rows; (2) determining the "interval parameter" for both the columns and for rows; and (3) determining a sequence in which the rectangular regions are to be processed such that each set of simultaneously processed regions contains regions which are sufficiently distant from each other to avoid conflicts.

Consequently, when the multiple processors are assigned to the regions, each of the processors will be processing cells of a region far enough from the other regions being processed at that time such that area-conflict and deadlock problems are greatly reduced. In addition, the need to restrict the movements of cells, which creates local optimum problem, is also eliminated.

Figure 40:
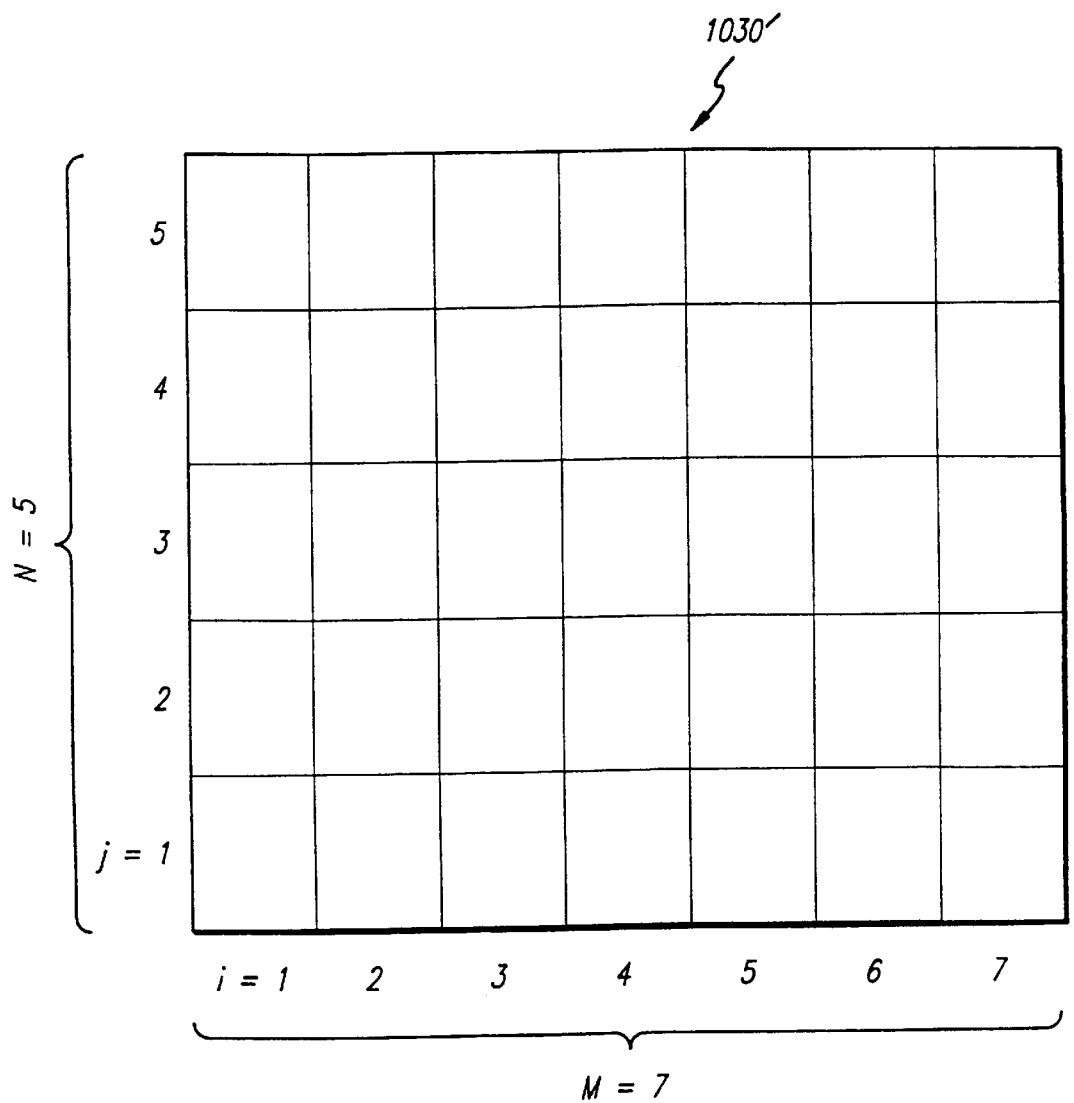
FIG. 40 illustrates an embodiment of the core region partition in accordance with the present invention.

The number of columns M and the number of rows N are predetermined and can be arbitrarily set. However, the value of M is typically set as one half of the number of cell columns in the core area, and the value of N is typically equal to M. FIG. 40 shows the core area 1030' which has been divided into 35 rectangular regions with M=7 and N=5. The rectangular regions of the core area 1030' are still referred to as $R_{i,j}$ where i indicates the column and j indicates the row of the position which the region occupies.

The column "interval parameter," denoted KX, may be any number greater than one and less than M. The row "interval parameter," denoted KY, may be any number greater than one and less than N. The interval parameters are used in sequencing the rectangular regions as will be discussed more fully below. Although KX and KY may be assigned arbitrary values within the respective limits, it has been found that good choices for KX and for KY are:

| | |
|---|---|
| $KX = KY = \frac{1}{2}((MN/3)^{**}\frac{1}{2})$ | if the number of columns of cells in the core area is less than 100; and |
| $KX = KY = \frac{1}{2}((MN/2)^{**}\frac{1}{2})$ | if the number of columns of cells in the core area is greater than or equal to 100. |

Figure 41:
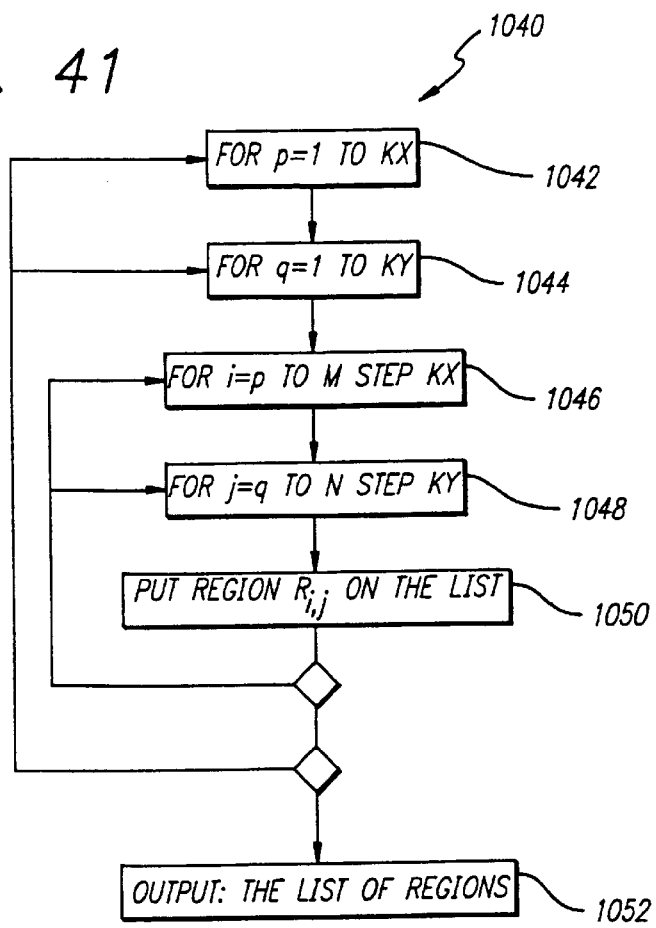
FIG. 41 is a flow-chart illustrating a method of sequencing core area regions in accordance with the present invention.

Referring now to FIG. 41, a flowchart 1040 outlines the steps which may be used to create the desired sequence. The flowchart 1040 of FIG. 41 includes a plurality of nested loops indicated by lines ending with arrow points. This notation indicates that all of the steps included within each loop are to be performed for all outer loops.

To create the sequence, the first operation, as indicated by the reference number 1042 of FIG. 41, is to traverse columns one (1) through the $KX^{th}$ column using a first index, which will be denoted as p to facilitate this discussion.

For each of the columns traversed by p, a second index, denoted as q for the purposes of this discussion, is used to traverse the rows one (1) through the $KY^{th}$ row. This is indicated by the operation referred to by the reference number 1044.

As indicated by the operation 1046, for each of the columns traversed by p, denoted $C_p$ for the purposes of this discussion, the column index i is used to traverse the column $C_p$ and all the columns of the core area 1030', which is a multiple of KX columns away from $C_p$. Therefore, in general, the column traversal, for each value of the index p, will be:

$$C_p, C_{p+KX}, C_{p+2KX}, \ldots C_{p+nKX}$$

where $nKX \leq M$ and n is an integer multiple.

For the instant example, the column traversal will be for p=1: $C_1$, $C_4$, and $C_7$;

for p=2: $C_2$, and $C_5$; and for p=3: $C_3$, and $C_6$.

The index p will not reach 4 because KX=3.

Operation 1048 shows that, for each row traversed by q, denoted $W_q$ for the purposes of this discussion, the row index j is used to traverse the row $W_q$ and all the rows of the core area 1030', which is a multiple of KY rows away from $W_q$. Therefore, in general, the row traversal, for each value of the index q, will be:

$$W_q, W_{q+KY}, W_{q+2KY}, \ldots W_{q+nKY}$$

where $nKY \leq N$ and n is an integer multiple.

For the instant example, the row traversal will be:

for q=1: $W_1$, $W_3$, and $W_5$; and for q=2: $W_2$, and $W_4$.

The index q will not reach 3 because KY=2.

Using the indices i and j to traverse columns and rows in the above described manner, the sequence is created, as indicated by operation 1050, by adding the region $R_{i,j}$ to the sequence during the traversal. Finally, the list of the regions is finalized 1052 and output is created.

The above-described operations to produce a sequence of regions $R_{i,j}$ can be expressed using pseudo-computer programming language as follows:

```
for p = 1 to KX do
    for q = 1 to KY do
        for i = p to M step KX do
            for q = to N step KY do
                assign R_{i,j} to the list
            enddo
        enddo
    enddo
enddo
```

Alternatively, using a repeat-until construct, the pseudo-program becomes:

```
p = 1
repeat
    q = 1
    repeat
        i = p
        repeat
            j = q
            repeat
                assign R_{i,j} to the list
                j = j + KY
            until j > N
            i = i + KX
        until i > M
        q = q + 1
    until q > KY
    p = p + 1
until p > KX
```

Utilizing the operations as described above, and using the values discussed previously, the core area 1030' of FIG. 40 will be processed in the sequence indicated by Table 16A(4) below.

TABLE 16A(4)

| Row | | | | | | | |
|---|---|---|---|---|---|---|---|
| 5 | 3(P$_3$) | 18 | 28 | 6 | 21 | 31 | 9 |
| 4 | 11 | 23 | 33 | 13 | 25 | 35 | 15 |
| 3 | 2(P$_2$) | 17 | 27 | 5 | 20 | 30 | 8 |
| 2 | 10 | 22 | 32 | 12 | 24 | 34 | 14 |
| j = 1 | 1(P$_1$) | 16 | 26 | 4 | 19 | 29 | 7 |
| | i = 1 | 2 | 3 | 4 | 5 | 6 | 7 |
| | Column | | | | | | |

The entire Table 16A(4) represents the core area 1030' of FIG. 40, and each of the cells of the table represents the corresponding rectangular region of the core area 1030' of FIG. 40. In the table, each of the regions has a number representing the region's rank in the processing order. The specific processor which will process the region is identified for the first three regions only. This is because once the sequence is determined, the regions are assigned to the processors as follows: (1) initially, each of the processors are assigned to the first available, unassigned regions in accordance with the sequence; (2) from then on, the next region to be processed according to the sequence is assigned to the next available processor. A processor becomes available when it finishes the processing of the cells of its currently assigned area.

In the instant example, the first three regions of the sequence, $R_{1,1}$, $R_{1,3}$, and $R_{1,5}$ are initially assigned to processors $P_1$, $P_2$, and $P_3$, respectively. Then, the next region of the sequence, $R_{4,1}$, is assigned to the first processor which becomes available. For example, if $P_2$ finishes processing of the cells of region $R_{1,3}$ before $P_1$ and $P_3$ finish processing their assigned regions, then $P_2$ is assigned to $R_{4,1}$, the fourth region of the sequence. Likewise, the fifth region of the sequence, $R_{4,3}$, is assigned to the next available processor, and so on.

The above described assignment technique increases the effectiveness of parallel processing because no processor has to wait idly for another processor to finish its operation before processing another region. The effect of the above discussed assignment technique on the overall performance of the placement algorithm is most evident when the number of cells in each of the rectangular regions varies or when processors are operating at different speeds from each other.

Table 16A(5) below sets forth one possible order in which the regions may be simultaneously processed by the processors.

TABLE 16A(5)

| Iteration | Set of regions simultaneously processed by $P_1$, $P_2$, and $P_3$ |
|---|---|
| 1 | $R_{1,1}$, $R_{1,3}$, and R1,5 |
| 2 | $R_{4,1}$, $R_{4,3}$, and R4,5 |
| ... | ... |
| 8 | $R_{2,2}$, $R_{2,4}$, and $R_{5,2}$ |
| ... | ... |
| 12 | $R_{6,2}$ and $R_{6,4}$ |

As Tables 16A(4) and 16A(5) illustrate, no two adjacent regions are processed simultaneously in this example. In particular, note that regions $R_{2,2}$, $R_{2,3}$, and $R_{2,4}$, which caused area-conflict, deadlock, and local optimum concerns under the old technique, are not processed simultaneously.

Under the new cell placement process described above, the first set of regions to be simultaneously processed by the three processors are $R_{1,1}$, $R_{1,3}$, and $R_{1,5}$. Then, the second set of regions are processed simultaneously, followed by the simultaneous processing of the third set of regions, and so on. In addition, after each iteration of simultaneous processing, a database or a list of cells located in each of the regions is updated to reflect the current location of each of the cells of the core area 1030'. However, it is possible, even under the new cell placement process, for some conflicts to exist. The eighth iteration of the new process, as detailed by Tables 16A(4) and 16A(5) may be used to illustrate the advantages of the new process even where some conflicts occur.

The eighth iteration of the cell placement process involves the regions $R_{2,2}$, $R_{2,4}$, and $R_{5,2}$ being processed simultaneously by processors $P_1$, $P_2$, and $P_3$, respectively. As FIG. 39 indicates, regions $R_{2,2}$, $R_{2,4}$, and $R_{5,2}$ require the cell movements, or cell swaps, to increase the fitness of the placement as detailed in Table 16A(6) below.

TABLE 16A(6)

| | |
|---|---|
| R2,2 | Cell movements 1032a between $R_{2,2}$ and $R_{4,1}$;<br>Cell movements 1032b between $R_{2,2}$ and $R_{3,2}$;<br>Cell movements 1032c between $R_{2,2}$ and $R_{1,2}$;<br>Cell movements 1032d between $R_{2,2}$ and $R_{2,3}$; and<br>Cell movements 1036 between $R_{2,2}$ and $R_{2,4}$. |
| R2,4 | Cell movements 1034a between $R_{2,4}$ and $R_{4,5}$;<br>Cell movements 1034b between $R_{2,4}$ and $R_{2,5}$;<br>Cell movements 1034c between $R_{2,4}$ and $R_{1,4}$;<br>Cell movements 1034d between $R_{2,4}$ and $R_{2,3}$; and<br>Cell movements 1036 between $R_{2,4}$ and $R_{2,2}$. |
| R5,2 | Cell movements 1038a between $R_{5,2}$ and $R_{6,4}$;<br>Cell movements 1038b between $R_{5,2}$ and $R_{4,2}$;<br>Cell movements 1038c between $R_{5,2}$ and $R_{6,2}$; and<br>Cell movements 1038d betweem $R_{5,2}$ and $R_{6,2}$. |

In this scenario, only one area-conflict problem exists. The area-conflict is between $P_1$ (processing $R_{2,2}$) and $P_2$ (processing $R_{2,4}$). Both $P_1$ and $P_2$ are attempting to make cell movements 1036 into and out of the region being processed by the other processor. No deadlock is possible in this situation because the area being processed by $P_3$ does not intersect with any areas being processed by processors $P_1$ and $P_2$. Finally, with a greatly decreased number of area-conflicts and no possibility of deadlocks, restrictions on the movements of cells are not necessary and are eliminated.

Section 17: Cell Placement Crystallization

The purpose of this procedure is to get final cell placement. First, the height of each cell is increased by one grid plus $\gamma_1$ percent of the remaining available space. Then, the dispersion driven levelizing system and the sinusoidal optimization procedures are iterated $k_1$ times (e.g. 5 times).

Now, the original height of each cell is increased by one grid plus a certain percentage of the remaining available space. For this purpose, 72% is preferable. Then the overlap remover procedure is executed with maxzaz set equal to the column height to ensure that there is no overflow in any of the connected column segments.

Next the positions of the large cells are fixed and then the sinusoidal optimization is executed for $k_2$ iterations where $k_2$ may be 10 for example.

Now the detailed coordinates of each cell are obtained. In the remaining part of the placement crystallization the following three procedures are iterated:

1. The vertical optimization is performed for k3 iterations. During one iteration, the list of cells is scanned. For each cell the change in the cost function is calculated if the cell is moved down for a (parameter). The change in cost function is calculated if the cell is moved up. The move that improves the cost function the most (if any) is performed.

2. Overlap remover with minimal noise.

3. Next $k_4$ iterations of optimal permutations are performed. In this process the cost function is calculated if vertically adjacent cells are interchanged. Any such change that improves the cost function is performed. Referring to FIG. 1, if two cells $C_1$ and $C_2$ are interchanged, the space between them is maintained the same as before the interchange. The area occupied by these two cells is kept at a constant value.

Figure 38:
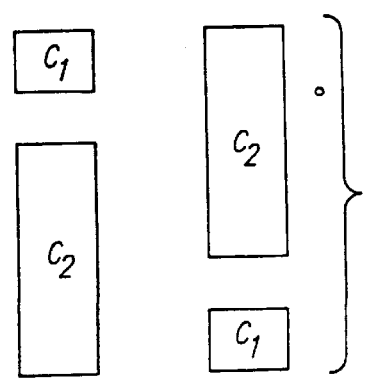
FIG. 38 is an illustration of the cells that are set to the grids by increasing the coordinate until the bottom of each cell reaches the closest horizontal grid line.

Finally, referring to FIG. 38, the cells are set to the grids by increasing the y-coordinate until the bottom of each cell reaches the closest horizontal grid line.

At this point, most of the cells are close to their final positions. The crystallization step places them in correct, final positions. Proper vertical cell spacings are computed, so that horizontal wires can be routed over and between cells in the vertical columns. Vertical and local-horizontal "swaps" may be performed if doing so improves the cost functions. Cells must be assigned proper geometric coordinates so that their positions correspond to legal grid positions specified by the underlying chip architecture. All of these steps are performed by the crystallization process described above, and the cells are frozen into their final positions. At this point, the placement process according to the invention system has completed its work. A data structure is prepared that can be read by a routing system (not shown) for chip routing and design completion.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

Section 18: Net Routing and Pin Connection

Figure 51:
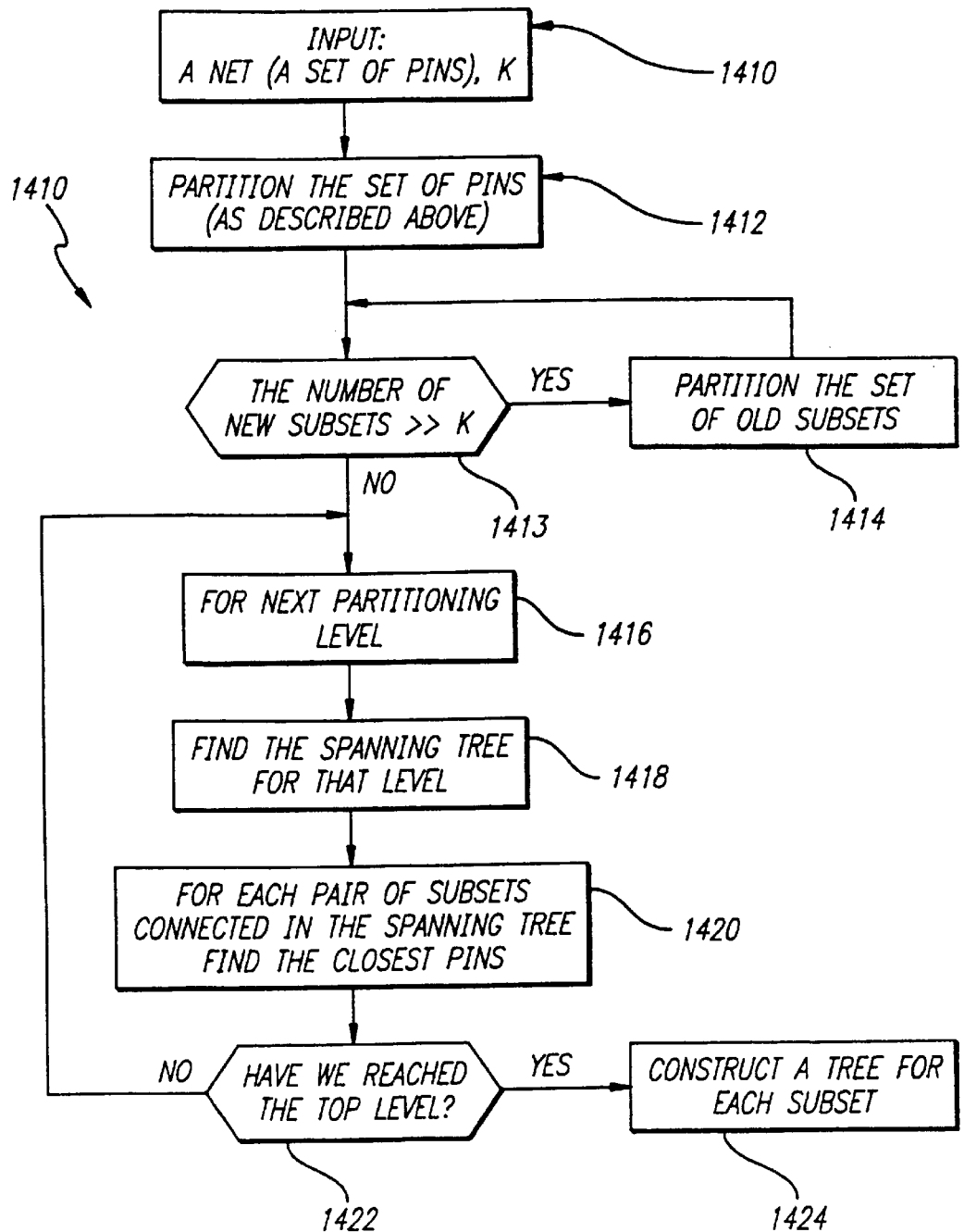
FIG. 51 is a flow-chart illustrating a method of organizing the pins of an integrated circuit in accordance with a preferred embodiment of the present invention.

Referring to FIG. 51, a flow chart 1409 of the figure illustrates the method of organizing the pins of a net in accordance with the present invention. As indicated by the reference numeral 1410, the net, or a set of pins, to route and the coordinates of each of the pins are provided into the system. Typically, the routing is performed after finalizing the placement of the cells on the integrated chip. Another given parameter is K which represents the size of the partitions into which the pins or subnets will be grouped for routing. K can be assigned any reasonable number which is less than the total number of pins of the net. In experiments, K of twenty (20) has shown to be preferable.

The step referenced by reference number 1412 indicates that the pins are partitioned into sets of pins, each set containing, at minimum, the number of pins indicated by parameter K. The method of partitioning, or grouping, the pins into sets of pins will be discussed in detail in the Partitioning Method subsection below. Partitioning pins of a net into groups of K creates a number of pin-partitions (pp's). Because the pins of the net may number in the order of thousands or more, partitioning of the pins into groups of K (20 in this example) creates a large number of pp's. Specifically, in this instance, the number of pp's is only one order of magnitude smaller than the number of pins themselves.

Therefore, the partition method is iterated with pp's as the elements of the new partition. This operation is identified by boxes 1413 and 1414 of FIG. 51. As indicated by boxes 1413 and 1414, partitioning of the sets is iterated, using the sets of the previous iteration as the elements of the meta partition, until the number of the partitions is in the same order of magnitude as K. Because of the iterative application of the partitioning of the pins, the set, and the meta sets, the resultant partition hierarchy can be logically represented as a partition tree.

For example, if K is 20 and the integrated circuit contains 4,000 pins to be routed, the first partitioning of the pins into groups of about 20 pins each results in approximately 200 pin partitions (pp's). Because 200 is much larger than 20, the pp's are partitioned into sets of about 20 pp's each, resulting in approximately ten (10) sets of pp's. In this example, the number of sets of pp's, ten, is in the same order of magnitude as K, therefore, no further iteration of the partitioning step is necessary.

After the partitioning of the pins, as indicated by boxes 1416 and 1418, a Minimum Spanning Tree (MST) is created for each level of the partition tree, commencing at the lowest level of the tree. For each level of the sets and the sets of the sets of the pins, a MST is created with the pp's as the vertices.

After creating an MST for each set of the pp's, the partitions of each set pp's are redefined to "link" the partitions of the sets connected by the edge of the MST. This operation is indicated by box 20 of FIG. 1.

The creation of the MSTs and the redefinition of the partitions to link the members of the sets are iterated 1422 for each level of the partition tree. When the top level of the partition tree is reached, 1422, then the top-level MST is created 1424.

To create a minimal spanning tree, any of the well known algorithms can be used. The inventors of the present invention has used Steiner's tree with good results. The details of the method to create an MST for any set of vertices is discussed in the Minimal Spanning Tree subsection below.

The partition tree is distinguishable from the minimal spanning tree. The partition tree represents the iterative partitioning of the pins into pp's, the pp's into sets, and the sets into meta-sets, and so on until the highest level of meta sets are formed. The MST represents the relationship, or interconnection between the sets and all of the members of any set.

For instance, at the lowest level, the pins are partitioned into pp's having, on average, approximately K pins belong to each pp's. After assigning the pins to the pp's, an MST is generated for each set whereby the pins of each of the sets are connected to the other pins of the set to minimize the traversal, or spanning of the pins of the set. Then, each of the sets of the pp's are thus connected, and so on.

The result of the above operations is a one large MST at the top level of the partition tree where each of the vertices of the top level MST represents, on average, approximately K number of sets. That is, each node of the top level MST represents, on average, approximately 20 (the value of K in the example) subnodes, each of which, in turn, represent, on average, about 20 sub-subnodes, and so on. At the leaf level of the MST, each of the pp's represents, on average, about 20 pins. In fact, all of the sets belonging to the same level of the partition tree represents roughly the same number of pins. Consequently, if the same number of nodes of the MST are assigned to each of the multiple processors, then the processors will have approximately same number of pins to connect. This leads to balanced work load among the processors and efficient implementation of parallel processing technique.

Furthermore, the routing process itself will be efficient because, as will be explained below, the present invention partitions the pins into clusters of pins near each other.

Partitioning Method

The pins of the net are partitioned as discussed below.

First, from each pin of the net as a center pin, a neighborhood is constructed. Each of the neighborhoods contains at least K pins of the net. The neighborhood is constructed for the centerpin as follows:

a. find the nearest pin from the center pin;

b. determine the distance (rectilinear distance is used in this example but Euclidean distance can be used) to the nearest pin;

c. define a bounding box to include the nearest pin;

d. if any other pins are included within the bounding box, include the other pins in the neighborhood; and e. if the neighborhood contains less than K pins, then find the next nearest pin (not yet a member of the neighborhood) and repeat the steps b to e.

Figure 52:
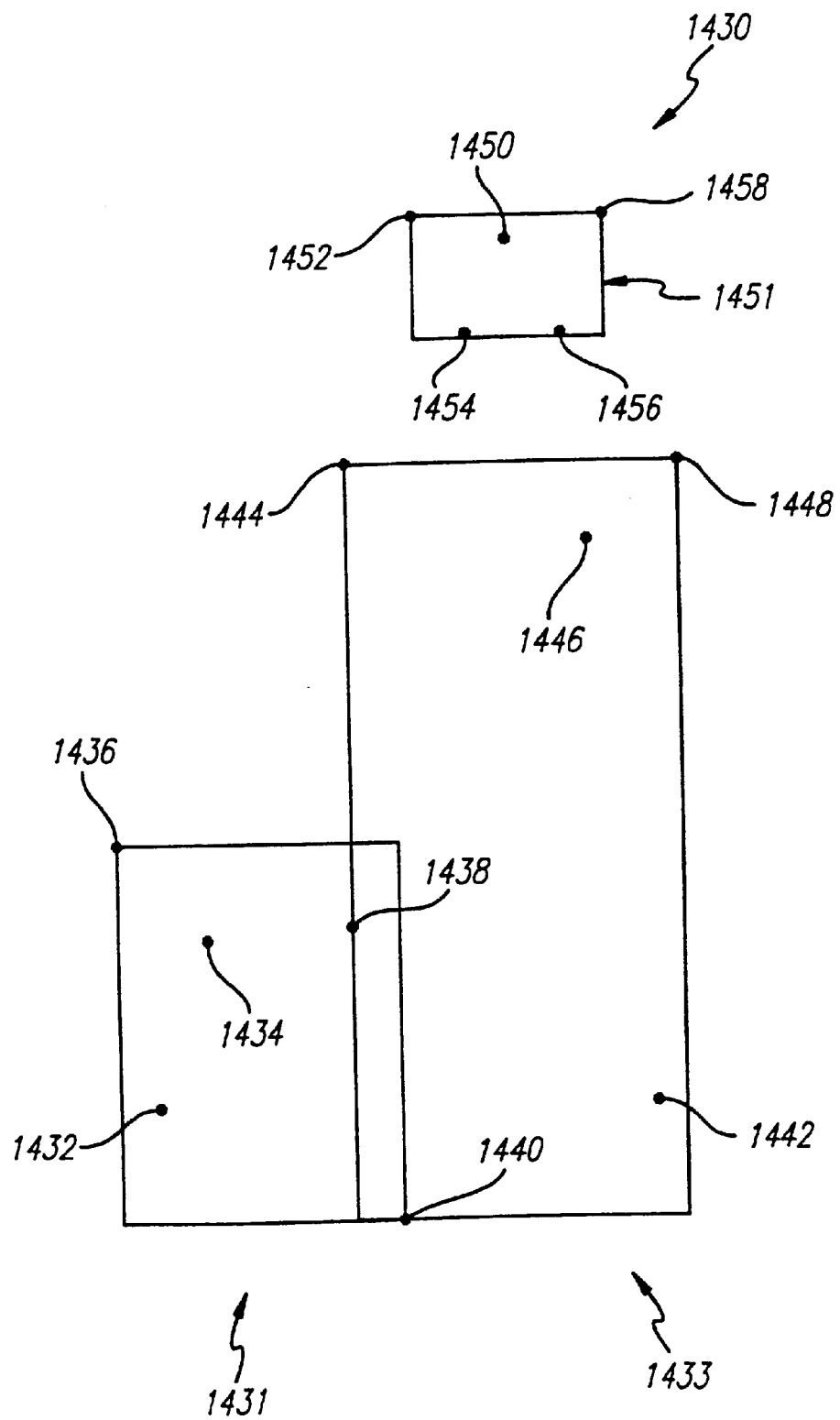
FIG. 52 illustrates construction of neighborhoods of pins in accordance with a preferred embodiment of the present invention.

Referring to FIG. 52, a sample net 1430 with fourteen (14) pins are shown. For simplicity of discussion, K is assumed to have a value of five (5). Also for simplicity, only three neighborhoods 1431, 1433, and 1451 are illustrated by the figure. Neighborhood 1431, with center pin 1432, was constructed by first including pin 1434, then, in order, pins 1446, 1438, and 1440 for a total of five (5=K) pins. Likewise, neighborhood 1451, with center pin 1450, was constructed by including, in order, pins 1456, 1458, 1454, and 1452 for a total of five (5=K) pins.

Neighborhood 1433, with center pin 1442, was constructed by first including pin 1440, then pin 1438, then pin 1446, then pins 1444 and 1448 at the same time, resulting in a total of six (6) pins which is greater than K pins. Neighborhood 1433 contains six pins because the inclusion of pins 1440, 1438, and 1446 resulted in only four (4) pins in its neighborhood, and the inclusion of pin 1448 caused the bounding box to expand to include pin 1444.

Second, the net is covered, or partitioned, with the neighborhoods with highest ratio between the number of pins in the neighborhood (not already used by another neighborhood) divided by the geometric area of the neighborhood. This ratio indicates how "clustered" the pins are. Because the number of pins in the neighborhood is approximately K, the determining factor is the geometric area of the neighborhood. A high ratio indicates that the pins of the neighborhood are clustered together within a small area. On the other hand, a low ratio indicates that the pins of the neighborhood are apart from each other.

The covering of the net is accomplished as follows:
  a. analyze each of the neighborhood to determine its ratio;
  b. select the neighborhood, among the remaining neighborhoods, with the highest ratio;
  c. the selected neighborhood covers its pins; and
  d. repeat steps a to c until all of the pins are covered.

Continuing to refer to FIG. 52, it seems that neighborhood 1451 has the highest ratio. Also, neighborhood 1431 appears to take much less geometric space than neighborhood 1433, and is likely to be selected before neighborhood 1433 to cover pins 1438 and 1440 as well as pins 1432, 1434, and 1436. However, neighborhood 1433 will continue to be analyzed until all of the pins are covered—either by neighborhood 1433 or by another neighborhood which includes pins 1442, 1444, 1446, and 1448 and has a greater ratio of pins to area. The neighborhoods selected to cover its pins are called the covering neighborhood. Each of the covering neighborhoods has a set of pins (numbering at least K pins including its center pin) which it covers.

Third, after all of the pins have been covered, the center pins of the covering neighborhoods are used to construct pin partitions. The pin partitions are created by taking all of the center pins, and assigning all other pins of the net to the closest center pin. For the purposes of partition construction, the neighborhood definitions are abandoned. The neighborhood definitions were used only to determine the center pins of the partitions.

Therefore, in the example as illustrated by FIG. 52, assuming that all three neighborhoods 1431, 1433, and 1451 were selected as covering neighborhoods, pins 1444, 1446, and 1448, as well as pins 1452, 1454, 1456, and 1458 will be assigned to the partition having pin 1450 as its center pin. Pins 1434, 1436, and 1438 will be assigned to the partition with pin 1432 as the center pin. Pin 1440 will be assigned to the partition with center pin 1442. Then, the resultant pin partitions will appear as illustrated by FIG. 53.

Figure 53:
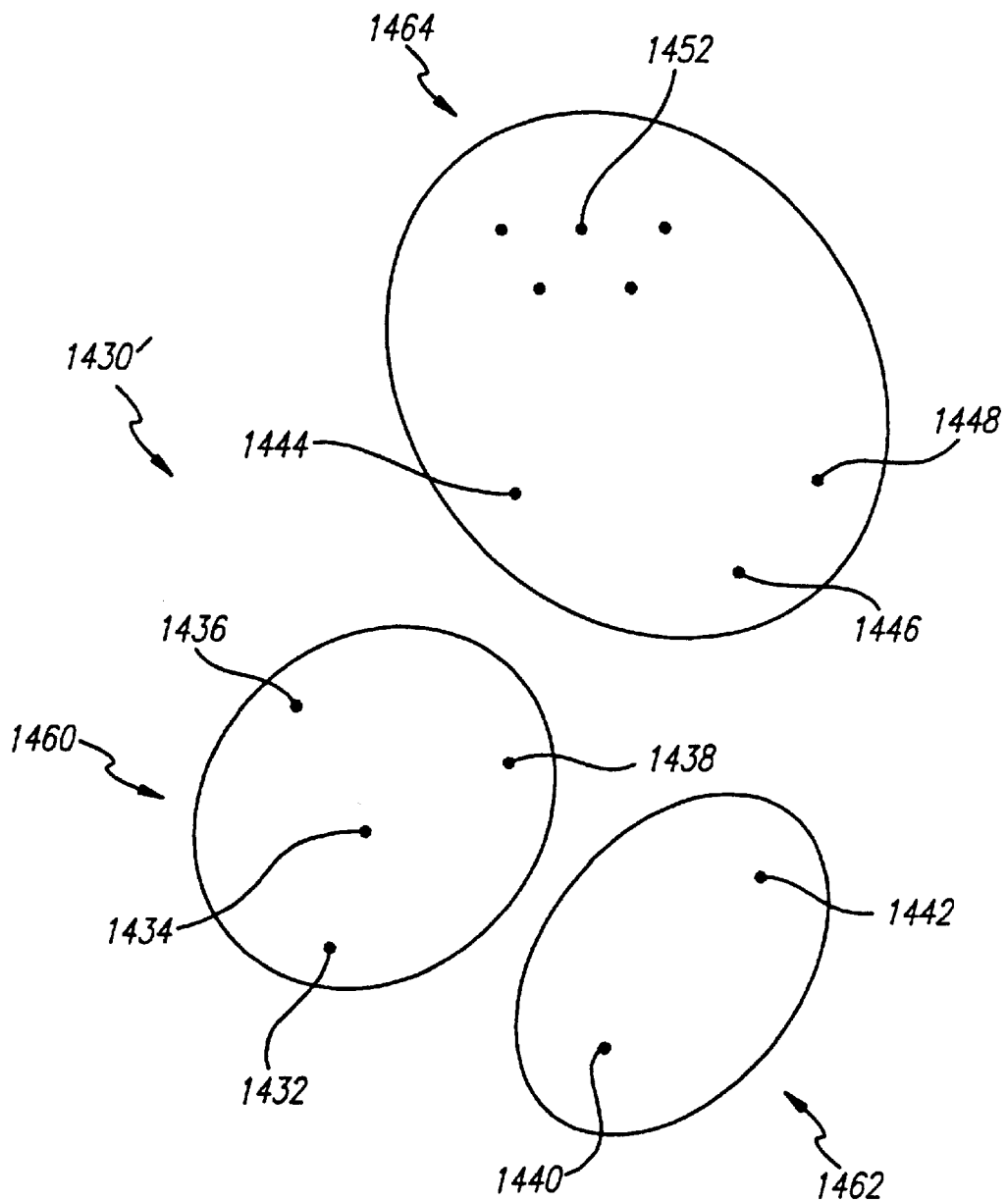
FIG. 53 illustrates construction of partitions of pins in accordance with a preferred embodiment of the present invention.

The net as illustrated by FIGS. 52 and 53 resulted in only three pin partitions (pp's) 1460, 1462, and 1464. However, in practice, a net may result in many thousands of pp's requiring another application of the Partitioning Method with the pp's as the "elements" for the next level of analysis. The iterative application of the Partitioning Method can be repeated until the number of the resultant partitions (or meta sets) is in the order of magnitude of the value of K. Typically, the resultant partitions are considered manageable when the number of partitions are in the same order of magnitude as the parameter K.

Minimal Spanning Tree and Partition Routing

Following the construction of the partition tree. The pp's and the meta sets are organized into minimum spanning trees (MST). To construct an MST for a set of pp's, the center pins of each of the pp's are considered as the vertices and the distance between any two pp's is defined as the distance between the closest pins of the two partitions.

FIG. 53 illustrates three pp's 1460, 1462, and 1464 having center pins 1432, 1442, and 1452. Each of the remaining pins of the net 1430' is assigned to the nearest center pin from itself. Therefore, pin partition 1460 contains pins 1432, 1434, 1436, and 1438, partition 1462 contains pins 1440, 1442, and partition 1464 contains pins 1444, 1446, 1448, 1450, 1452, 1454, 1456, and 1458.

Referring to FIG. 53, for the purposes of constructing the MST for the pp's 1430', the distance between partition 1460 and partition 1462 is the distance between a pins 1432 and 1440. The distance between partition 1460 and partition 1464 is the distance between pins 1438 and 1444. The distance between partition 1462 and partition 1464 is the distance between pins 1442 and 1446.

Given the partitions and the distances between the partitions, the process of constructing a MST from the given information is well known in the art and will not be discussed here. Professor James A. McHugh provides an adequate overview of the MST construction method in ALGORITHMIC GRAPH THEORY (1990, Prentice-Hall) pp. 124–126.

Once a MST is constructed, each of the connected partitions (as represented by the connected vertices of the MST) are connected as follows:
  a. the two pins which determined the distance between the two partitions are identified;
  b. for each of the two pins, calculate the minimal distance between the pin and any of the other pins of its partition; and
  c. the pin whose just calculated distance is greater is assigned to the partition of the other pin as well as retaining its assignment to the original partition.

Referring again to FIG. 53, assuming that the vertices representing partitions 1462 and 1464 are connected in the MST, partitions 1462 and 1464 are connected following the steps defined above. In FIG. 52, the pin pair for connecting partitions 1462 and 1464 are pins 1442 and 1446, respectively. It appears that the distance between pins 1442 and 1440 in partition 1462 is greater than the distance between pins 1446 and 1448 in partition 1464. Therefore, pin 1442 is assigned to partition 1464 as well as retaining its assignment to partition 1462.

Likewise, assuming that the vertices representing partitions 1460 and 1462 are connected in the MST, partitions 1460 and 1462 are connected following the steps defined above. Continuing to refer to FIG. 52, the pin pair for connecting partitions 1460 and 1462 are pins 1432 and 1440, respectively. It appears that the distance between pins 1432 and 1434 in partition 1460 is greater than the distance between pins 1440 and 1442 in partition 1462. Therefore, pin 1440 is assigned to partition 1460 as well as retaining its assignment to partition 1462.

Figure 54:
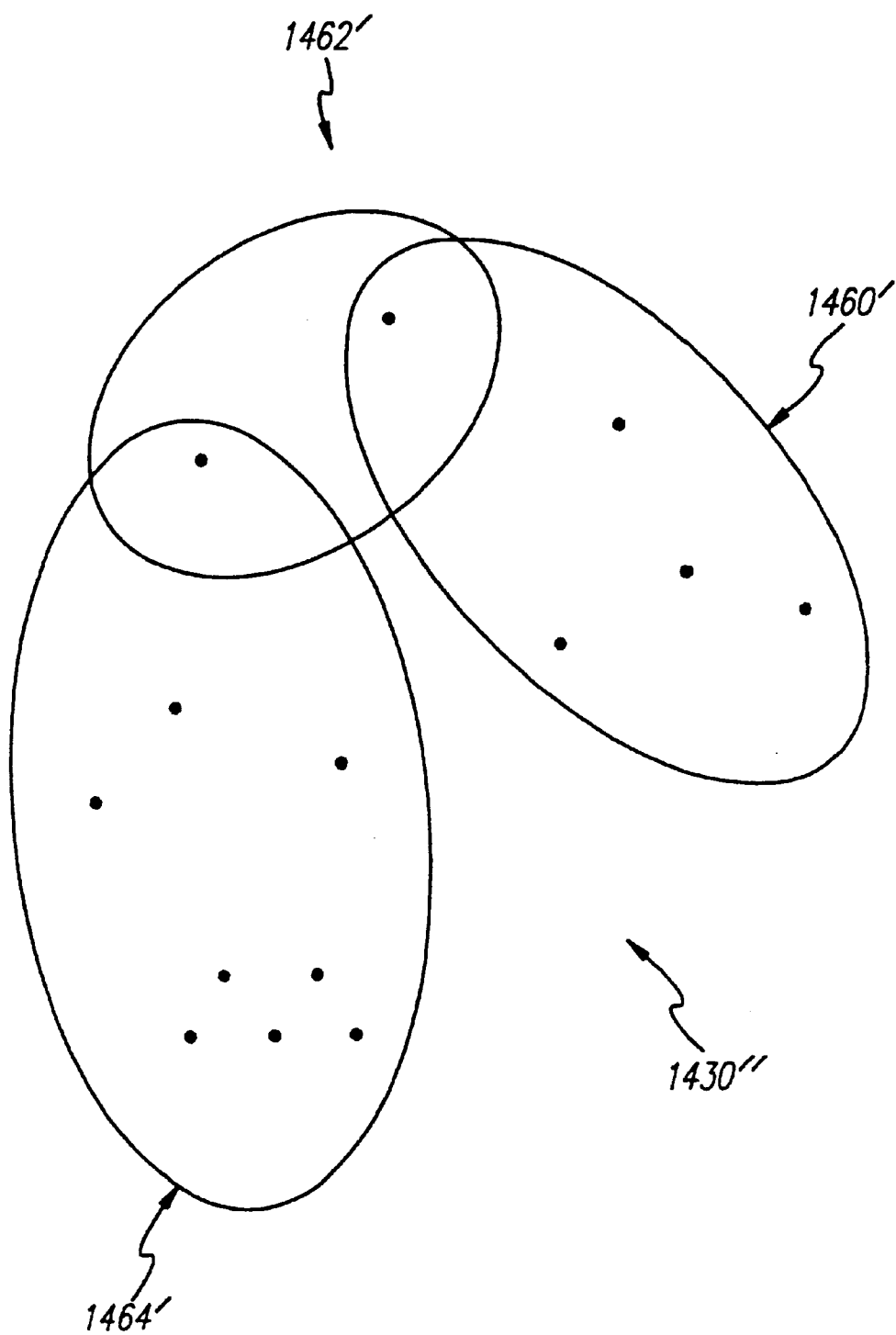
FIG. 54 illustrates modification of partitions of pins in accordance with a preferred embodiment of the present invention.

After the additional assignments of pins 1440 and 1442 of partition 1462, the partition of the net may be graphed as illustrated by FIG. 54. Because the partitions now overlap, the routing of the cells of the partitions will not be limited to the boundaries of the cells. In addition, the routing of the net will not have closed loops or cycles because the partitions are organized using a MST structure.

Similar to the iterative application technique used to partition the pins and the sets of pins, the MST and the above-described partition routing technique can be applied interactively to effect the same connections between sets of partitions and meta sets of the sets of partitions.

In General

Referring now to FIG. 55, an apparatus 1470 for placing cells on an integrated circuit chip is illustrated. The apparatus 1470 comprises processor 1472 and memory 1474 connected to the processors for storing instructions for the processors 1472. The apparatus 1470 may comprise multiple processors 1472, 1472' to simultaneously process the cells of the IC. The memory stores the instructions for the processors to perform the above-discussed tasks. The harddrive 1476 contains the initial net and pin layout information and stores computer readable representation of the final placement. The placement and other information such as the system status information may be displayed on the monitor 1478 which is also attached to the processors.

Summary

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer hard drives, and other magnetic, optical, other machine readable media, whether alone or in combination with one or more of the algorithms and steps described herein.

Although the present invention has been described in detail with regarding the exemplary embodiments and drawings thereof, it should be apparent to those skilled in the art that various adaptations and modifications of the present invention may be accomplished without departing from the spirit and the scope of the invention. Thus, by way of example and not of limitation, the present invention is discussed as illustrated by the figures. Accordingly, the invention is not limited to the precise embodiment shown in the drawings and described in detail hereinabove.

In the following claims, those elements which do not include the words "means for" are intended not to be interpreted under 35 U.S.C. § 112 ¶ 6.

We claim:

1. A method for locating a plurality of elements on a surface, said method comprising the steps of:
    assigning the elements to portions of the surface;
    preplacing the elements onto the surface;
    repositioning the elements depending on affinities of the elements; and
    connecting the elements on the surface,
    wherein said step of repositioning the elements is performed using a plurality of processors and comprises: (1) dividing the surface into a plurality of regions; (2) assigning non-adjacent regions to said processors, each processor determining affinities of at least some of the elements in its assigned region to locations in other regions; and (3) repositioning at least some of the elements to locations in other regions based on the affinities.

2. A method according to claim 1, wherein the elements are cells of an integrated circuit chip (IC), and the surface is surface of said IC.

3. A method according to claim 1, further comprising the step of planning the element layout on the surface prior to preplacing the elements onto the surface.

4. A method according to claim 3, wherein said step of planning the element layout comprises steps:
    partitioning the surface into a grid comprising a plurality of regions;
    defining pieces, each piece comprising at least one of said regions, and each piece having a capacity;
    allocating said capacity of each of said pieces to predefined groups of the elements; and
    reallocating said capacity of said pieces to said groups of the elements.

5. A method according to claim 1, wherein the plurality of processors operate simultaneously.

6. A method according to claim 1, wherein said step of connecting the elements comprises the steps:
    partitioning the elements into a plurality of sets, each set having at least a predetermined number of elements;
    constructing a minimal spanning tree having vertices and edges, said vertices of said spanning tree representing the elements and said sets; and
    connecting the elements per said edges of said minimal spanning tree.

7. A method according to claim 1, wherein a new region is assigned to each of the processors as said each processor completes its current region, and wherein at any given time the regions assigned to all the processors are non-adjacent.

8. A method according to claim 7, wherein the regions are ordered in a list and each processor selects a next unprocessed region in the list after completing its current region.

9. A computer-implemented method for locating a plurality of elements on a surface, said method comprising the steps of:
    forming a neighborhood defined as a set of the elements;
    ordering the elements within each said neighborhood according to their relative distance from a target element;
    preplacing the elements within a two-dimensional abstraction of the surface;
    iteratively subdividing the surface into a plurality of regions;
    assigning the elements to said plurality of regions;
    assigning non-adjacent regions to a plurality of processors;
    calculating affinities of at least some of the elements to locations in other regions using the plurality of processors, each processor determining affinities of the elements in its assigned region;
    repositioning at least some of the elements to other regions based on affinities of the elements;
    levelizing element density over the surface based on relationships between the elements;
    relocating any overlapping elements; and
    performing a final cell adjustment for element positions.

10. A computer-implemented method according to claim 9, wherein the elements are grouped into functions and the surface can be partitioned into portions, each of said portions having a capacity, and further comprising the step of assigning said groups of the elements to said portions of the surface to meet a predetermined utilization requirement of said capacity of each of said portions of the surface.

11. A computer-implemented method according to claim 9, wherein a new region is assigned to each of the processors as said each processor completes its current region, and wherein at any given time the regions assigned to all the processors are non-adjacent.

12. A computer-implemented method according to claim 11, wherein the regions are ordered in a list and each processor selects a next unprocessed region in the list after completing its current region.

13. An apparatus for placing a plurality of elements on a surface, said apparatus comprising:

a plurality of processors;

memory connected to said processors;

said memory having instructions for said processors to assign the elements to portions of the surface; to preplace the elements onto the surface; to reposition the elements depending on affinities of the elements; and to connect the elements on the surface, wherein said instructions to reposition the elements comprise instructions to: (1) divide the surface into a plurality of regions; (2) assign non-adjacent regions to said processors, each processor determining affinities of at least some of the elements in its assigned region to locations in other regions; and (3) reposition at least some of the elements to locations in other regions based-on the affinities.

14. An apparatus according to claim 13 wherein said plurality processors operate simultaneously.

15. An apparatus according to claim 13 further comprising a harddrive and a monitor.

16. An apparatus according to claim 13 wherein said apparatus is a general purpose computer.

17. An apparatus according to claim 13 wherein said elements are cells of an integrated circuit chip (IC), and said surface is the IC.

18. An apparatus according to claim 13, wherein a new region is assigned to each of the processors as said each processor completes its current region, and wherein at any given time the regions assigned to all the processors are non-adjacent.

19. An apparatus according to claim 18, wherein the regions are ordered in a list and each processor selects a next unprocessed region in the list after completing its current region.

20. A machine-readable storage medium containing instructions for a processor, said instructions comprising the steps for locating a plurality of elements on a surface and comprising the steps of:

assigning the elements to portions of the surface;

preplacing the elements onto the surface;

repositioning the elements depending on affinities of the elements; and connecting the elements on the surface, wherein said step of repositioning the elements is performed using a plurality of processors and comprises: (1) dividing the surface into a plurality of regions: (2) assigning non-adjacent regions to said processors, each processor determining affinities of at least some of the elements in its assigned region to locations in other regions and (3) repositioning at least some of the elements to locations in-other regions based on the affinities.

21. A storage medium according to claim 20 wherein said storage medium is selected from a group consisting of magnetic device, optical device, magneto-optical device, floppy diskette, harddrive, CD-ROM, magnetic tape, computer memory, and memory card.

22. A machine-readable storage medium according to claim 20, wherein a new region is assigned to each of the processors as said each processor completes its current region, and wherein at any given time the regions assigned to all the processors are non-adjacent.

23. A machine-readable storage medium according to claim 20, wherein the regions are ordered in a list and each processor selects a next unprocessed region in the list after completing its current region.

* * * * *